(12) United States Patent
Kurihara et al.

(10) Patent No.: US 7,795,739 B2
(45) Date of Patent: Sep. 14, 2010

(54) SEMICONDUCTOR DEVICE, METHOD OF MANUFACTURING THE SAME

(75) Inventors: Kazuaki Kurihara, Kawasaki (JP); Takeshi Shioga, Kawasaki (JP); John D. Baniecki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 461 days.

(21) Appl. No.: 11/984,361

(22) Filed: Nov. 16, 2007

(65) Prior Publication Data
US 2008/0099888 A1 May 1, 2008

Related U.S. Application Data

(62) Division of application No. 11/258,420, filed on Oct. 26, 2005, now Pat. No. 7,298,050.

(30) Foreign Application Priority Data

| Feb. 14, 2005 | (JP) | ............................. 2005-036514 |
| Aug. 18, 2005 | (JP) | ............................. 2005-237777 |

(51) Int. Cl.
*H01L 29/40* (2006.01)
*H01L 21/44* (2006.01)

(52) U.S. Cl. ...................................... 257/774; 438/667

(58) Field of Classification Search ................. 438/629, 438/637, 666–667; 257/272, 774
See application file for complete search history.

(56) References Cited

U.S. PATENT DOCUMENTS 5,604,145 A 2/1997 Hashizume et al.

| 6,853,051 B2 * | 2/2005 | Shioga et al. ................ 257/532 |
| 7,161,793 B2 | 1/2007 | Kurihara et al. |
| 7,298,050 B2 * | 11/2007 | Kurihara et al. .............. 257/774 |

FOREIGN PATENT DOCUMENTS

| JP | 2000323845 | 11/2000 |
| JP | 2003197463 | 7/2003 |
| JP | 200471589 | 3/2004 |
| JP | 200495638 | 3/2004 |
| JP | 2004193614 | 7/2004 |
| JP | 2004273825 | 9/2004 |

\* cited by examiner

*Primary Examiner*—Calvin Lee
(74) *Attorney, Agent, or Firm*—Westerman, Hattori, Daniels & Adrian, LLP

(57) ABSTRACT

A semiconductor device is disclosed that includes an interposer and a semiconductor chip. The interposer includes a Si substrate; multiple through vias provided through an insulating material in corresponding through holes passing through the Si substrate; a thin film capacitor provided on a first main surface of the Si substrate so as to be electrically connected to the through vias; and multiple external connection terminals provided on a second main surface of the Si substrate so as to be electrically connected to the through vias. The second main surface faces away from the first main surface. The semiconductor chip is provided on one of the first main surface and the second main surface so as to be electrically connected to the through vias. The Si substrate has a thickness less than the diameter of the through holes.

7 Claims, 70 Drawing Sheets

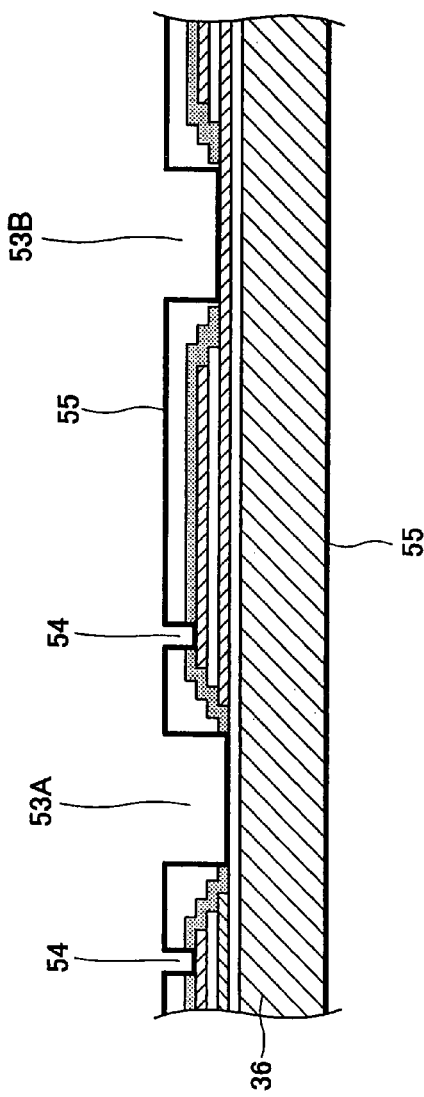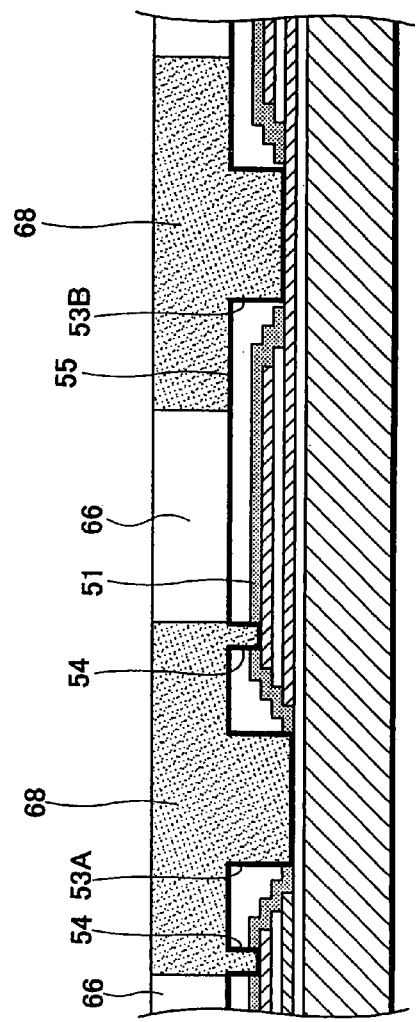

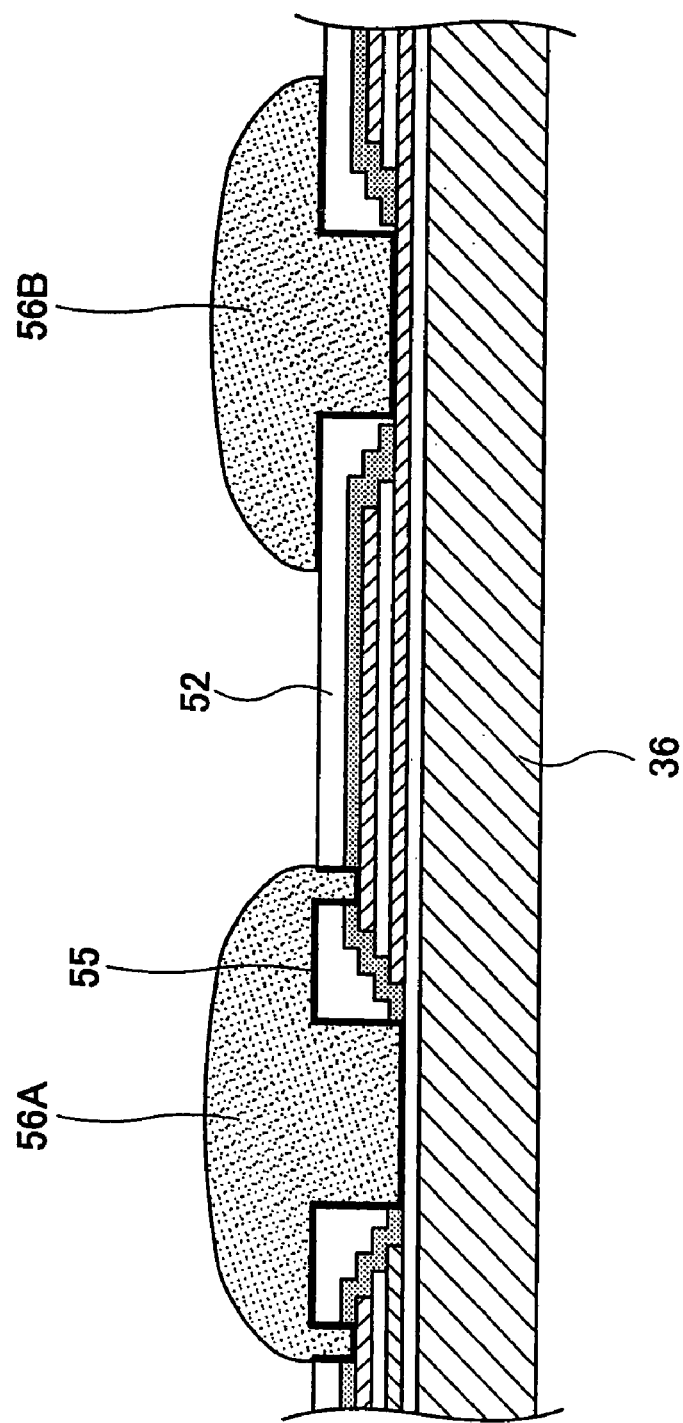

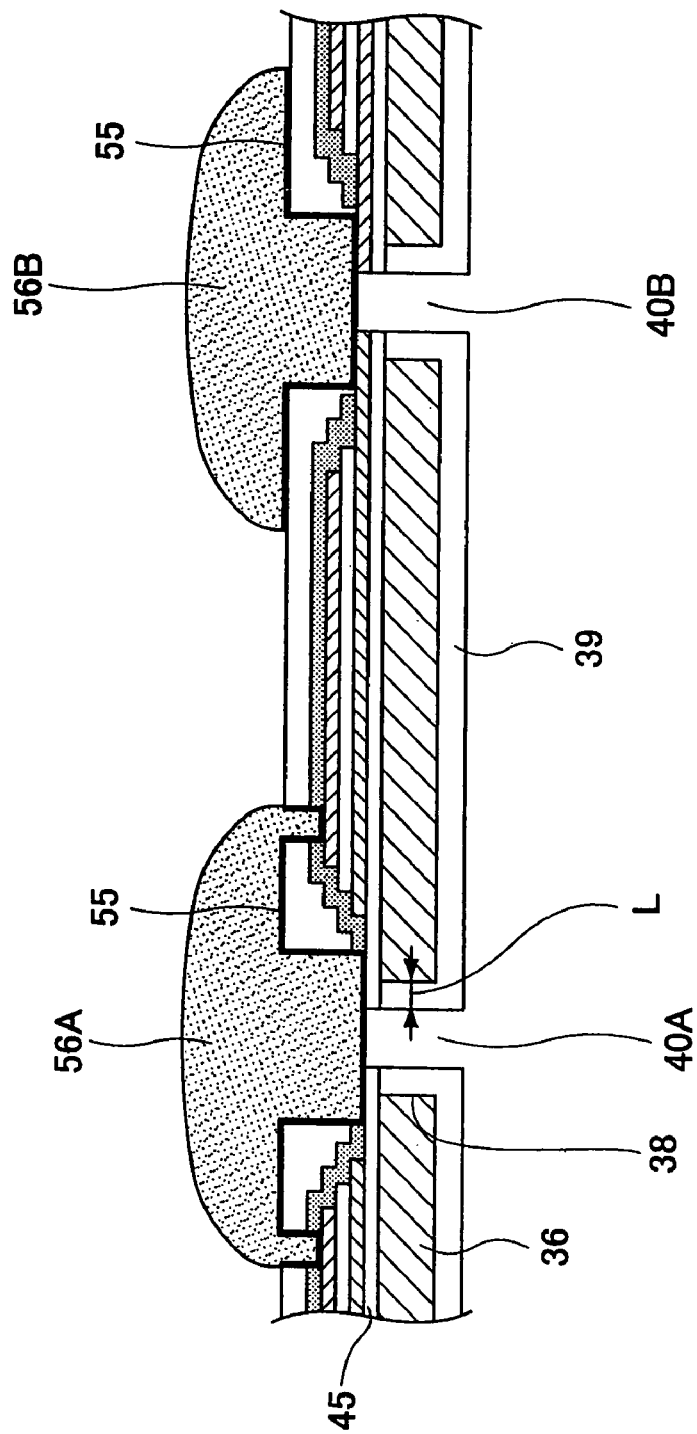

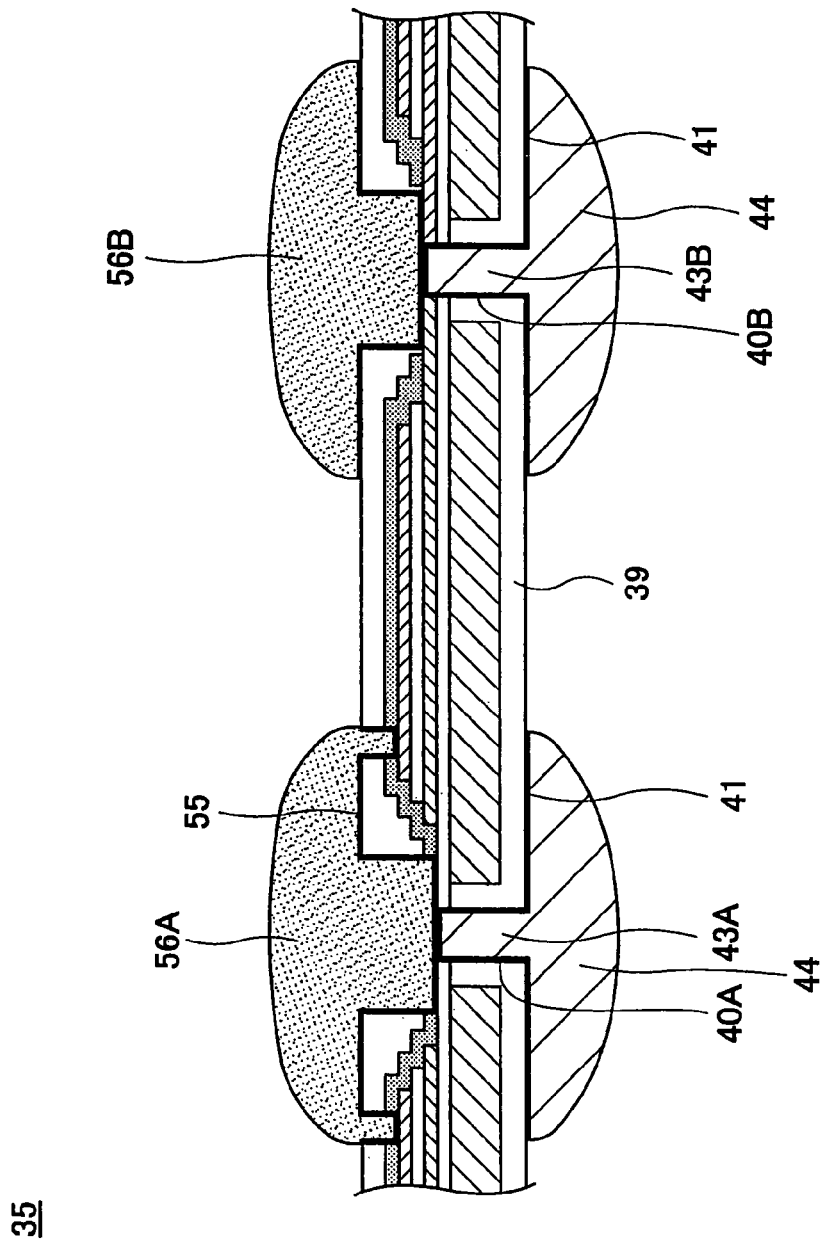

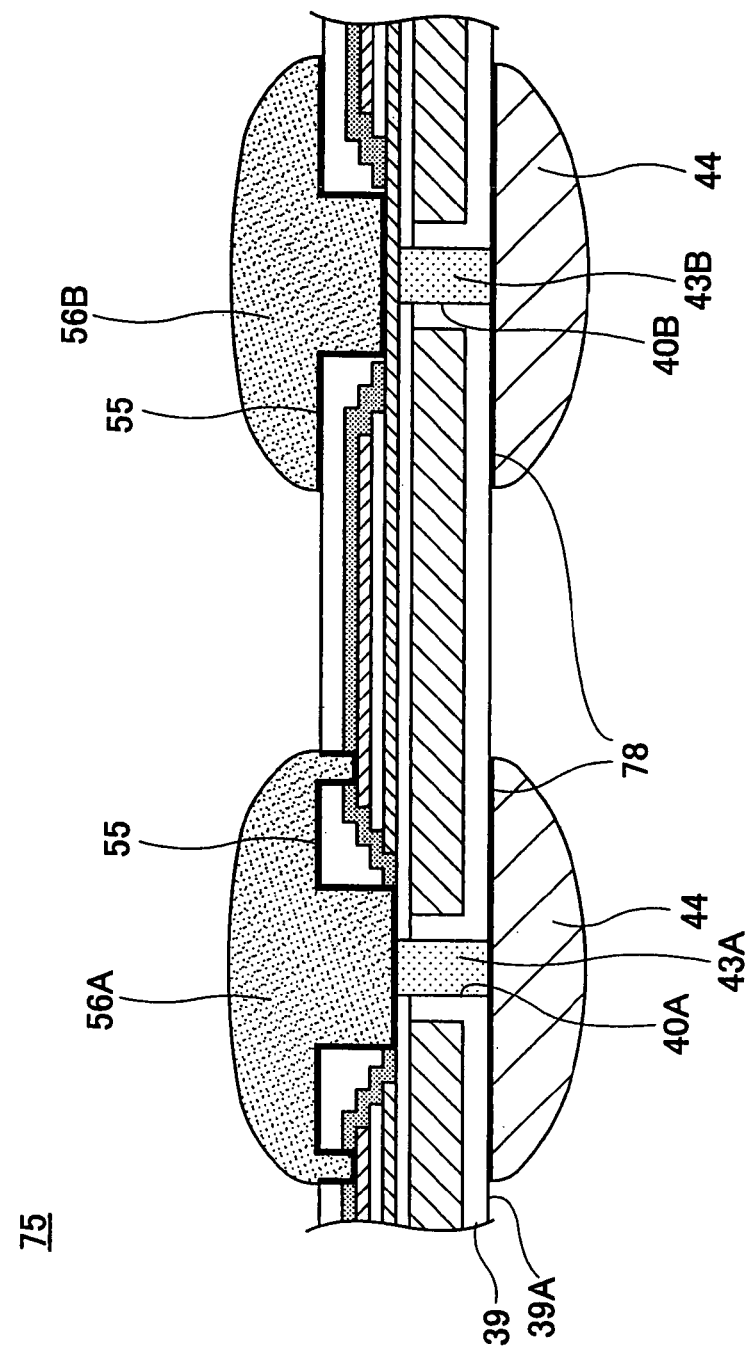

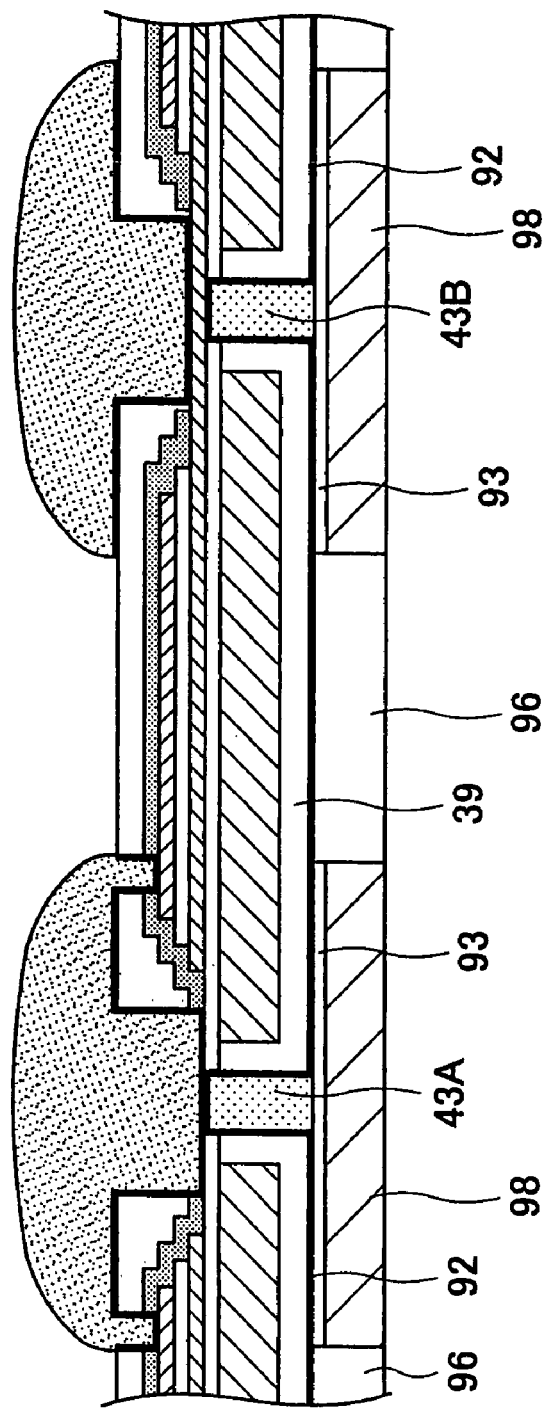

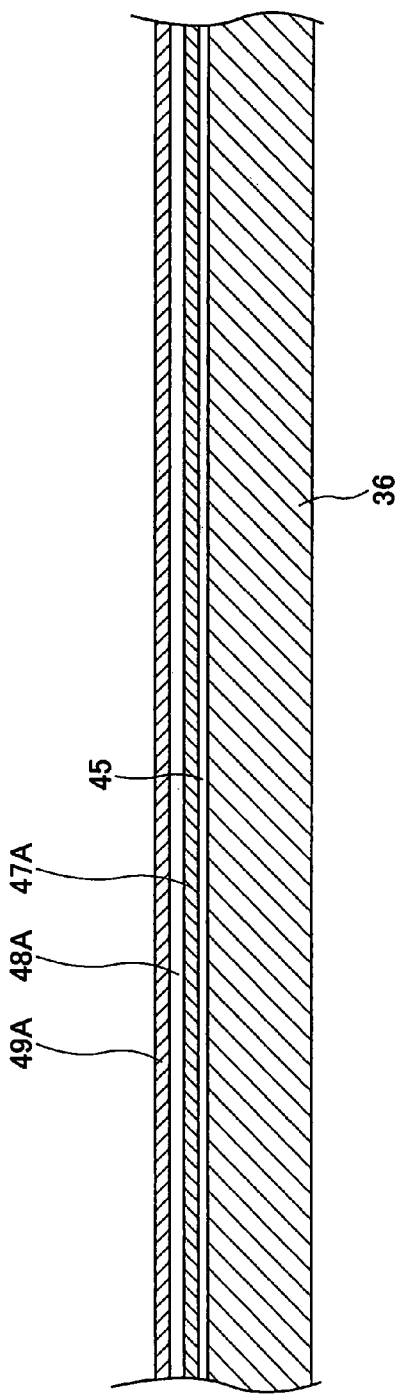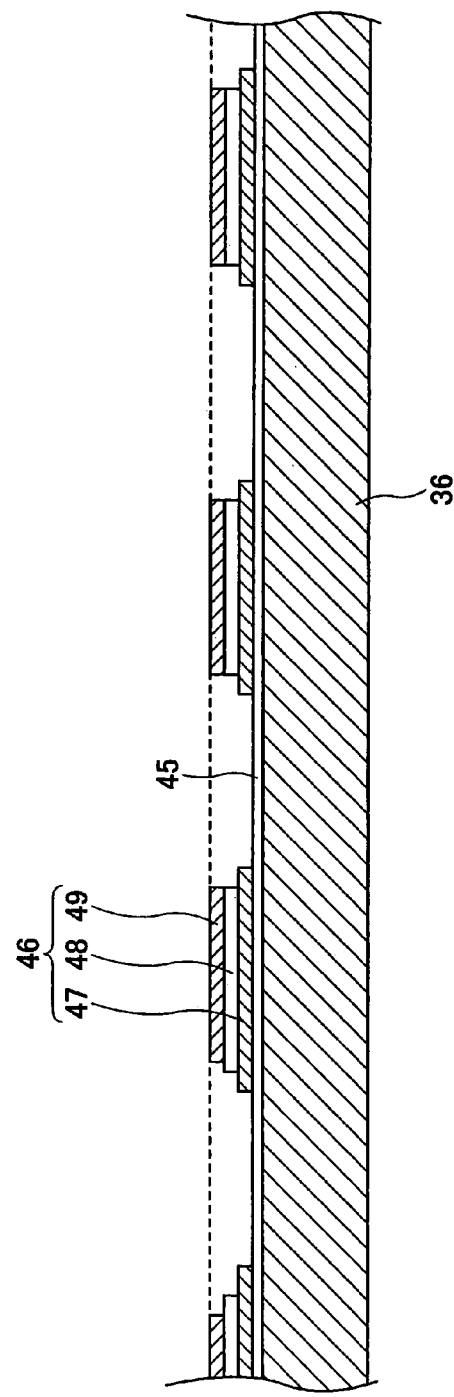
FIG.11A
FIG.11B

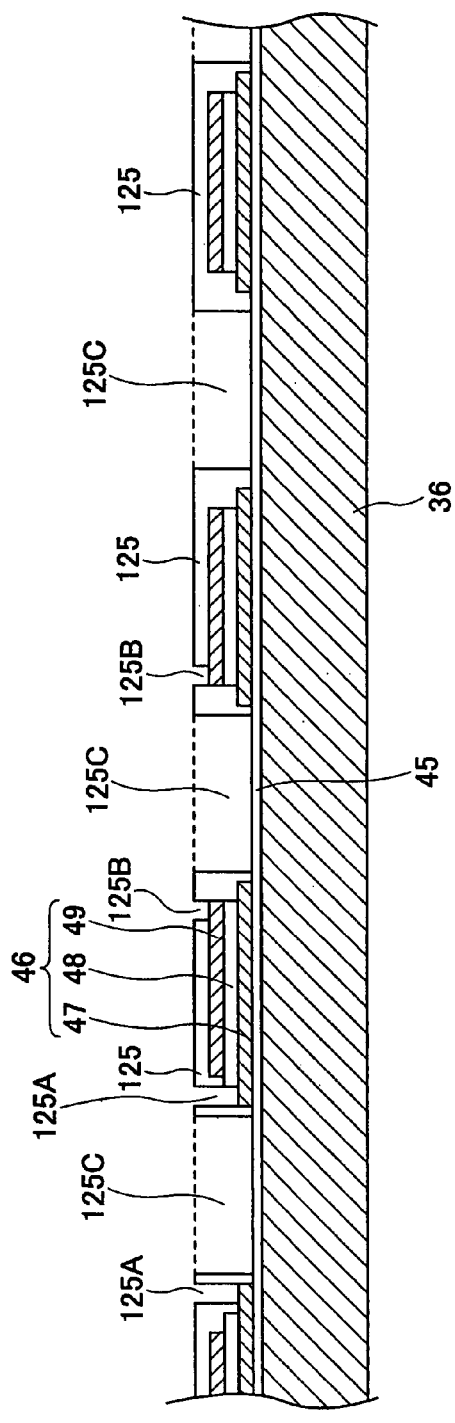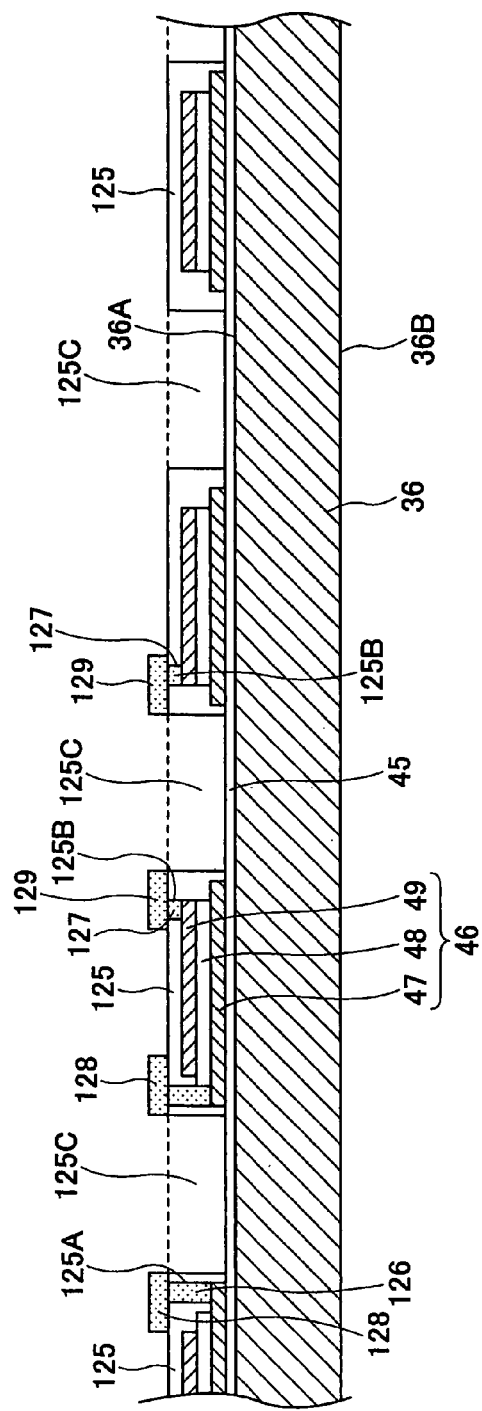

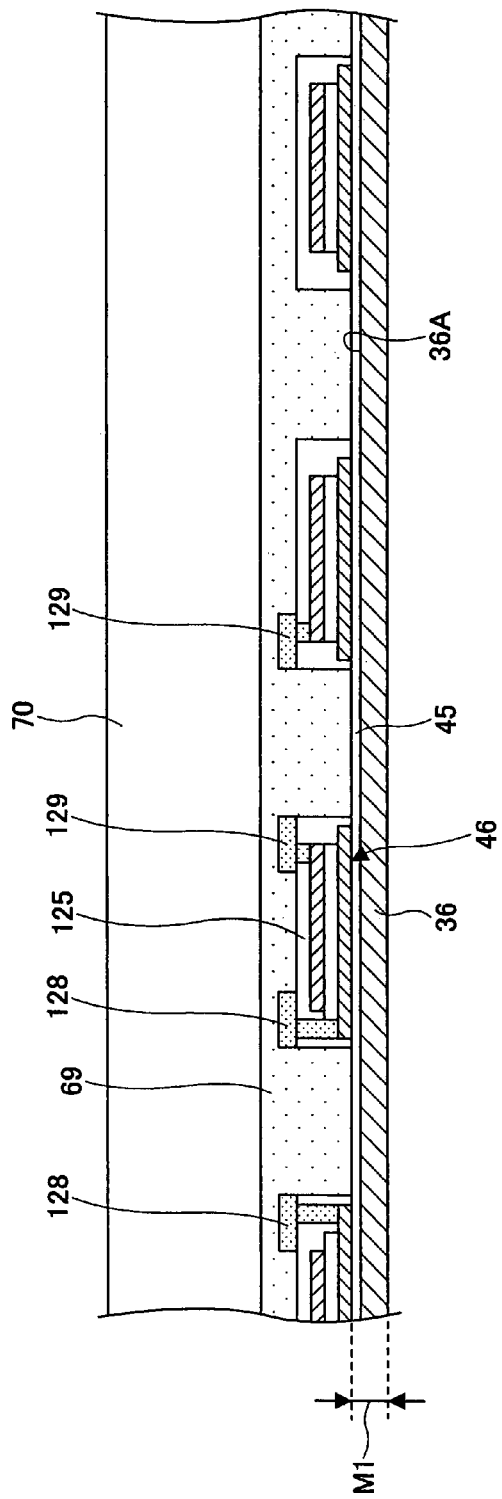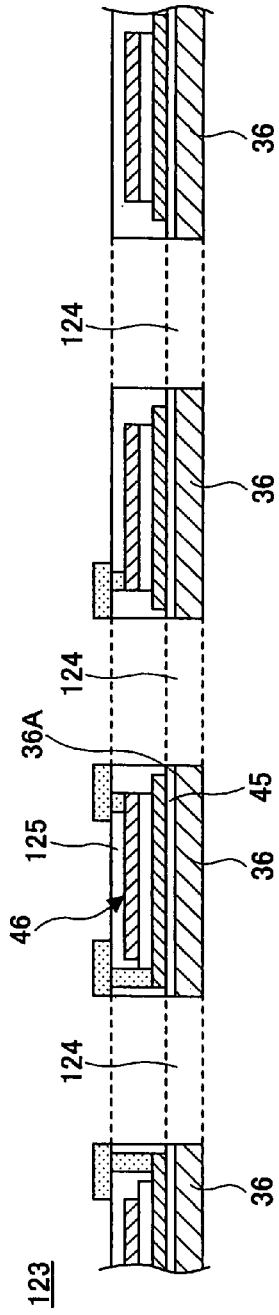

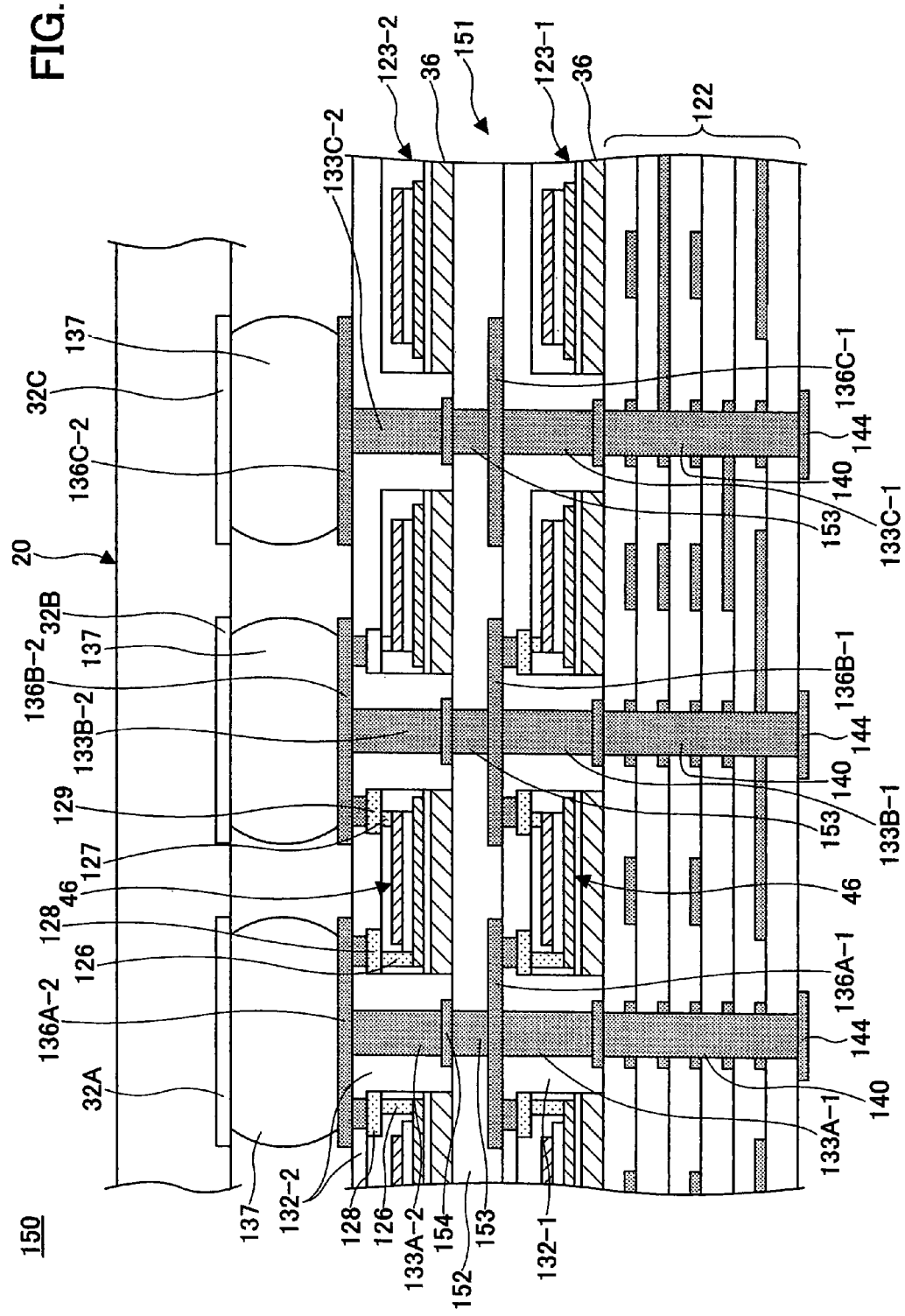

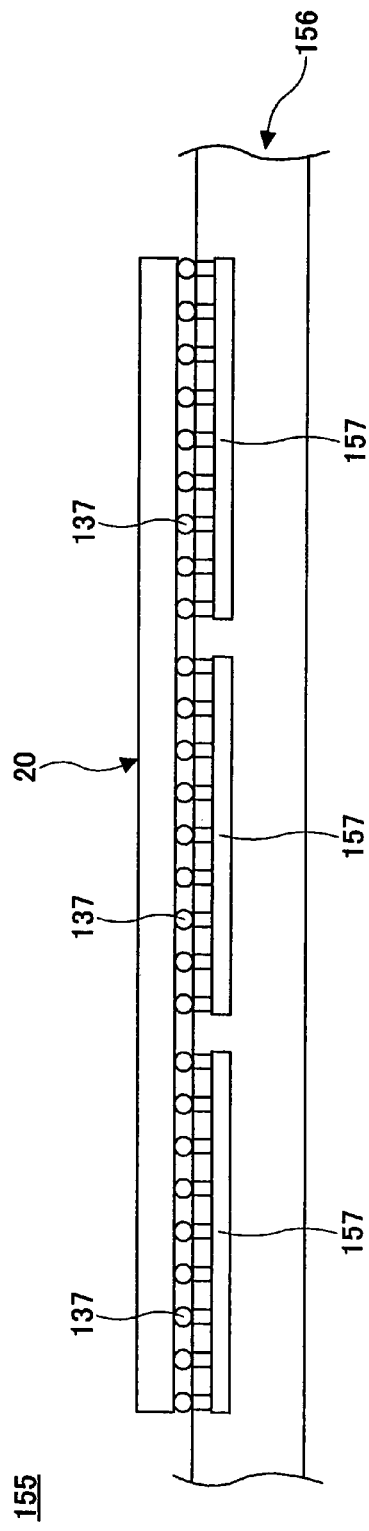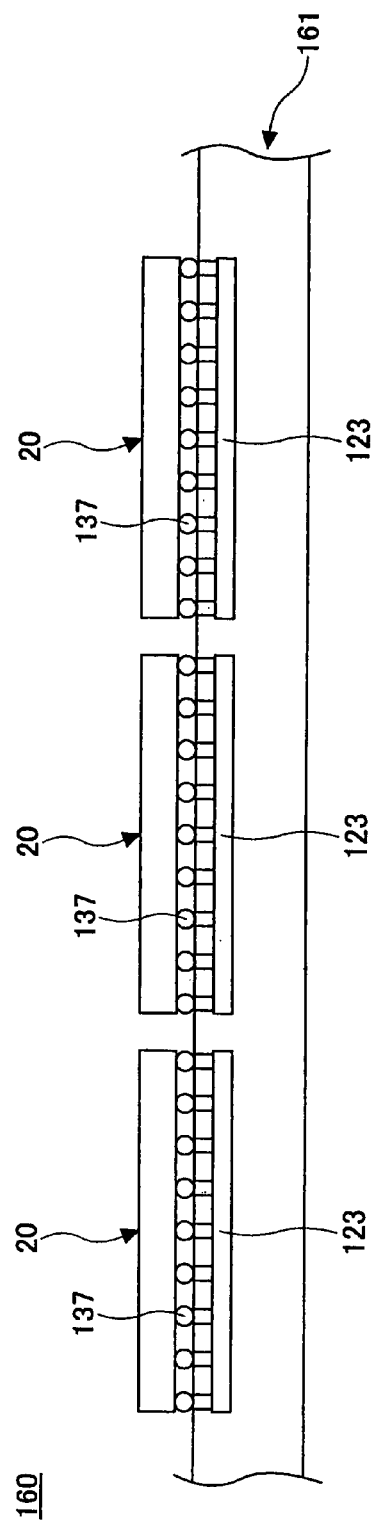

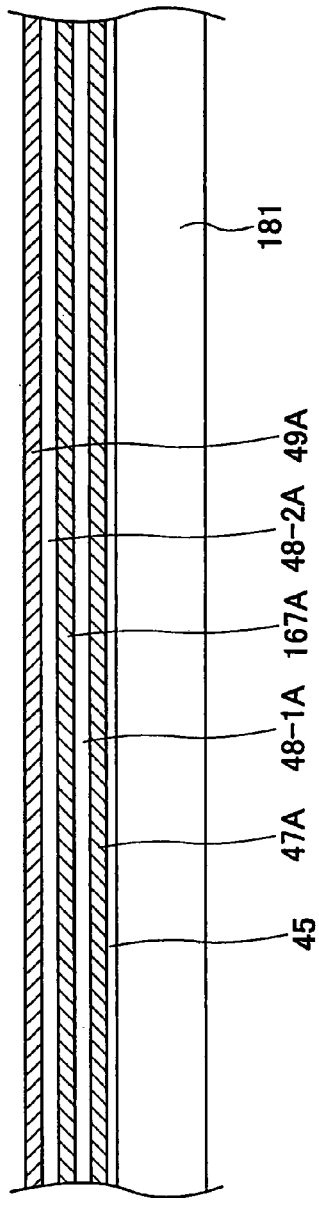
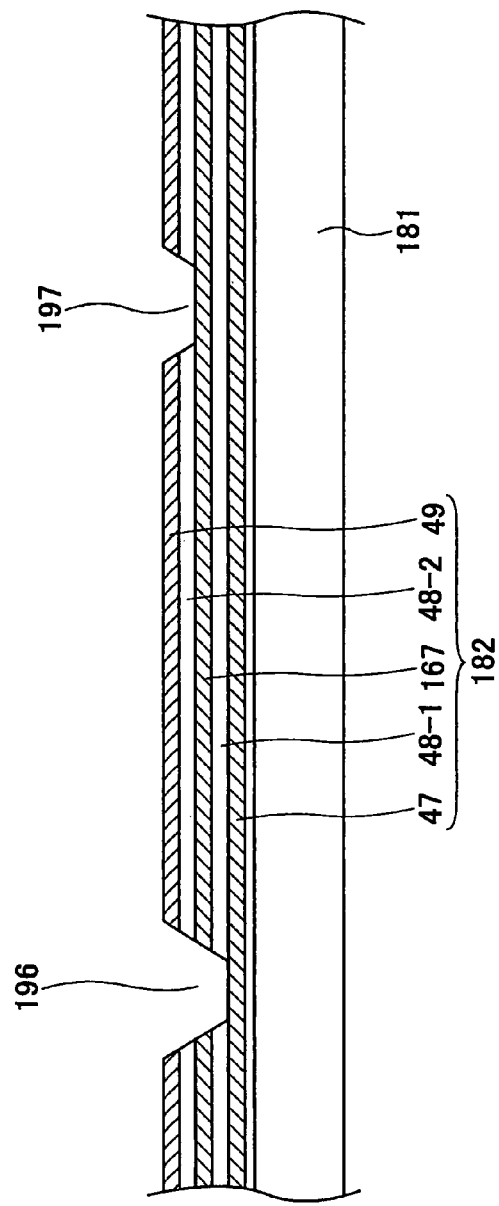
FIG.23A
FIG.23B

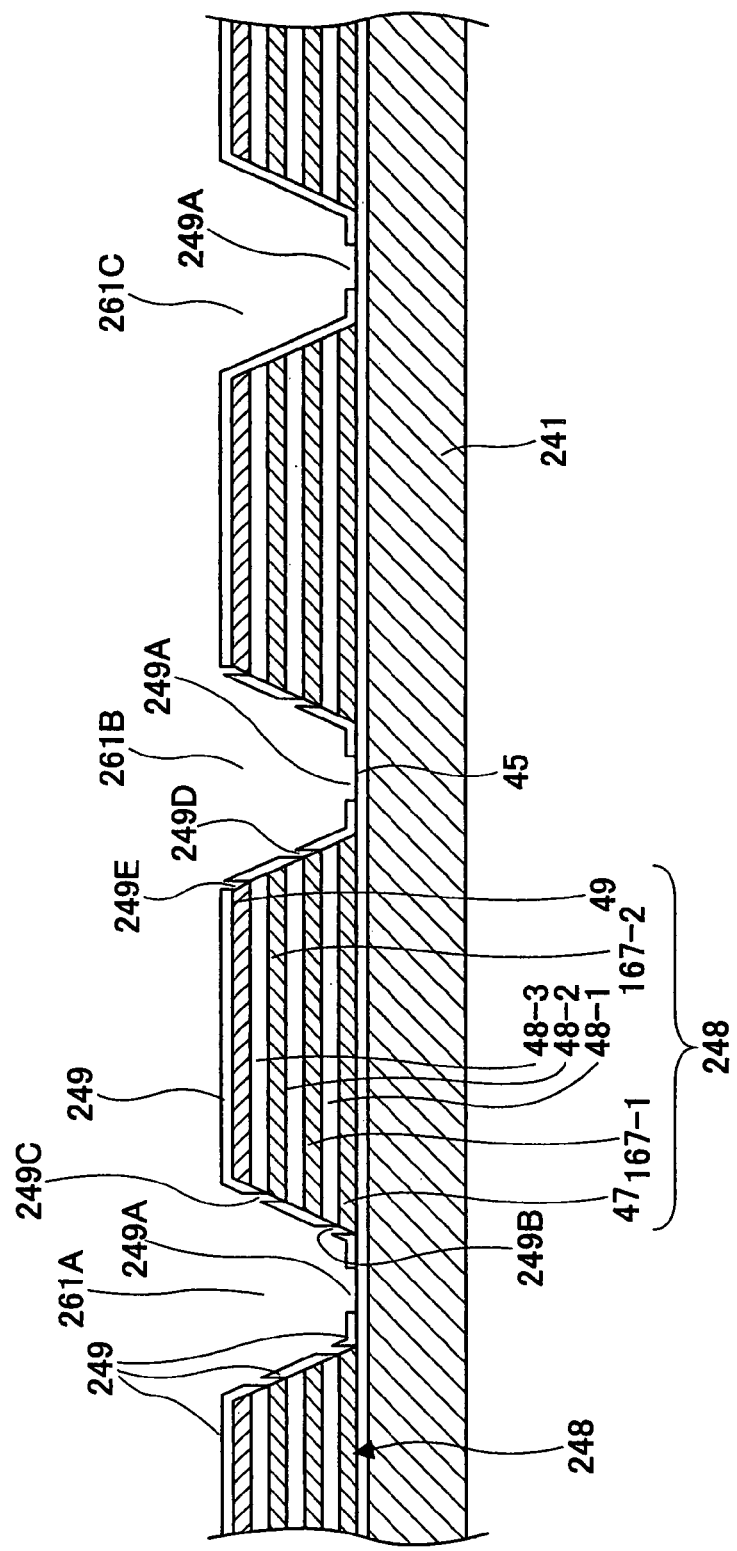

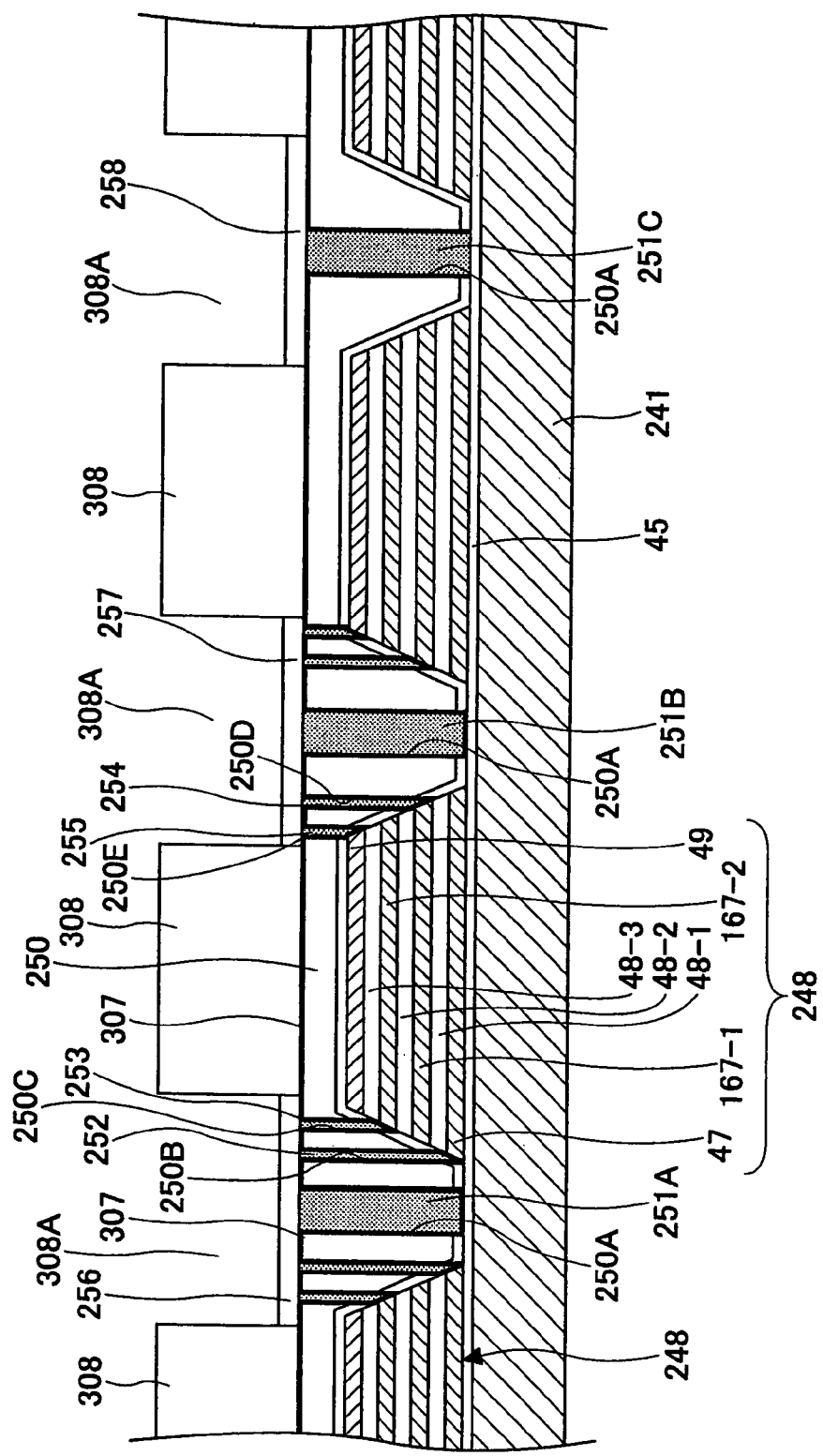

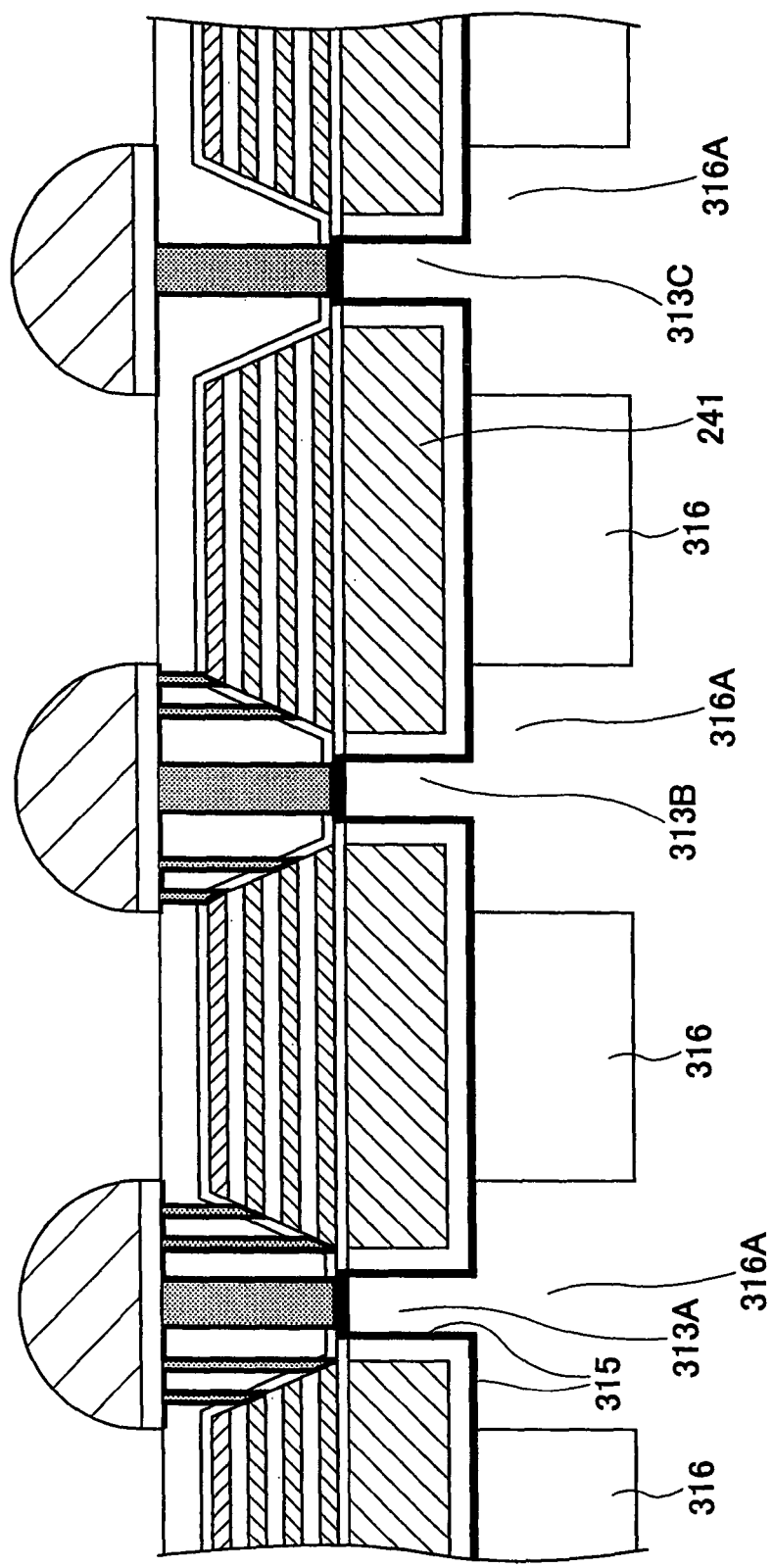

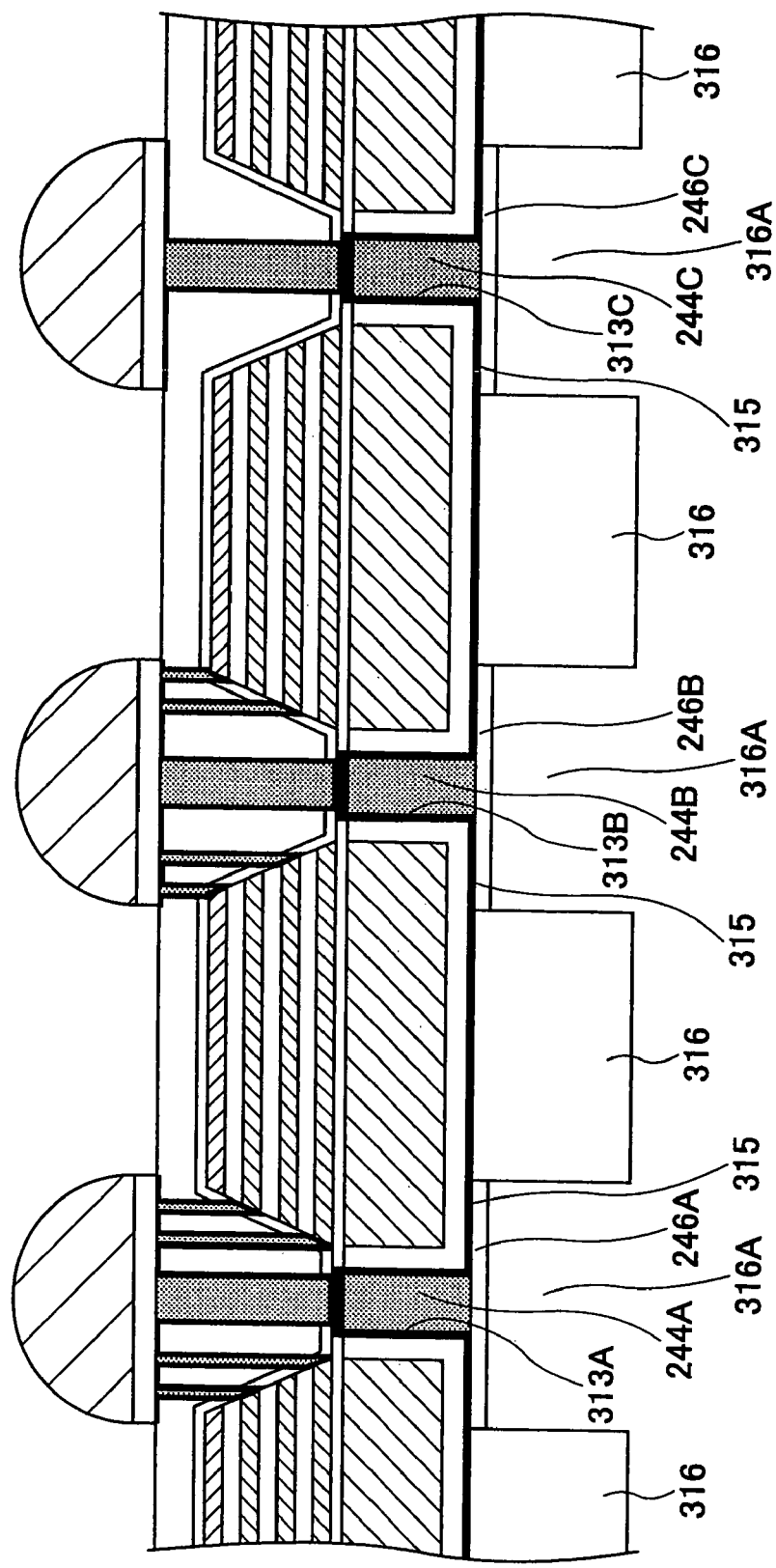

SEMICONDUCTOR DEVICE, METHOD OF MANUFACTURING THE SAME

CROSS-REFERENCE TO RELATED APPLICATION

This application is a divisional of application Ser. No. 11/258,420, filed Oct. 26, 2005, which is based on Japanese Priority Patent Applications No. 2005-036514, filed on Feb. 14, 2005, and No. 2005-237777, filed on Aug. 18, 2005, the entire contents of which are hereby incorporated by reference.

BACKGROUND OF THE INVENTION

1. Field of the Invention

The present invention relates generally to semiconductor devices, methods of manufacturing the same, capacitor structures, and methods of manufacturing the same, and more particularly to a semiconductor device having a semiconductor chip and an interposer including a capacitor and a through via, a method of manufacturing the same, a capacitor structure, and a method of manufacturing the same.

2. Description of the Related Art

Electronic apparatuses are now becoming more sophisticated with more functions in the fields of personal computers, cellular phones, and other mobile equipment.

In order to prevent malfunction due to switching noise in a large-scale integrated circuit (LSI) that operates at high frequencies, a method of reducing source impedance by connecting a decoupling capacitor absorbing noise in parallel with a power supply is employed.

Source impedance Z is expressed by:
Source impedance Z is expressed by:

$$Z(P) \propto V/(nif), \quad (1)$$

where V is supply voltage, n is the number of elements per LSI, i is the switching current of an element, and f is a driving frequency.

Because of lower LSI voltage, high element integrity, and higher frequencies, there has been a sharp reduction in required impedance. The impedance Z(C) of a decoupling capacitor is given by:

$$Z(C) = [R^2 + \{2\pi f L - (1/2\pi f C)\}^2]^{1/2}, \quad (2)$$

where R is resistance, L is inductance, and C is capacitance. In order to reduce the impedance of a decoupling capacitor, it is desired to increase capacitance C and reduce inductance L.

Normally, a multilayer ceramic capacitor is disposed around an LSI as a decoupling capacitor. The multilayer ceramic capacitor has electrode layers and ceramic dielectric layers stacked alternately on each other, and has a pair of surface electrodes formed on corresponding side surfaces thereof so that each surface electrode is connected to every other corresponding electrode layer. A large capacitance can be provided, but it is not easy to reduce inductance because the electrode layers are connected to the surface electrodes on the side surfaces.

As the operating frequencies of LSIs become higher, the decoupling capacitor is required to have lower inductance. However, it is difficult to meet this requirement with multilayer ceramic capacitors.

Accordingly, in order to reduce the line length between the LSI and the decoupling capacitor, a method of providing decoupling capacitors 505 formed of thin film capacitors on the surface of an interposer 502 in which through vias 508 are formed in a Si substrate 503 as illustrated in FIG. 1 is proposed (for example, Japanese Laid-Open Patent Application No. 2004-193614).

This method is effective in high-performance LSIs. This is because the interposer 502 employs the Si substrate 503 formed of the same material as the LSI, so that there is no occurrence of problems resulting from stress due to a difference in thermal expansion. This is also because this method responds to an increase in LSI size, finer pitches, and a decrease in strength due to a low-k LSI interconnection insulating film.

FIG. 1 is a cross-sectional view of a conventional semiconductor device 500. As illustrated in FIG. 1, the semiconductor device 500 includes a semiconductor chip 501 that is operated at high frequencies and the interposer 502 to which the semiconductor chip 501 is connected.

The interposer 502 includes the Si substrate 503, the decoupling capacitors 505, an insulating film 507, the through vias 508, and external connection terminals 509. The decoupling capacitors 505, each formed of a lower electrode, a dielectric film, and an upper electrode, are formed on the Si substrate 503. The decoupling capacitors 505 are connected to some of the through vias 508 connected to the power supply electrode pads of the semiconductor chip 501 and the other through vias 508 connected to the ground electrode pads of the semiconductor chip 501. The decoupling capacitors 505 cancel noise generated by the semiconductor chip 501 operating at high frequencies.

Through holes 504 for forming the through vias 508 are formed in the Si substrate 503. The insulating film 507 is formed on the through holes 504. The insulating film 507 isolates the through vias 508 from the Si substrate 503. In general, a thermal oxide film is used for the insulating film 507.

The through vias 508 are formed in the through holes 504. The external connection terminals 509 for connection to a circuit board are formed at the lower end part of the through vias 508 (for example, Japanese Laid-Open Patent Application No. 2004-193614).

In the case of manufacturing this semiconductor device 500, the decoupling capacitors 505 are formed on the Si substrate 503 after forming the through holes 504 and the through vias 508 in the Si substrate 503.

For related art, Japanese Laid-Open Patent Application Nos. 2000-323845, 2004-71589, 2004-95638, 2003-197463, and 2004-273825 may also be referred to.

However, the thickness of the Si substrate 503 of the conventional interposer 502 is greater than or equal to 0.5 mm. Accordingly, the aspect ratio of the through holes 504, that is, the thickness of the Si substrate 503/the diameter of the through holes 504, is high. In order to form these through holes 504, it is necessary to use ICP (Induction Coupling Plasma), which causes the problem of an increasing manufacturing cost of the semiconductor device 500. If the pitch of the external connection terminals 509 of the semiconductor chip 501 becomes narrower in the future, it becomes more difficult to form the through vias 504.

Further, conventionally, the decoupling capacitors 505 formed of thin film capacitors are formed on the Si substrate 503 after forming the through holes 504. This causes a problem in that the decoupling capacitors 505 are likely to be poorly isolated, thus resulting in a reduced yield.

Further, since there is a limit to the capacitance of a thin film capacitor with a single layer structure, it is desirable to increase capacitance by providing a thin film capacitor with a multilayer structure. However, this results in the problem of higher costs because electrodes and a dielectric film are formed and patterned for each layer. Further, since the thin film capacitor is formed on a patterned uneven underlayer, there is a problem in that a poor yield rate due to unevenness of the film thickness of a dielectric film and to dust causes an increase in costs.

SUMMARY OF THE INVENTION

Accordingly, it is a general object of the present invention to provide a semiconductor device in which the above-described disadvantages are eliminated.

A more specific object of the present invention is to provide a semiconductor device operable at high frequencies and manufacturable at reduced cost.

Another more specific object of the present invention is to provide a method of manufacturing the semiconductor device.

Another more specific object of the present invention is to provide a capacitor structure employed in the semiconductor device, and a method of manufacturing the capacitor structure.

One or more of the above objects of the present invention are achieved by a semiconductor device including: an interposer, the interposer including: a Si substrate; multiple through vias provided through an insulating material in corresponding through holes passing through the Si substrate; a thin film capacitor provided on a first main surface of the Si substrate so as to be electrically connected to the through vias; and a plurality of external connection terminals provided on a second main surface of the Si substrate so as to be electrically connected to the through vias, the second main surface facing away from the first main surface; and a semiconductor chip provided on one of the first main surface and the second main surface so as to be electrically connected to the through vias, wherein the Si substrate has a thickness less than a diameter of the through holes.

According to one aspect of the present invention, the thickness of the Si substrate of an interposer is less than or equal to the diameter of a through hole. Accordingly, a semiconductor device that has a through hole of good accuracy and can support a further increase in density can be realized. Further, since a thin film capacitor is provided close to a semiconductor chip, a semiconductor device having equivalent series inductance reduced so as to enable the semiconductor chip to operate at high frequencies can be realized. Furthermore, since it is easy to form the through hole, an inexpensive semiconductor device manufacturable at reduced cost can be realized.

One or more of the above objects of the present invention are also achieved by a method of manufacturing a semiconductor device, the semiconductor device including an interposer and a semiconductor chip, the interposer including a Si substrate; multiple through vias provided through an insulating material in corresponding through holes passing through the Si substrate; a thin film capacitor provided on a first main surface of the Si substrate so as to be electrically connected to the through vias; and multiple external connection terminals provided on a second main surface of the Si substrate so as to be electrically connected to the through vias, the second main surface facing away from the first main surface, the semiconductor chip being electrically connected to the through vias, the method including the steps of: (a) forming the thin film capacitor; (b) thinning down the Si substrate; and (c) forming the through holes in the thinned Si substrate.

According to one aspect of the present invention, by performing the step of thinning down a Si substrate, the aspect ratio of a through hole (Si substrate thickness/through hole diameter) can be reduced, so that the through hole can be formed easily in the Si substrate. Accordingly, it is possible to reduce the cost of manufacturing a semiconductor device. Further, since the step of forming a thin film capacitor is performed before the step of forming the through hole, it is possible to form the dielectric film of the thin film capacitor at high temperature. Accordingly, it is possible to form a thin film capacitor having a high dielectric constant, large capacitance, and high reliability.

One or more of the above objects of the present invention are also achieved by a semiconductor device including a circuit board and a semiconductor chip, wherein the circuit board includes a multilayer interconnection structure; a capacitor structure including a thin film capacitor on the multilayer interconnection structure; an insulating film covering the capacitor structure; through vias passing through the capacitor structure so as to be electrically connected to the thin film capacitor and the multilayer interconnection structure; the semiconductor chip is electrically connected to the through vias on the circuit board; and the capacitor structure includes a Si substrate on the multilayer interconnection structure; through holes in which the through vias are formed, through holes passing through the Si substrate; and the thin film capacitor formed on the Si substrate, the Si substrate having a thickness less than a diameter of the through holes.

According to one aspect of the present invention, the thickness of the Si substrate of a capacitor structure is less than or equal to the diameter of through holes. Accordingly, it is possible to realize a semiconductor device that has the capacitor structure including the through holes of good accuracy and can support a further increase in the density of a circuit board. Further, since a thin film capacitor is provided close to a semiconductor chip, it is possible to realize a semiconductor device having reduced equivalent series inductance so as to enable the semiconductor chip to operate at high frequencies.

One or more of the above objects of the present invention are also achieved by a method of manufacturing a semiconductor device, the semiconductor device including a circuit board and a semiconductor chip, the circuit board including a multilayer interconnection structure; a capacitor structure including a thin film capacitor on the multilayer interconnection structure; an insulating film covering the capacitor structure; through vias passing through the capacitor structure so as to be electrically connected to the thin film capacitor and the multilayer interconnection structure, the semiconductor chip being electrically connected to the through vias on the circuit board, the method including the steps of: (a) forming a thin film capacitor multilayer body on the Si substrate; (b) thinning down the Si substrate; (c) forming through holes passing through the thin film capacitor multilayer body and the Si substrate; and (d) applying the capacitor structure including the thin film capacitor multilayer body and the Si substrate to the multilayer interconnection structure.

According to one aspect of the present invention, by performing the process of thinning down a Si substrate, it is possible to reduce the aspect ratio (Si substrate thickness/through hole diameter) of through holes, thus making it easy to form the through holes in the Si substrate. Accordingly, it is possible to reduce the manufacturing costs of a semiconductor device. Further, a thin film capacitor is formed before formation of the through holes. Accordingly, it is possible to form a dielectric film of the thin film capacitor at high temperature, so that the thin film capacitor having a high dielectric constant, large capacitance, and high reliability can be realized.

One or more of the above objects of the present invention are also achieved by a capacitor structure including: a substrate; a thin film capacitor including at least three electrode layers and a dielectric film provided between each adjacent two of the at least three electrode layers, the at least three electrode layers and the dielectric films being stacked on the substrate; and a pair of first and second pad electrodes spaced apart from each other at a predetermined interval, the first and second pad electrodes serving as external connection terminals of the thin film capacitor, wherein the first pad electrode is electrically connected to odd-numbered ones of the at least three electrode layers from a side of the substrate; the second pad electrode is electrically connected to one or more even-numbered ones of the at least three electrode layers from the side of the substrate; and stacked capacitors having substantially a same capacitance are connected in parallel between the first pad electrode and the second pad electrode.

According to one aspect of the present invention, a first pad electrode is electrically connected to the odd-numbered ones of electrodes from the substrate side, and a second pad electrode is electrically connected to the even-numbered one or more of the electrodes from the substrate side, thereby connecting multiple capacitors of the substantially same capacitance in parallel between the first pad electrode and the second pad electrode. Accordingly, it is possible to achieve a capacitor structure of reduced impedance by reducing inductance by reducing interconnection line length required in configuring a decoupling capacitor.

One or more of the above objects of the present invention are achieved by a method of manufacturing a capacitor structure including a thin film capacitor provided on a substrate; and a pair of first and second pad electrodes spaced apart from each other at a predetermined interval and serving as external connection terminals of the thin film capacitor, the method including the steps of: (a) forming a multilayer body having at least three electrode layers on the substrate by alternately stacking the at least three electrode layers and dielectric films; (b) forming a first vertical interconnection line part at a position where the first pad electrode is to be formed and a second vertical interconnection line part at a position where the second pad electrode is to be formed; and (c) forming the first and second pad electrodes in contact with the first and second vertical interconnection line parts, respectively, wherein step (b) includes the steps of (d) forming a first opening part from a surface of the multilayer body at the position where the first pad electrode is to be formed, the first opening part exposing a first one of the at least three electrode layers from a side of the substrate; (e) forming a second opening part from the surface of the multilayer body at the position where the second pad electrode is to be formed, the second opening part exposing a second one of the at least three electrode layers from the side of the substrate; (f) forming an insulating film covering the first and second opening parts and an uppermost one of the at least three electrode layers; and (g) forming a first interconnection line part in a part of the insulating film corresponding to where the first pad electrode is to be formed, the first interconnection line part including a plurality of vertical interconnection lines in contact with the first one and a remaining odd-numbered one or more of the at least three electrode layers from the side of the substrate, and forming a second interconnection line part in a part of the insulating film corresponding to where the second pad electrode is to be formed, the second interconnection line part including one or more vertical interconnection lines in contact with an even-numbered one or more of the at least three electrode layers from the side of the substrate.

According to one aspect of the present invention, three or more electrode layers are exposed by first and second opening parts. A first pad electrode and the odd-numbered ones of the electrode layers from the substrate side exposed in the first opening part are electrically connected through a first interconnection line part including multiple interconnection lines, and a second pad electrode and the even-numbered one or more of the electrode layers from the substrate side exposed in the second opening part are electrically connected through a second interconnection line part including multiple interconnection lines. As a result, it is possible to connect multiple stacked capacitors in parallel with less interconnection line length than conventionally. As a result, inductance is reduced, so that it is possible to realize a capacitor structure with reduced impedance.

One or more of the above objects of the present invention are also achieved by a semiconductor device including an interposer including: a Si substrate; a thin film capacitor including at least three electrode layers and a dielectric film provided between each adjacent two of the at least three electrode layers, the at least three electrode layers and the dielectric films being stacked on the Si substrate; a plurality of through vias passing through the Si substrate; and a pair of first and second pad electrodes spaced apart from each other at a predetermined interval on an insulating film covering the thin film capacitor, the first and second pad electrodes being electrically connected to the corresponding through vias, wherein the first pad electrode is electrically connected to odd-numbered ones of the at least three electrode layers from a side of the Si substrate; the second pad electrode is electrically connected to one or more even-numbered ones of the at least three electrode layers from the side of the Si substrate; and capacitors having substantially a same capacitance are connected in parallel between the first pad electrode and the second pad electrode.

According to one aspect of the present invention, a first pad electrode is electrically connected to the odd-numbered ones of electrodes from the substrate side, and a second pad electrode is electrically connected to the even-numbered one or more of the electrodes from the substrate side, thereby connecting multiple capacitors of the substantially same capacitance in parallel between the first pad electrode and the second pad electrode. Accordingly, it is possible to achieve a capacitor structure of reduced impedance by reducing inductance by reducing interconnection line length required in configuring a decoupling capacitor.

One or more of the above objects of the present invention are also achieved by A method of manufacturing a semiconductor device including a thin film capacitor provided on a Si substrate; a plurality of through vias passing through the Si substrate; and a pair of first and second pad electrodes spaced apart from each other at a predetermined interval on an insulating film covering the thin film capacitor, and electrically connected to the corresponding through vias, the method including the steps of: (a) forming a multilayer body having at least three electrode layers on the Si substrate by alternately stacking the at least three electrode layers and dielectric films; (b) forming a first vertical interconnection line part at a position where the first pad electrode is to be formed and a second vertical interconnection line part at a position where the second pad electrode is to be formed; and (c) forming the first and second pad electrodes in contact with the first and second vertical interconnection line parts, respectively, wherein step (b) includes the steps of (d) forming a first opening part from a surface of the multilayer body at the position where the first pad electrode is to be formed, the first opening part exposing a first one of the at least three electrode layers from a side of the Si substrate; (e) forming a second opening part from the surface of the multilayer body at the position where the second pad electrode is to be formed, the second opening part exposing a second one of the at least three electrode layers from the side of the Si substrate; (f) forming an insulating film covering the first and second opening parts and an uppermost one of the at least three electrode layers; and (g) forming a first interconnection line part in a part of the insulating film corresponding to where the first pad electrode is to be formed, the first interconnection line part including a plurality of vertical interconnection lines in contact with the first one and a remaining odd-numbered one or more of the at least three electrode layers from the side of the Si substrate, and forming a second interconnection line part in a part of the insulating film corresponding to where the second pad electrode is to be formed, the second interconnection line part including one or more vertical interconnection lines in contact with an even-numbered one or more of the at least three electrode layers from the side of the Si substrate.

BRIEF DESCRIPTION OF THE DRAWINGS

Other objects, features and advantages of the present invention will become more apparent from the following detailed description when read in conjunction with the accompanying drawings, in which:

FIGS. 3A through 3L are diagrams illustrating a semiconductor device manufacturing process according to the first embodiment of the present invention;

FIGS. 5A and 5B are diagrams illustrating a semiconductor device manufacturing process according to the first variation of the first embodiment of the present invention;

FIGS. 7A through 7D are diagrams illustrating a semiconductor device manufacturing process according to the second variation of the first embodiment of the present invention;

FIGS. 11A through 11J are diagrams showing a process of manufacturing a semiconductor device according to the fourth embodiment of the present invention;

FIGS. 12A and 12B are diagrams showing another method of manufacturing a semiconductor device according to the fourth embodiment of the present invention;

FIG. 13 is a cross-sectional view of a semiconductor device according to a first variation of the fourth embodiment of the present invention;

FIG. 14 is a cross-sectional view of a semiconductor device according to a second variation of the fourth embodiment of the present invention;

FIG. 15 is a cross-sectional view of a semiconductor device according a third variation of the fourth embodiment of the present invention;

FIGS. 23A through 23I are diagrams showing a process of manufacturing a capacitor structure according to the fifth embodiment of the present invention;

DETAILED DESCRIPTION OF THE PREFERRED EMBODIMENTS

A description is given below, with reference to the accompanying drawings, of embodiments of the present invention.

First Embodiment

Figure 2:
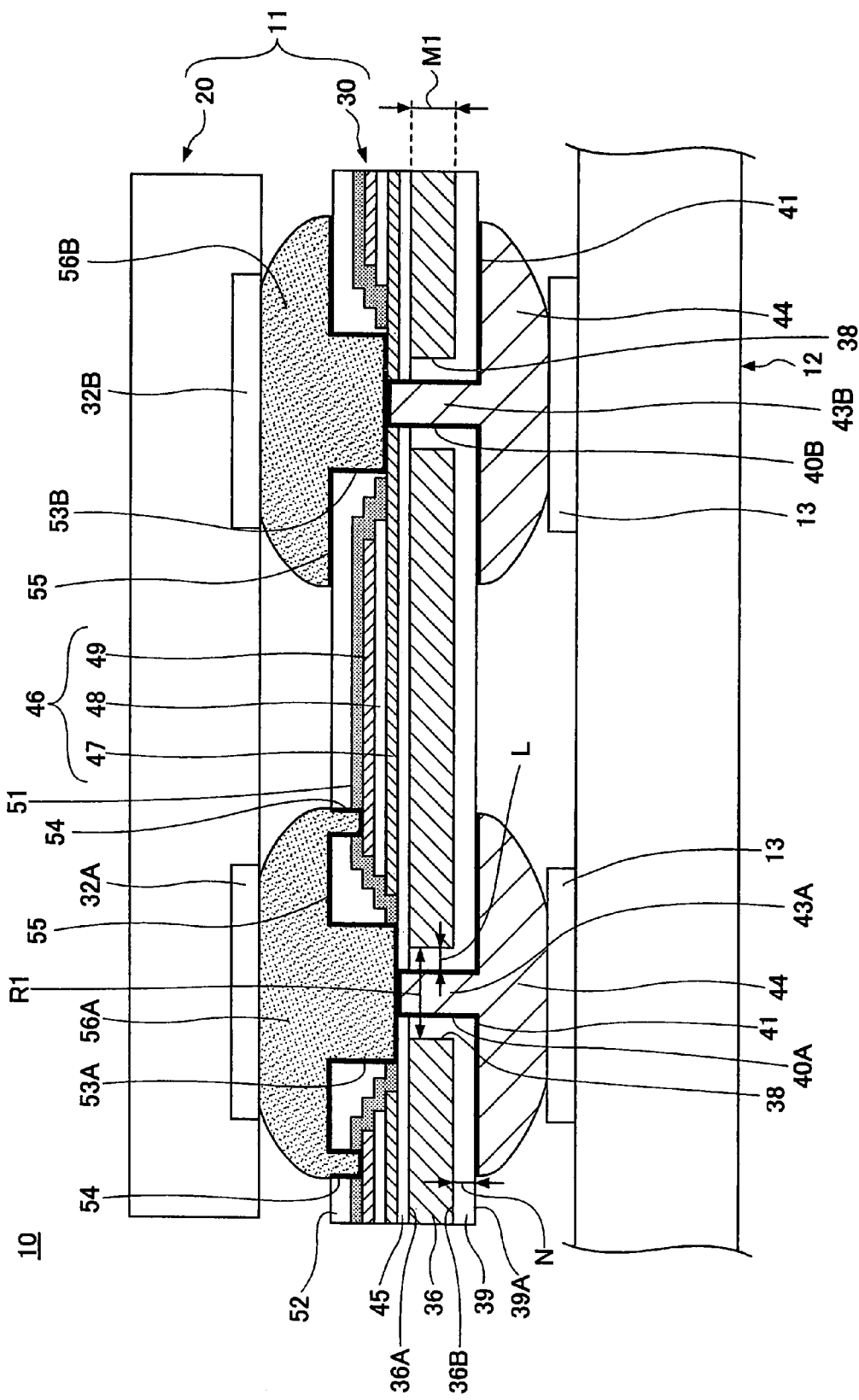
FIG. 2 is a cross-sectional view of an electronic device according to a first embodiment of the present invention.

FIG. 2 is a cross-sectional view of an electronic device 10 according to a first embodiment of the present invention.

Referring to FIG. 2, the electronic device according to this embodiment includes a semiconductor device 11 and a circuit board 12 on which the semiconductor device 11 is mounted. Multiple external connection terminals 44 of the semiconductor device 11 are electrically connected to corresponding connection pads 13 provided on the circuit board 12.

The semiconductor device 11 includes a semiconductor chip 20 and an interposer 30. The semiconductor chip 20 includes at least one connection pad 32A and at least one connection pad 32B. The connection pad 32A, which is an electrode pad for power supply (a power supply electrode pad), is connected to a corresponding internal connection terminal 56A provided on the first main surface side of the interposer 30. The connection pad 32B, which is an electrode pad for ground (a ground electrode pad), is connected to a corresponding internal connection terminal 56B provided on the first main surface side of the interposer 30. For example, a semiconductor chip that is driven at high frequencies may be used as the semiconductor chip 20 employed in this embodiment. This semiconductor chip 20 has semiconductor circuits such as a CPU, a ROM, and a RAM formed on a Si substrate.

The interposer 30 includes a Si substrate 36, insulating material 39, metal films 41 and 55, through vias 43A and 43B, the external connection terminals 44, insulating films 45 and 52, at least one thin film capacitor 46, a protection film 51, and the internal connection terminals 56A and 56B.

The Si substrate 36 is a thinned plate. Through holes 38 of a diameter R1 are formed in the Si substrate 36 at positions corresponding to the positions of formation of the through vias 43A and 43B. The through holes 38 are formed so that their diameter R1 is greater than the diameter of the through vias 43A and 43B.

Thus, forming the through holes 38 so that their diameter R1 is greater than the diameter of the through vias 43A and 43B makes it possible to form a layer of the insulating material 39 easily between the Si substrate 36 and the through vias 43A and 43B.

Further, the thickness M1 of the thin Si substrate 36 is less than the diameter R1 of the through holes 38. Thus, forming the through holes 38 having the diameter R1 greater than that of the through vias 43A and 43B in the thin Si substrate 36 makes it possible to form good through holes 38 with a reduced aspect ratio.

The diameter R1 of the through holes 38 may be, for example, 100 µm. The pitch in forming the through holes 38 may be, for example, 150 µm to 250 µm. The diameter R1 and the pitch of the through holes 38 are not limited to the above-described numerical values.

Further, preferably, the thickness M1 of the Si substrate 36 is within the range of 30 µm to 100 µm. The Si substrate 36 has insufficient strength with the thickness M1 being less than 30 µm. If the thickness M1 is greater than 100 µm, the aspect ratio (M1/R1) of the through holes 38 becomes high, so that it is difficult to form the through holes 38.

The insulating material 39 is formed so as to fill in the space between the Si substrate 36 and the through vias 43A and 43B, which space corresponds to the through holes 38, and to cover a lower surface 36B of the Si substrate 36. Through holes 40A and 40B are formed in the insulating material 39 at positions corresponding to the through holes 38. The through hole 40A passes through the insulating material 39 and the insulating film 45. The through hole 40B passes through the insulating material 39, the insulating film 45, and a lower electrode 47 of the thin film capacitor 46.

The thickness L of the insulating material 39 between the Si substrate 36 and the through vias 43A and 43B may be, for example, 0.05 µm to 50 µm. Further, the thickness N of the insulating material 39 on the lower surface 36B of the Si substrate 36 may be, for example, 0.05 µm to 10 µm. A low-dielectric-constant (low-k) resin, a heat-resistant resin, or a photosensitive resin may be employed as the material of the insulating material 39. It is preferable to employ a material having a dielectric constant of 1.0 to 3.5 as the low-k resin. Examples of the low-k resin include fluororesins such as polyfluoroethylene, fluorinated epoxy, and fluorinated polyimide. Examples of the heat-resistant resin include epoxy resins, polyimide resins, and polyphenyl ether resins. Examples of the photosensitive resin include photosensitive polyimide resins.

In the case of using the above-described low-k resin as the insulating material 39, it is possible to prevent signal degradation of the semiconductor device 11.

The metal film 41, which is, for example, 20 nm in thickness, is formed over a surface 39A of the insulating material 39 at positions corresponding to the positions of formation of the external connection terminals 44 and the surface of the through holes 40A and 40B. The metal film 41 is electrically connected to the metal film 55 formed on the first main surface side of the interposer 30. In forming the through vias 43A and 43B and the external connection terminals 44 by electroplating, the metal film 41 serves as a power supply layer. A multilayer film formed by stacking, for example, a Ti film, a Cu film, and a Ni film in this order may be employed as the metal film 41.

The through vias 43A and 43B, which are, for example, 70 µm in diameter, are formed in the through holes 40A and 40B, respectively, on which the metal film 41 is formed. The through vias 43A and 43B are integrated with the corresponding external connection terminals 44. The through via 43A electrically connects the internal connection terminal 56A and the corresponding external connection terminal 44. The through via 43B electrically connects the internal connection terminal 56B and the corresponding external connection terminal 44. A conductive material may be employed as the material of the through vias 43A and 43B. Specifically, for example, Sn—Ag solder is employable.

The external connection terminals 44 are formed on the metal film 41 provided on the surface 39A of the insulating material 39. The external connection terminals 44 electrically connect the connection pads 13 provided on the circuit board 12 and the through vias 43A and 43B. A conductive material may be employed as the material of the through vias 43A and 43B. For example, Sn—Ag solder may be employed as the conductive material.

The insulating film 45, which is, for example, 50 nm in thickness, is formed on an upper surface 36A of the Si substrate 36. The insulating film 45 is the adhesion layer of the thin film capacitor 46. An insulating film having excellent moisture resistance may be employed as the insulating film 45. For example, a $SiO_2$ film or an alumina film is employable as the insulating film 45.

The thin film capacitor 46 includes a dielectric film 48, the lower electrode 47, and an upper electrode 49. The dielectric film 48 is sandwiched between the lower electrode 47 and the upper electrode 49. The lower electrode 47, the dielectric film 48, and the upper electrode 49 are stacked in the order described.

The thin film capacitor 46 is formed on the insulating film 45 at the position between the internal connection terminal 56A, connected to the power supply electrode pad 32A of the semiconductor chip 20, and the internal connection terminal 56B, connected to the ground electrode pad 32B of the semiconductor chip 20. The upper electrode 49 is electrically connected to the internal connection terminal 56A. The lower electrode 47 is electrically connected to the internal connection terminal 56B. By thus connecting the thin film capacitor 46 electrically, the thin film capacitor 46 functions as a decoupling capacitor so as to absorb noise generated by the semiconductor chip 20.

For example, Au, Al, Pt, Ag, Pd, Cu, and their alloys are employable as the material of the lower electrode 47, which may be 100 nm in thickness.

The material of the dielectric film 48, which is, for example, 100 nm in thickness, is not limited in particular as long as it is a dielectric material. Preferably, the dielectric film 48 is formed of a metal oxide material having a perovskite crystal structure having a high dielectric constant. Examples of such a material include $(Ba,Sr)TiO_3(BST)$, $SrTiO_3$ (ST), $BaTiO_3$, $Ba(Zr,Ti)O_3$, $Ba(Ti,Sn)O_3$, $Pb(Zr,Ti)O_3(PZT)$, $(Pb,La)(Zr,Ti)O_3(PLZT)$, $Pb(Mn,Nb)O_3$—$PbTiO_3(PMN-PT)$, and $Pb(Ni,Nb)O_3$—$PbTiO_3$.

In the case of using a metal oxide material having a perovskite crystal structure as the dielectric film 48, it is preferable to employ Pt as the material of the lower electrode 47. Employment of Pt enables the dielectric film 48 to grow epitaxially, so that the dielectric constant of the dielectric film 48 increases.

As the material of the upper electrode 49, Au, Al, Pt, Ag, Pd, Cu, and their alloys are employable, for example. The above-described metals or their alloys may be stacked on IrOx. The upper electrode 49 may be, for example, 100 nm in thickness.

The protection film 51, which is, for example, 0.1 μm in thickness, is provided so as to cover the thin film capacitor 46. The protection film 51 is formed of an insulating material, which is not limited in particular, but is preferably $Si_3N_4$, $SiO_2$, or alumina, which has excellent moisture resistance. Employment of such a material makes it possible to prevent degradation of the dielectric film 48 having a perovskite crystal structure.

The insulating film 52, which is, for example, 2 μm in thickness, is provided so as to cover the protection film 51. An opening part (hole) 53A exposing the insulating film 45, an opening part (hole) 53B exposing the lower electrode 47, and opening parts (holes) 54 positioned close to the opening part 53A and exposing the upper electrode 49 are formed in the insulating film 52. The insulating film 52 is formed of the same material as the above-described insulating material 39.

The metal film 55, which is, for example, 50 nm in thickness, is formed on part of the insulating film 52 corresponding to the position of formation of the internal connection terminal 56A (including the internal surface of the opening parts 53A and 54) and on part of the insulating film 52 corresponding to the position of formation of the internal connection terminal 56B (including the internal surface of the opening part 53B). In forming the internal connection terminals 56A and 56B by electroplating, the metal film 55 serves as a power supply layer. A multilayer film formed by stacking, for example, a Ti film, a Cu film, and a Ni film in this order may be employed as the metal film 55.

The internal connection terminal 56A is formed on the metal film 55 so as to fill the opening parts 53A and 54 and project from the insulating film 52. The internal connection terminal 56A is a terminal for power supply connected to the power supply electrode pad 32A of the semiconductor chip 20. The internal connection terminal 56A is electrically connected to the through via 43A and the upper electrode 49. The projecting part of the internal connection terminal 56A is connected to the power supply electrode pad 32A of the semiconductor chip 20.

The internal connection terminal 56B is formed on the metal film 55 so as to fill the opening part 53B and project from the insulating film 52. The internal connection terminal 56B is a terminal for ground connected to the ground electrode pad 32B of the semiconductor chip 20. The internal connection terminal 56B is electrically connected to the through via 43B and the lower electrode 47. The projecting part of the internal connection terminal 56B is connected to the ground electrode pad 32B of the semiconductor chip 20. A conductive material may be employed as the material of the internal connection terminals 56A and 56B. Specifically, for example, Sn—Ag solder may be employed.

According to this embodiment, the thickness M1 of the Si substrate 36 of the interposer 30 may be less than or equal to the diameter R1 of the through holes 38. Accordingly, the semiconductor device 11, having the through holes 38 of good accuracy and the interposer 30 that can support a further increase in density, is realized.

Further, since the thin film capacitor 46 is provided close to the semiconductor chip 20, equivalent series inductance is reduced. As a result, the semiconductor device 11, in which the semiconductor chip 20 is operable at high frequencies, is realized.

In this embodiment, a description is given of the case where the thin film capacitor 46 is used as a decoupling capacitor. Alternatively, the thin film capacitor 46 may be used as a capacitor other than a decoupling capacitor. Further, in this embodiment, the single-layer thin film capacitor 46 is taken as an example. Alternatively, a multilayer thin film capacitor having at least two dielectric films 48 between the lower electrode 47 and the upper electrode 49 and an intermediate electrode sandwiched between the adjacent dielectric electrodes 48 may be provided in place of the single-layer thin film capacitor 46. The material of the intermediate electrode may be the same as that of the upper electrode 49.

FIGS. 3A through 3L are diagrams illustrating a semiconductor device manufacturing process according to the first embodiment of the present invention. A description is given below, with reference to the drawings, of a method of manufacturing the semiconductor device 11 according to this embodiment.

Figure 3A:
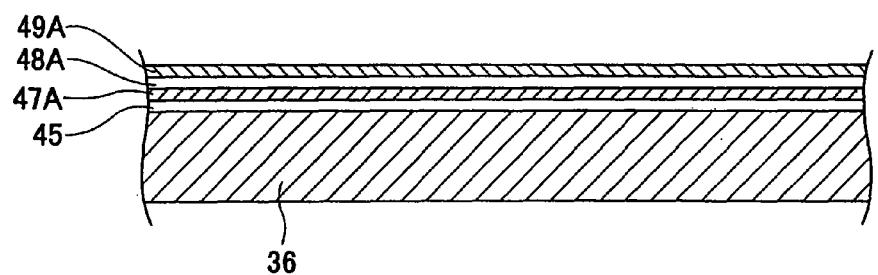

First, in the process of FIG. 3A, by sputtering, the insulating film 45 serving as an adhesion film is formed, and further, a lower electrode film 47A, a dielectric film 48A, and an upper electrode film 49A are successively formed on a surface of the Si substrate 36 having a thermal oxide film (a $SiO_2$ film) formed on the surface.

Specifically, for example, using a multi-target DC-RF magnetron sputtering device, an amorphous alumina film (50 nm in thickness) is formed as the insulating film 45 on the Si substrate 36 on which a thermal oxide film (a $SiO_2$ film) is formed with the substrate temperature being 200° C. Next, with the substrate temperature being 200° C., a Pt film (100 nm in thickness) is formed as the lower electrode film 47A. Next, with the substrate temperature being 600° C., a BST film (100 nm in thickness) is formed as the dielectric film 48A. Next, with the substrate temperature being 25° C., an IrOx film and a Au film (100 nm in thickness) are successively formed as the upper electrode film 49A. These multilayer films 45, 47A, 48A, and 49A may be formed by a method other than sputtering, such as vapor deposition or CVD.

Figure 3B:
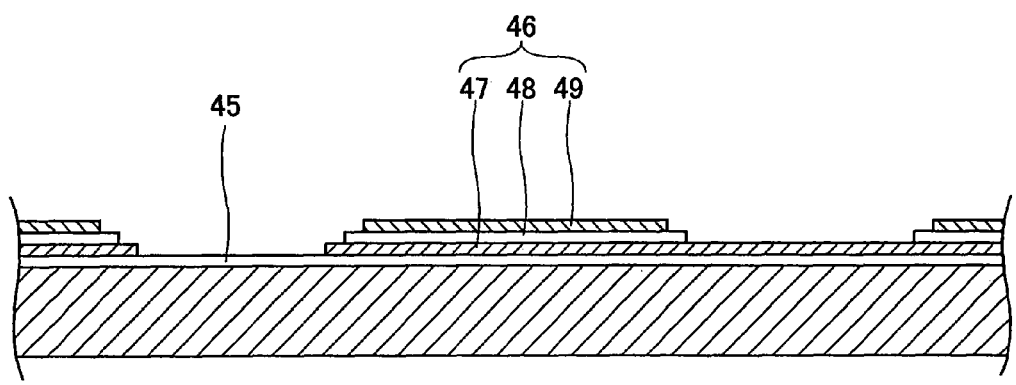

Next, in the process of FIG. 3B, the stacked upper electrode film 49A, dielectric film 48A, and lower electrode film 47A are patterned by ion milling, so that the thin film capacitor 46 is formed. Next, the thin film capacitor 46 is subjected to heat treatment in an oxygen atmosphere so as to remove thermal distortion and supply oxygen atoms to oxygen deficient parts in the dielectric film 48 and the IrOn film. The lower electrode 47, the dielectric film 48, and the upper electrode 49 of the thin film capacitor 46 are formed by patterning the lower electrode film 47A, the dielectric film 48A, and the upper electrode film 49A, respectively.

Figure 3C:
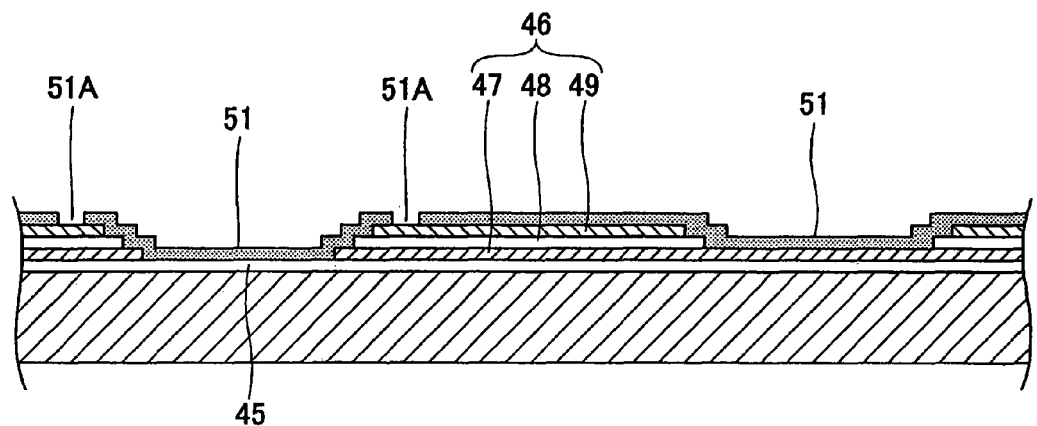

Next, in the process of FIG. 3C, the protection film 51 covering the thin film capacitor 46 and the insulating film 45 is formed. Next, an opening part (hole) 51A exposing the upper electrode 49 is formed in the protection film 51 by ion milling. Next, the protection film 51 is subjected to post-annealing in an oxygen atmosphere. Specifically, for example, an amorphous alumina film (0.1 μm in thickness) is formed as the protection film 51 by sputtering using an RF magnetron sputtering device. The protection film 51 may be formed by a method other than sputtering, such as vapor deposition or CVD.

Thus, forming the thin film capacitor 46 before a through hole formation process makes it possible to form the dielectric film 48 at high temperature, so that the thin film capacitor 46 having large capacitance, high reliability, and a high dielectric constant can be formed. Further, the thin film capacitor 46 is formed by stacking the lower electrode film 47A, the dielectric film 48A, and the upper electrode film 49A successively on the even planar insulating film 45, and patterning the lower electrode film 47A, the dielectric film 48A, and the upper electrode film 49A. Accordingly, it is possible to increase the yield of the thin film capacitor 46. Further, foreign materials generated in forming the through holes 38, 40A, and 40B and the through vias 43A and 43B are prevented from adhering to the area of formation of the thin film capacitor 46. Accordingly, it is possible to increase the yield of the thin film capacitor 46.

Figure 3D:
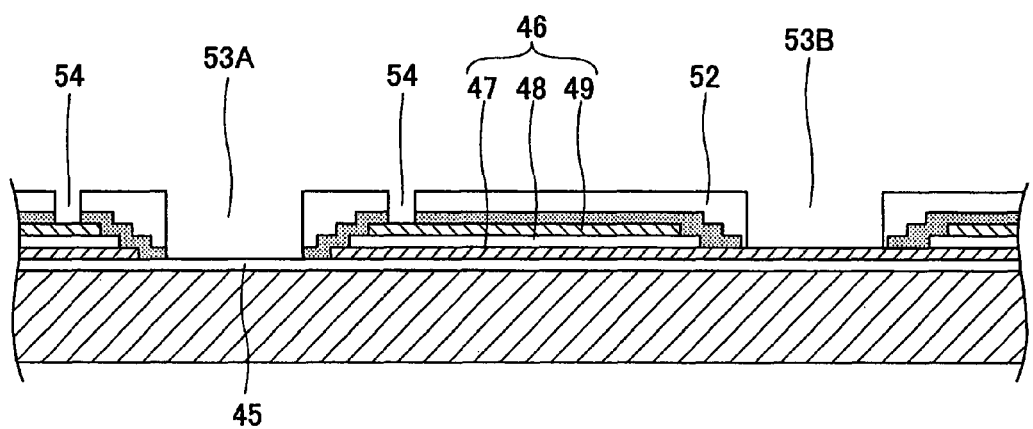

Next, in the process of FIG. 3D, the insulating film 52 is formed so as to cover the structure illustrated in FIG. 3C. Next, the opening part 53A exposing the insulating film 45, the opening part 53B exposing the lower electrode 47, and the opening parts 54 exposing the upper electrode 49 are formed. Specifically, for example, a photosensitive polyimide resin (2 μm in thickness) is formed as the insulating film 52 by spin coating. The opening parts 53A, 53B, and 54 are formed by exposing the photosensitive polyimide resin to light and developing the photosensitive polyimide resin. The insulating film 52 may also be formed by a method other than spin coating, such as spraying or dipping.

Next in the process of FIG. 3E, the metal film 55 serving as a plating seed layer is formed on the structure illustrated in FIG. 3D. Specifically, for example, a Ti film, a Cu film, and a Ni film are successively formed by sputtering so as to serve as the metal film 55. The metal film 55 may be formed by a method other than sputtering, such as vapor deposition or CVD.

Next, in the process of FIG. 3F, a resist layer 66 exposing part of the metal film 55 corresponding to the area of formation of the internal connection terminals 56A and 56B is formed on the metal film 55. Next, the opening parts 53A, 53B, and 54 are filled with a conductive material 68. The conductive material 68 is later reflowed so as to serve as the internal connection terminals 56A and 56B. Specifically, the conductive material 68 is formed by causing Sn—Ag solder to be deposited by electroplating with the metal film 55 serving as a power supply layer.

Next, in the process of FIG. 3G, an unnecessary part of the metal film 55 not covered with the conductive material 68 is removed. Thereafter, the conductive material 68 is reflowed by heating, so that the internal connection terminals 56A and 56B of Sn—Ag solder bumps are formed.

Figure 3H:
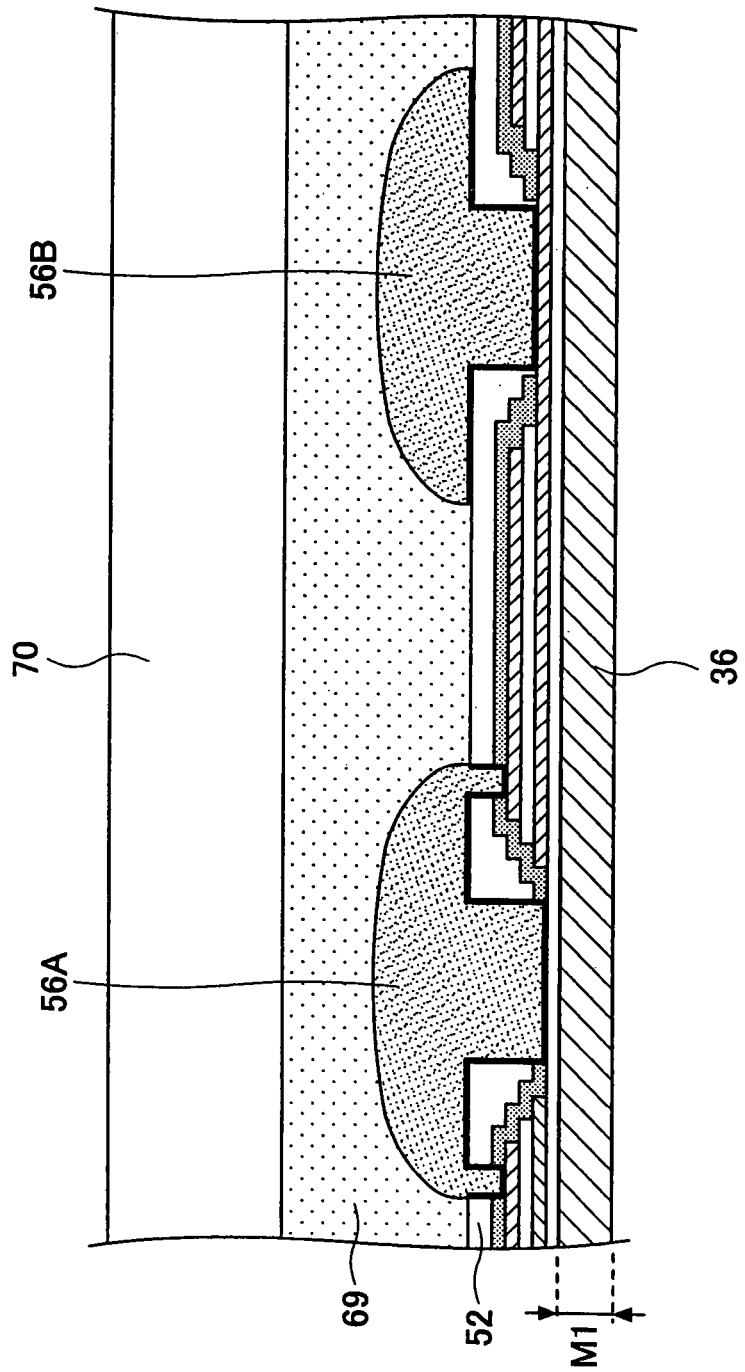

Next, in the process of FIG. 3H, a holding substrate 70 is adhered through an adhesive tape 69 to the structure illustrated in FIG. 3G on its first main surface side (the side on which the internal connection terminals 56A and 56B are formed), and the Si substrate 36 is thinned from the second main surface side. Specifically, for example, the Si substrate 36 is thinned down to 50 μm in thickness with a grinder. After thinning down the Si substrate 36, the adhesive tape 69 is removed. For example, a UV tape, whose adhesiveness is reduced by ultraviolet ray irradiation, may be employed as the adhesive tape 69. For example, grinding or etching may be employed to thin down the Si substrate 36. As grinding methods, polishing such as buffing and CMP and cutting are employable, for example. As etching methods, wet etching and plasma etching are employable, for example.

Thus, thinning down the Si substrate 36 before forming the through holes 38 makes it possible to reduce the aspect ratio of the through holes 38 and form the through holes 38 using plasma etching or wet etching lower in cost than ICP (Induction Coupling Plasma). Accordingly, it is possible to manufacture the semiconductor device 11 at lower cost.

Figure 3I:
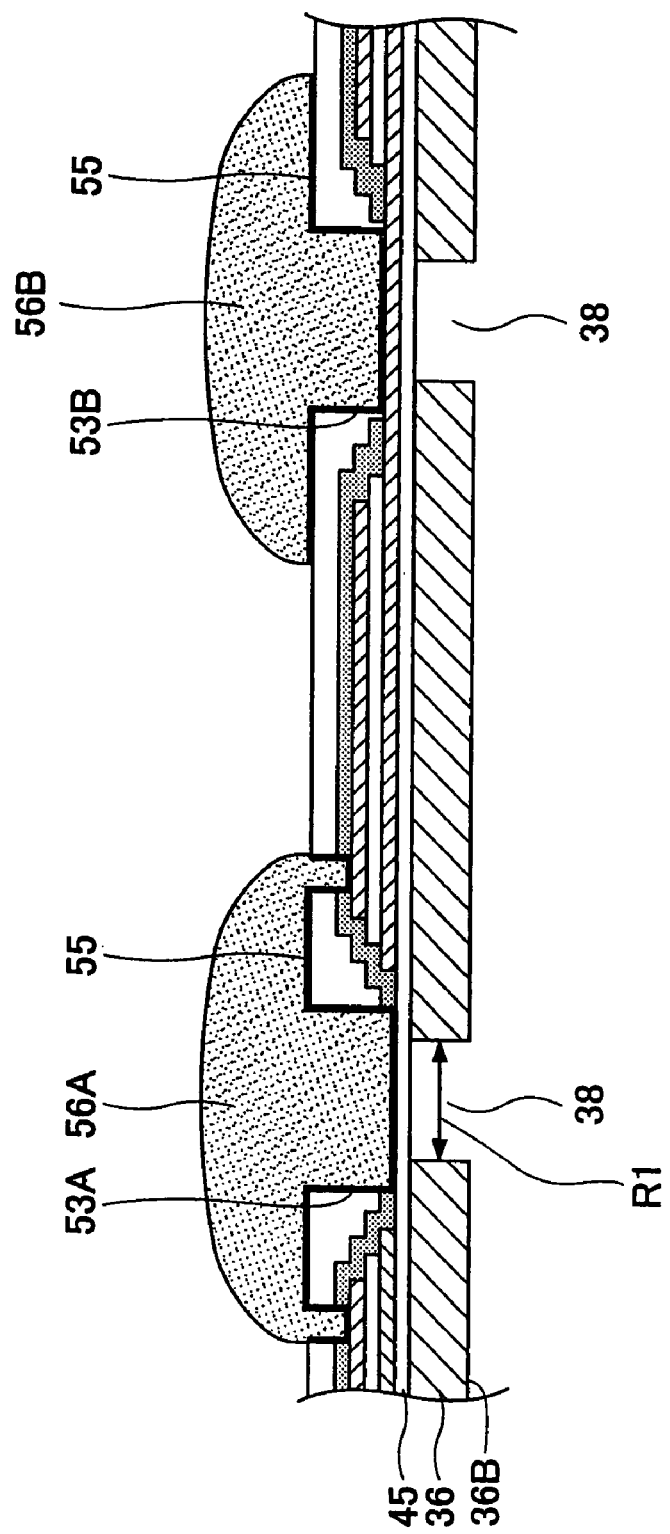

Next, in the process of FIG. 3I, the through holes 38 of the diameter R1 are formed in the Si substrate 36 from its second main surface side. Specifically, for example, the through holes 38 may be formed by wet etching using a liquid mixture of hydrogen fluoride and a nitric acid as etching liquid. Wet etching using other etching liquids or plasma etching may also be employed. The diameter R1 of the through holes 38 may be, for example, 100 μm.

Figure 3J:
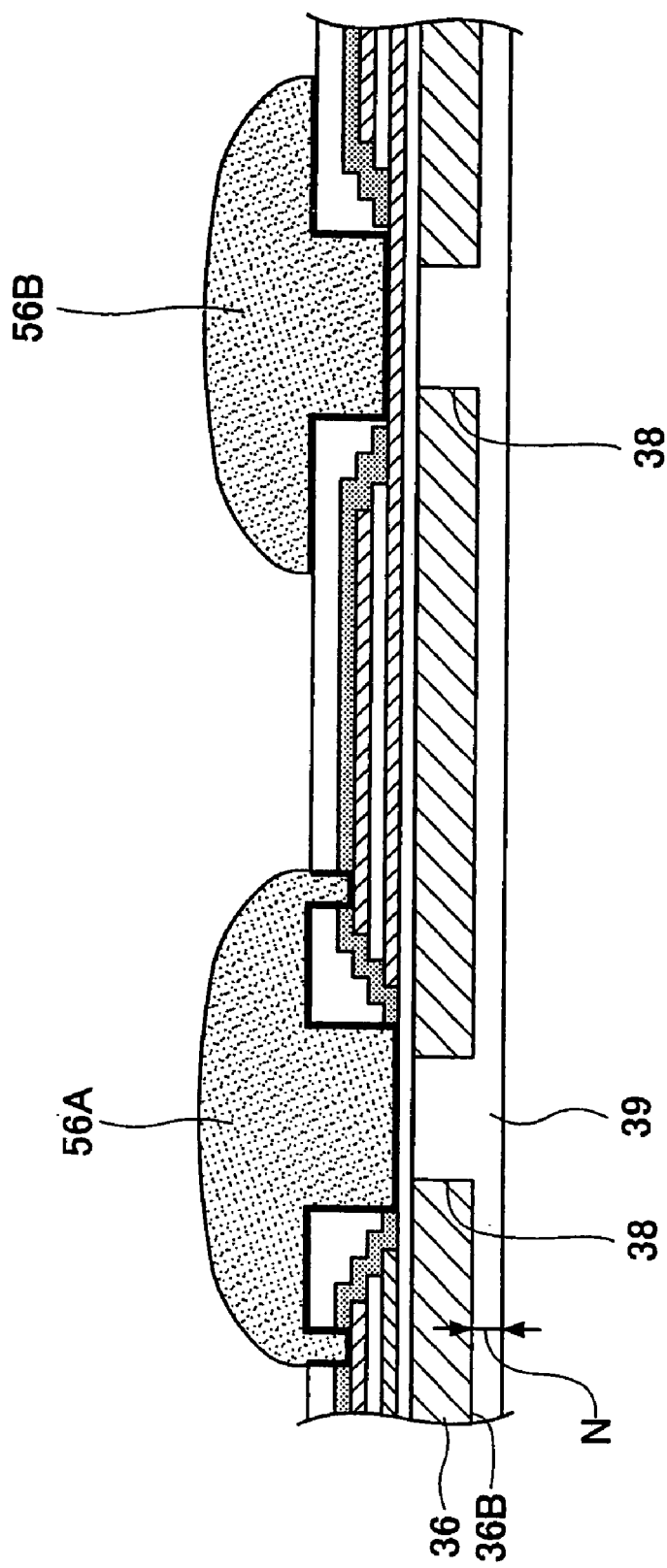

Next, in the process of FIG. 3J, the insulating material 39 is applied to fill in the through holes 38 and to cover the lower surface 36B of the Si substrate 36, and next, the insulating material 39 is hardened. Specifically, for example, an epoxy resin, which is a heat-resistant resin, is applied as the insulating material 39 by spin coating, and thereafter, the epoxy resin is thermoset at a temperature of 200° C. The insulating material 39 may also be applied by a method other than spin coating, such as spraying or dipping.

Thus, forming the insulating material 39 so that the insulating material 39 simultaneously covers the lower surface 36B of the Si substrate 36 and fills in the through holes 38 makes it possible to simplify the manufacturing process of the semiconductor device 11 compared with the case of forming an insulating material provided on the lower surface 36B of the Si substrate 36 and an insulating material filling in the through holes 38 separately.

Employment of a resin material such as a low-k resin, a heat-resistant resin, or a photosensitive resin as the insulating material 39 filling in the through holes 38 makes it possible to form the through holes 40A and 40B for forming the through vias 43A and 43B with ease, so that it is possible to manufacture the semiconductor device 11 at reduced cost. An insulating material on the lower surface 36B of the Si substrate 36 and an insulating material filling in the through holes 38 may be provided separately. In this case, the insulating material provided on the lower surface 36B of the Si substrate 36 may be different from the insulating material filling in the through holes 38.

Next, in the process of FIG. 3K, the through holes 40A and 40B of 70 μm in diameter exposing the metal film 55 are formed in the insulating material 39 filling in the through holes 38. Specifically, the through holes 40A and 40B are formed by ArF excimer laser processing using a heat-resistant resin or a low-k resin as the insulating material 39. The through holes 40A and 40B may also be formed using a laser processing method other than ArF excimer laser processing, or plasma etching. In the case of using a photosensitive resin as the insulating material 39, the through holes 40A and 40B may be formed by exposing and developing part of the insulating material 39 corresponding to the through holes 40A and 40B.

Next, in the process of FIG. 3L, the metal film 41, the through vias 43A and 43B, and the external connection terminals 44 are formed by the same method as illustrated in the processes of FIGS. 3E through 3G. At this point, the through vias 43A and 43B and the external connection terminals 44 are formed simultaneously.

Thus, forming the through vias 43A and 43B and the external connection terminals 44 simultaneously makes it possible to simplify the manufacturing process of the semiconductor device 11 and reduce its manufacturing cost. Further, forming the through vias 43A and 43B after thinning down the Si substrate 36 reduces the length of the through vias 43A and 43B connecting the semiconductor chip 20 and the circuit board 12. This makes it possible to transmit a high-frequency signal at high speed between the semiconductor chip 20 and the circuit board 12 (FIG. 2) connected to the external connection terminals 44. Further, the through holes 40A and 40B are formed in the thinned Si substrate 36. This reduces time for processing the through vias 43A and 43B, so that it is possible to reduce manufacturing costs.

Next, the Si substrate 36 is cut using, for example, a dicer, so that the interposer 30 is formed. Thereafter, the connection pads 32A and 32B of the semiconductor chip 20 are connected to the internal connection terminals 56A and 56B, respectively, of the interposer 30, so that the semiconductor device 11 is manufactured.

According to the manufacturing method according to this embodiment, since the Si substrate 36 is thinned down, the amount of processing in the direction of thickness is reduced in forming the through holes 38. Accordingly, the through holes 38 can be formed with ease, and the processing time can be reduced. Further, it is possible to form the through holes 38 by wet etching or plasma etching. Accordingly, it is possible to form the through holes 38 at far lower cost than by conventional ICP. Further, the through holes 40A and 40B for the through vias 43A and 43B are formed by laser via processing with the through holes 38 being filled with an insulating material such as a low-k resin, a heat-resistant resin, or a photosensitive resin, thus resulting in low processing cost. For these reasons, the semiconductor device 11 can be manufactured at lower cost than conventionally.

Further, according to the manufacturing method according to this embodiment, the thin film capacitor 46 is formed before forming the through holes 38 in the Si substrate 36. This facilitates formation of the thin film capacitor 46. Compared with the conventional manufacturing method by which the through holes 38 are formed before the thin film capacitor 46, the yield of the thin film capacitor 46 can be increased because it is possible to prevent dust and foreign materials generated in forming the through holes 38 from having an adverse effect such as poor isolation on the thin film capacitor 46.

The electric characteristics and the reliability of an interposer made by the above-described manufacturing process of FIGS. 3A through 3L were evaluated. The interposer was made using the conditions specified in each manufacturing process. With respect to the electric characteristics, the results were a capacitance density of 4 μF/cm$^2$, an ESR (equivalent series resistance) of 0.01Ω, an ESL (equivalent series inductance) of 10 pH, and a withstand voltage of 20 V or over. These results confirmed that it is possible to form an interposer having the thin film capacitor 46 with large capacitance and reduced ESL.

A high temperature and humidity load test was conducted as a reliability evaluation under the conditions of a temperature of 121° C., a relative humidity of 85%, an applied voltage of 3 V, and a test time of 48 hours. The insulation resistance after the test was higher than or equal to 10 MΩ, which confirmed that the interposer also has sufficient reliability at high temperature and high humidity.

Figure 4:
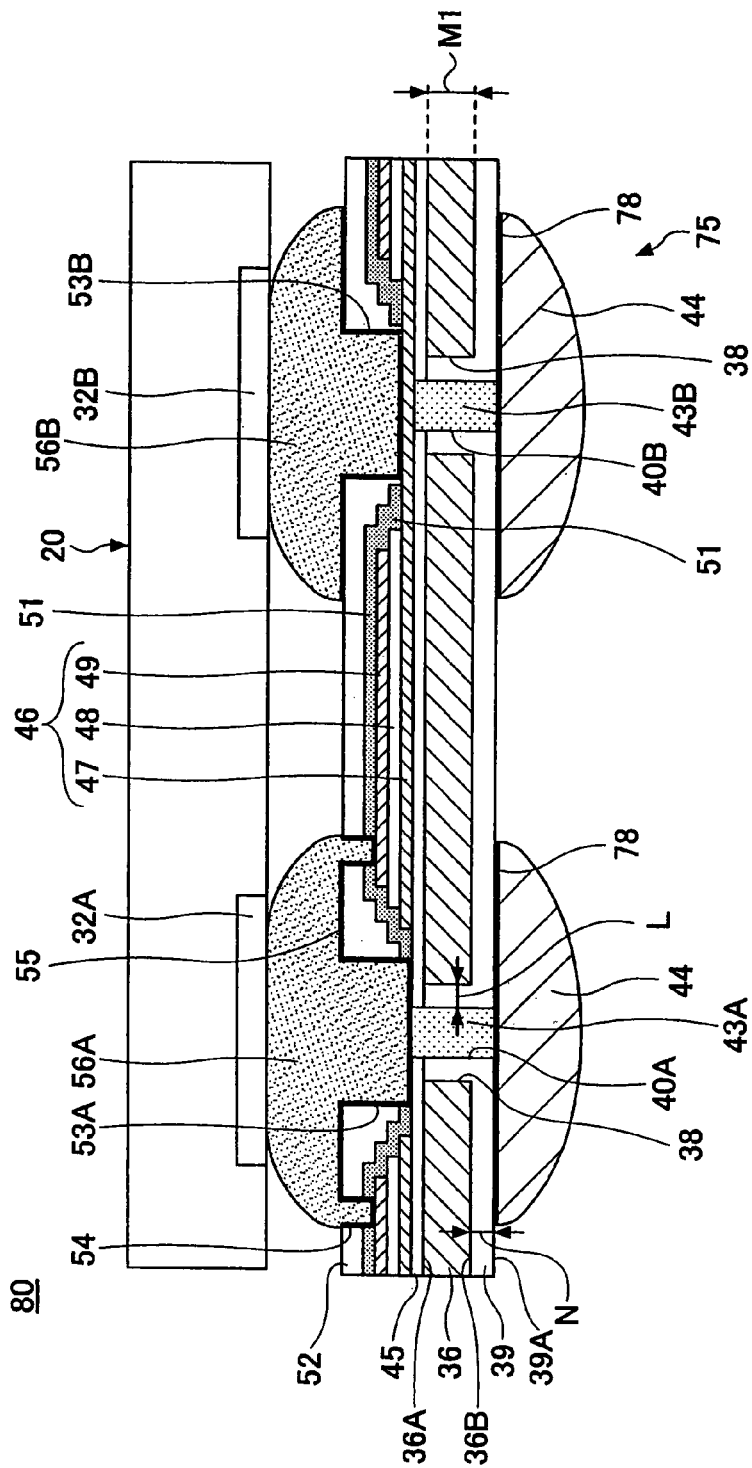
FIG. 4 is a cross-sectional view of a semiconductor device according to a first variation of the first embodiment of the present invention.

FIG. 4 is a cross-sectional view of a semiconductor device 80 according to a first variation of the first embodiment. In FIG. 4, the same elements as those of the semiconductor device 11 of the first embodiment are referred to by the same numerals, and a description thereof is omitted.

Referring to FIG. 4, the semiconductor device 80 includes the semiconductor chip 20 and an interposer 75. The semiconductor device 80 is equal in configuration to the semiconductor device 11 of the first embodiment except that the through vias 43A and 43B and the external connection terminals 44 are separately formed and that pads 78 are formed between the through vias 43A and 43B and the corresponding external connection terminals 44.

The through vias 43A and 43B are formed by filling the through holes 40A and 40B with conductive paste. For example, a mixture of conductive particles of carbon, silver, or copper and a viscous binder may be used as the conductive paste.

The pads 78 are formed on the surface 39A of the insulating material 39 so as to be electrically connected to the corresponding through vias 43A and 43B and external connection terminals 44. A multilayer film formed by stacking, for example, a Ti film, a Cu film, and a Ni film in this order may be employed as the pads 78. The external connection terminals 44 are formed on the corresponding pads 78 so as to be electrically connected to the through vias 43A and 43B through the pads 78.

Figure 5A:
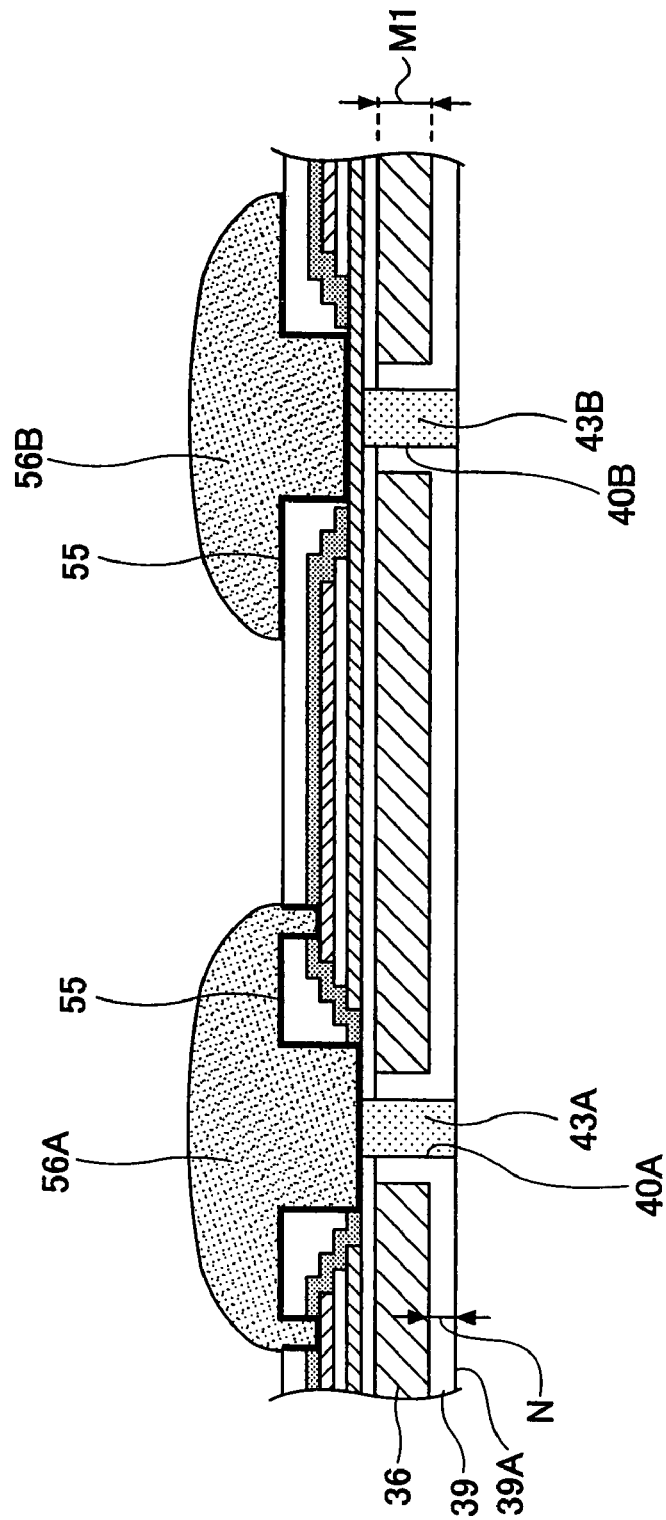

FIGS. 5A and 5B are diagrams illustrating a semiconductor device manufacturing process according to the first variation of the first embodiment. A description is given below, with reference to the drawings, of a method of manufacturing the semiconductor device 80.

First, by the above-described processes of FIGS. 3A through 3K, the through holes 40A and 40B are formed. Next, in the process of FIG. 5A, the through holes 40A and 40B are filled with conductive paste. Next, the conductive paste is hardened, so that the through vias 43A and 43B are formed. Specifically, the conductive paste is applied by screen printing, and thereafter, the conductive paste is thermoset at a temperature of 200° C.

Next, in the process of FIG. 5B, by the same method as illustrated in the processes of FIGS. 3E through 3G, the pads 78 and the external connection terminals 44 are successively formed on the surface 39A of the insulating material 39. Next, the Si substrate 36 is cut by dicing, so that the interposer 75 is formed. Thereafter, by connecting the semiconductor chip 20 to this interposer 75, the semiconductor device 80 as illustrated in FIG. 4 is manufactured.

The semiconductor device 80 according to the first variation can produce the same effects as the semiconductor device 11. The electric characteristics and the reliability of an interposer according to the first variation made by the above-described manufacturing process of FIGS. 3A through 3K, 5A, and 5B were evaluated. The interposer according to the first variation was made using the conditions specified in each manufacturing process. With respect to the electric characteristics, the results were a capacitance density of 4 μF/cm$^2$, an ESR (equivalent series resistance) of 0.01Ω, an ESL (equivalent series inductance) of 10 pH, and a dielectric strength of 20 V or over. These results confirmed that it is possible to form an interposer having the thin film capacitor 46 with large capacitance and reduced ESL.

A high temperature and humidity load test was conducted as a reliability evaluation under the conditions of a temperature of 121° C., a relative humidity of 85%, an applied voltage of 3 V, and a test time of 48 hours. The insulation resistance after the test was higher than or equal to 10 MΩ, which confirmed that the interposer according to the first variation also has sufficient reliability at high temperature and high humidity.

Figure 6:
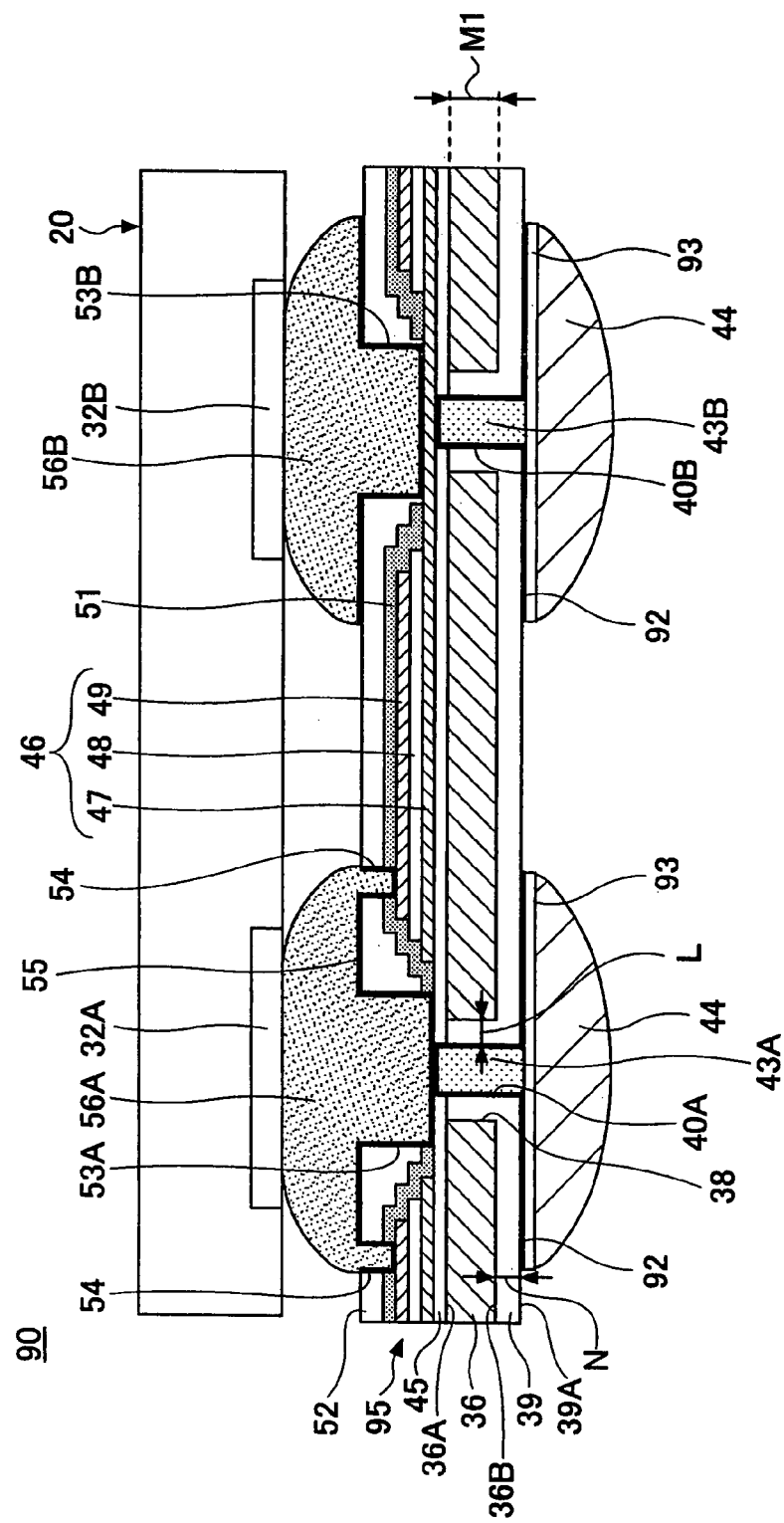
FIG. 6 is a cross-sectional view of a semiconductor device according to a second variation of the first embodiment of the present invention.

FIG. 6 is a cross-sectional view of a semiconductor device 90 according to a second variation of the first embodiment. In FIG. 6, the same elements as those of the semiconductor device 11 of the first embodiment are referred to by the same numerals, and a description thereof is omitted.

Referring to FIG. 6, the semiconductor device 90 includes the semiconductor chip 20 and an interposer 95. The semiconductor device 90 is equal in configuration to the semiconductor device 80 of the first variation of the first embodiment except that: a metal film 92 is formed on part of the insulating material 39 and part of the insulating film 45 corresponding to the through holes 40A and 40B and on part of the insulating material 39 corresponding to the positions of formation of pads 93; the through vias 43A and 43B are formed by plating; the pads 93 are formed on the metal film 92 corresponding to the through vias 43A and 43B and on the through vias 43A and 43B; and the external connection terminals 44 are provided on the corresponding pads 93.

The metal film 92 is formed on part of the surface 39A of the insulating material 39 corresponding to the area of formation of the pads 93 and on the through holes 40A and 40B. The metal film 92 is electrically connected to the through vias 43A and 43B and the internal connection terminals 56A and 56B. The metal film 92 serves as a power supply layer in forming the through vias 43A and 43B and the pads 93 by electroplating. For example, Ti, Cr, or Cu may be employed as the material of the metal film 92.

The pads 93 are formed so as to cover the metal film 92 formed on the surface 39A of the insulating material 39, and the through vias 43A and 43B. For example, Ni may be employed as the material of the pads 93.

The external connection terminals 44 are formed so as to cover the pads 93. The external connection terminals 44 are electrically connected to the through vias 43A and 43B through the pads 93.

The semiconductor device 90 having this configuration can also produce the same effects as the semiconductor device 11 of the first embodiment. Further, the evaluation of the electric characteristics and the reliability of the interposer 95 formed by the above-described manufacturing process showed the same good results as those of the interposer 30 of the first embodiment.

FIGS. 7A through 7D are diagram illustrating a semiconductor device manufacturing process according to the second variation of the first embodiment. A description is given below, with reference to the drawings, of a method of manufacturing the semiconductor device 90.

First, by the above-described processes of FIGS. 3A through 3I, the Si substrate 36 is thinned down, and the through holes 38 are formed. Specifically, the Si substrate 36 is thinned down, and the through holes 38 of the diameter R1 (=200 μm) are formed in the Si substrate 36 by plasma etching using a chlorine-based gas.

Next, in the process of FIG. 3J, specifically, a photosensitive polyimide resin is applied as the insulating material 39 to fill in the through holes 38 and to cover the lower surface 36B of the Si substrate 36. Next, the photosensitive polyimide resin is hardened by ultraviolet rays.

Next, in the process of FIG. 3K, specifically, part of the insulating material 39 corresponding to the area of formation of the through holes 40A and 40B is exposed and developed by photolithography. Next, part of the insulating film 45 corresponding to the area in which the through holes 40A and 40B are formed is subjected to wet etching using a hydrogen fluoride solution, thereby forming the through holes 40A and 40B of 50 μm in diameter.

Figure 7A:
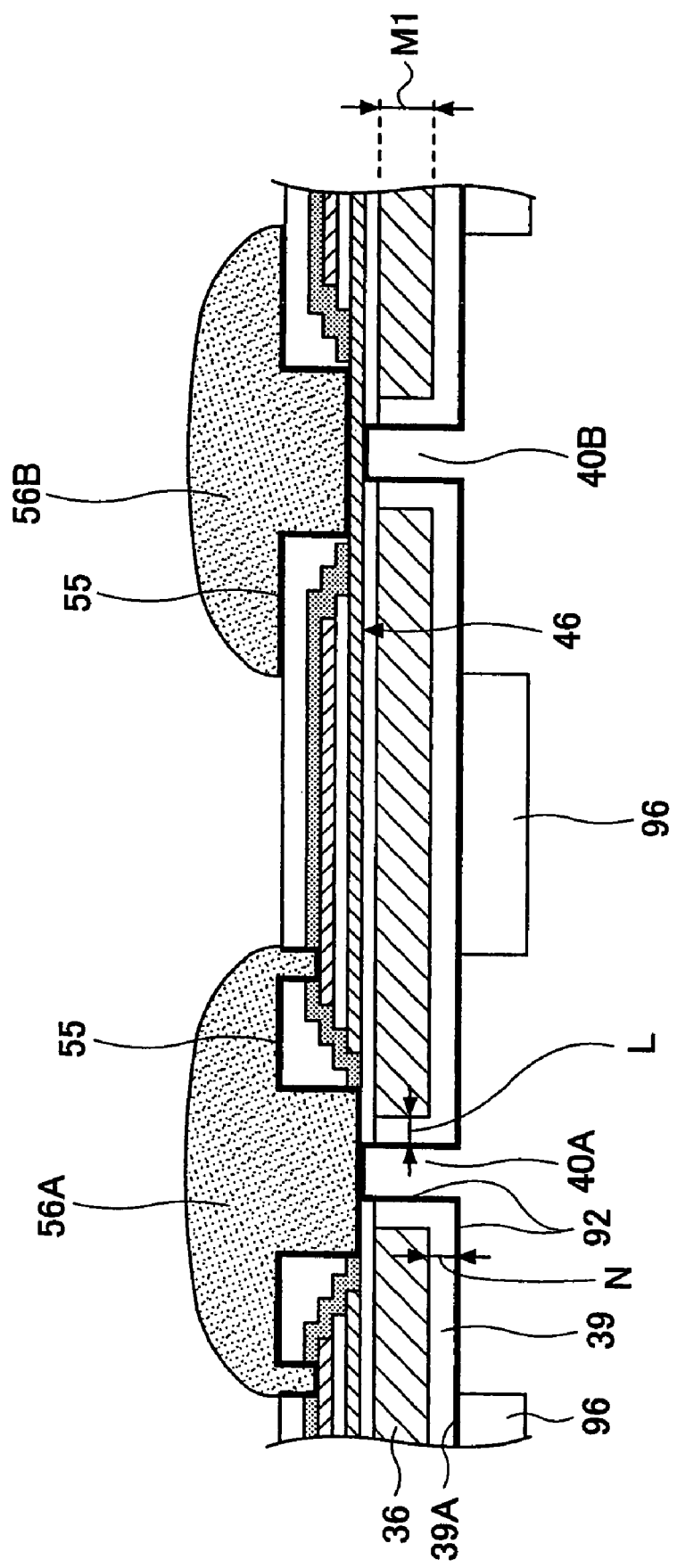

After forming the through holes 40A and 40B, in the subsequent process of FIG. 7A, the metal film 92 is formed on the through holes 40A and 40B and the surface 39A of the insulating material 39. Next, a resist layer 96 for exposing the area of formation of the pads 93 and the external connection terminal 44 is formed on the metal film 92. The metal film 92 is formed using, for example, sputtering, electroless plating, vapor deposition, or CVD.

Figure 7B:
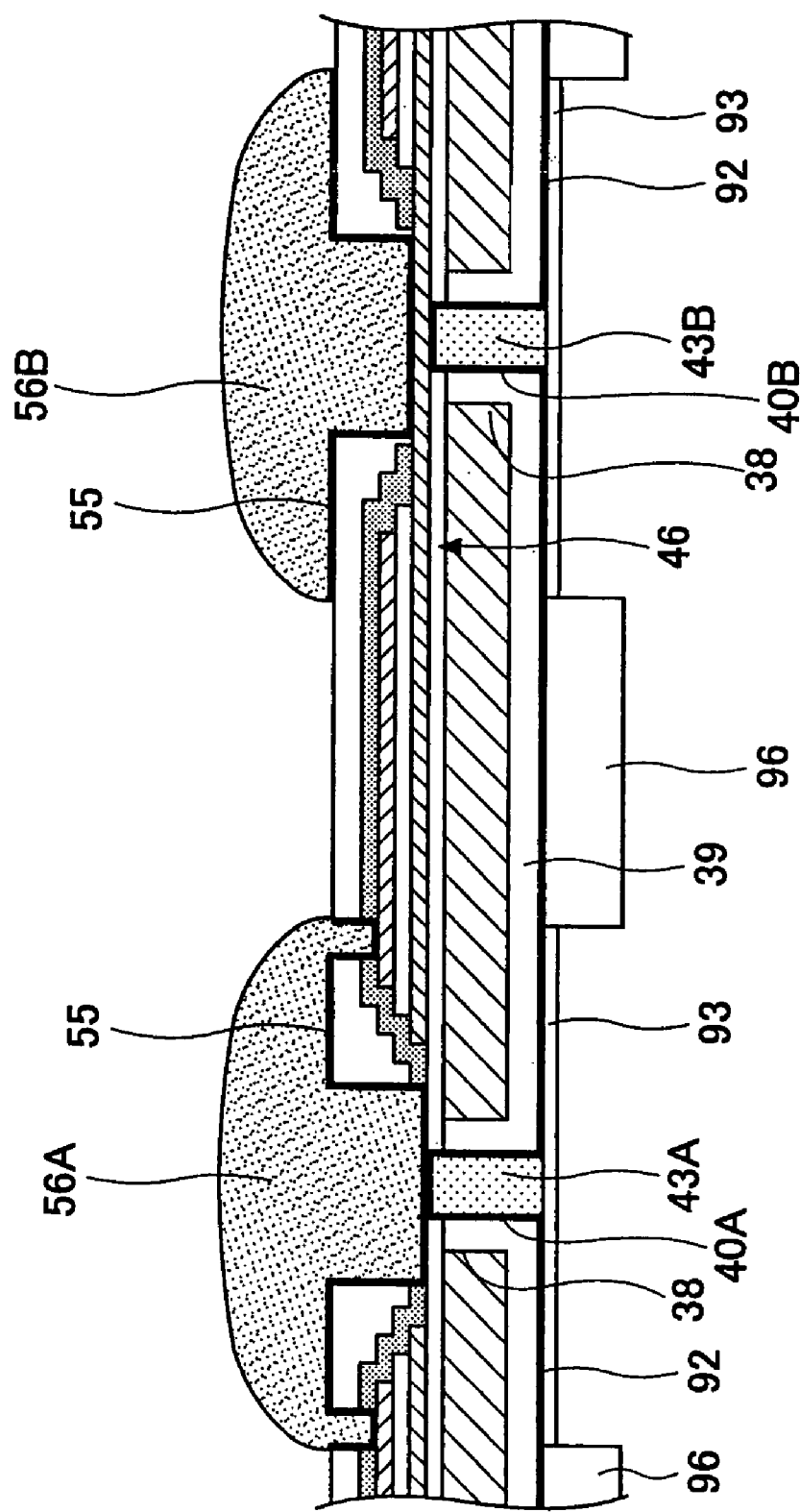

Next, in the process of FIG. 7B, the through vias 43A and 43B are formed in the through holes 40A and 40B. Specifically, the through vias 43A and 43B are formed by causing a copper plating film to be deposited on the through holes 40A and 40B by electroplating. Next, the pads 93 are formed on part of the metal film 92 and the through vias 43A and 43B exposed by the resist layer 96. Specifically, a Ni film to serve as the pads 93 is formed by electroplating.

Next, in the process of FIG. 7C, a conductive material 98 is formed on the pads 93. Specifically, the conductive material 98 of Sn—Ag solder is formed on the pads 93. The conductive material 98 is later reflowed so as to serve as the external connection terminals 44.

Figure 7D:
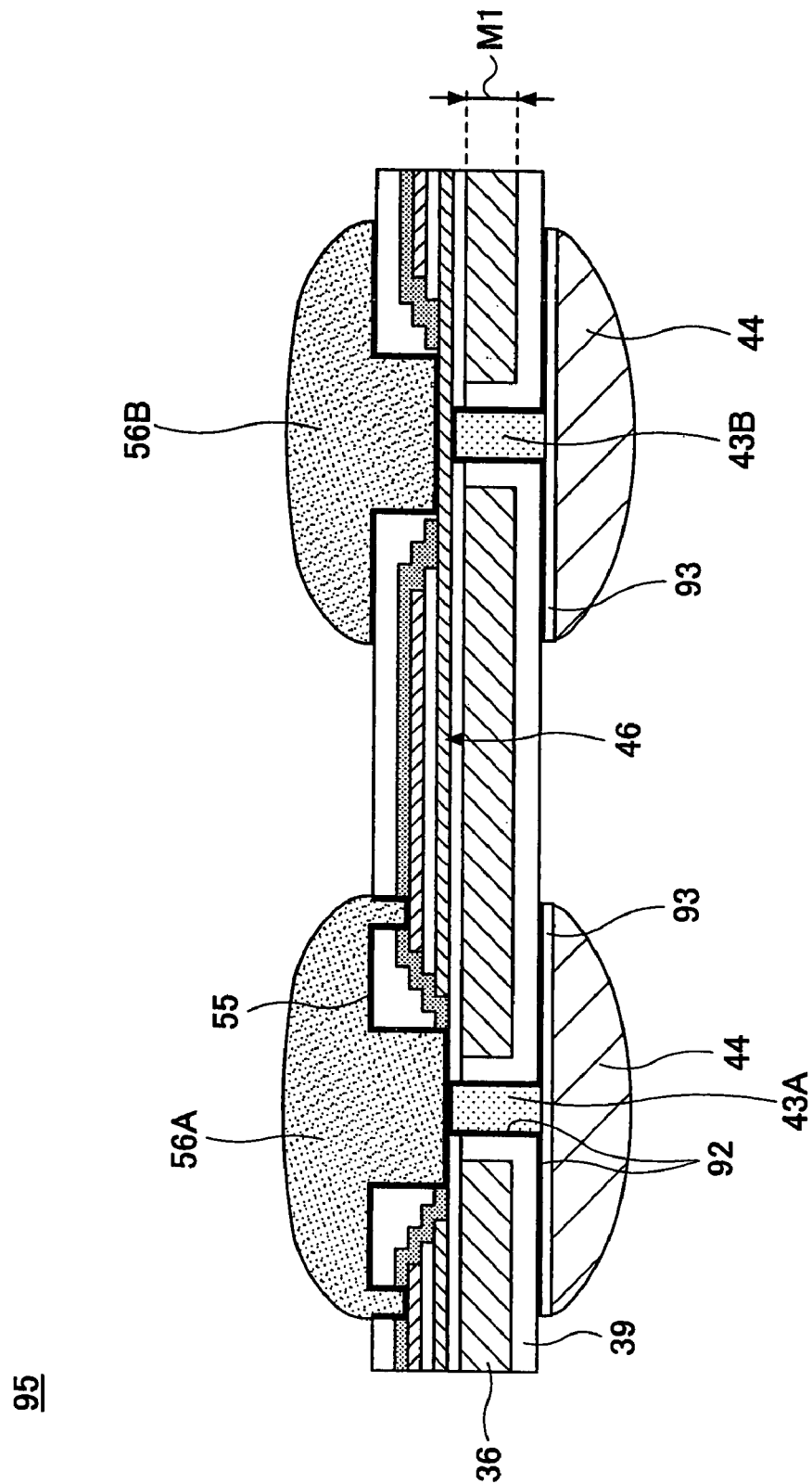

Next, in the process of FIG. 7D, an unnecessary part of the metal film 92 not covered with the pads 93 is removed. Next, the conductive material 98 is reflowed by heating, so that the external connection terminals 44 are formed. Thereafter, the Si substrate 36 is cut by dicing, so that the interposer 95 is formed. By connecting the semiconductor chip 20 to this interposer 95, the semiconductor device 90 is manufactured.

The semiconductor device 90 according to the second variation can produce the same effects as the semiconductor device 11 of the first embodiment. The evaluation of the electric characteristics and the reliability of an interposer according to the second variation made by the above-described manufacturing process of FIGS. 3A through 3K and 7A through 7D showed the same good results as those of the interposer 30 according to the first embodiment. The interposer according to the second variation was made using the conditions specified in each manufacturing process.

Second Embodiment

Figure 8:
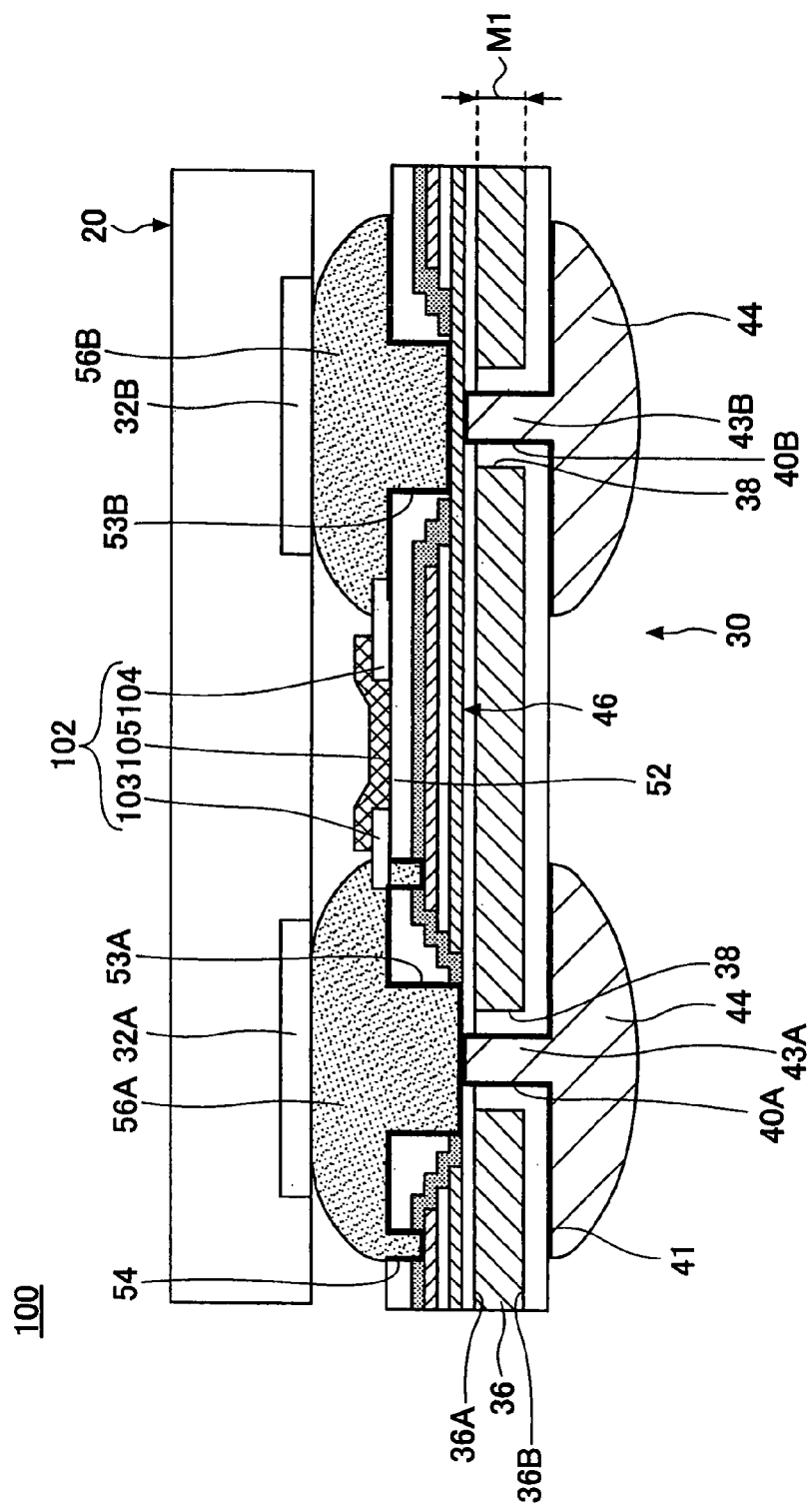
FIG. 8 is a cross-sectional view of a semiconductor device according to a second embodiment of the present invention.

FIG. 8 is a cross-sectional view of a semiconductor device 100 according to a second embodiment of the present invention. In FIG. 8, the same elements as those of the semiconductor device 11 of the first embodiment are referred to by the same numerals, and a description thereof is omitted.

Referring to FIG. 8, the semiconductor device 100 according to this embodiment is equal in configuration to the semiconductor device 11 of the first embodiment except that a resistive element 102 that is a passive element is provided.

The resistive element 102 includes a pair of electrodes 103 and 104 and a resistor 105, and is formed on the interposer 30. The electrode 103 is formed on the insulating film 52, and is electrically connected to the internal connection terminal 56A. As a result, the electrode 103 is electrically connected to the thin film capacitor 46 and the corresponding external connection terminal 44 through the internal connection terminal 56A.

The electrode 104 is formed on the insulating film 52, and is electrically connected to the internal connection terminal 56B. As a result, the electrode 104 is electrically connected to the thin film capacitor 46 and the corresponding external connection terminal 44 through the internal connection terminal 56B.

The resistor 105 is formed so as to connect the electrodes 103 and 104. The resistor 105 applies resistance to current passing between the electrodes 103 and 104. Further, an inductor element formed of a conductive material may be added between the internal connection terminals 56A and 56B as another passive element. For example, an inductor element having a meandering shape may be employed.

Thus, providing the semiconductor device 100 having the thin film capacitor 46 with passive elements including the resistive element 102 and an inductor element makes it possible to optimize the impedance of the semiconductor device 100 and cause the semiconductor device 100 to operate at high frequencies.

Third Embodiment

Figure 9:
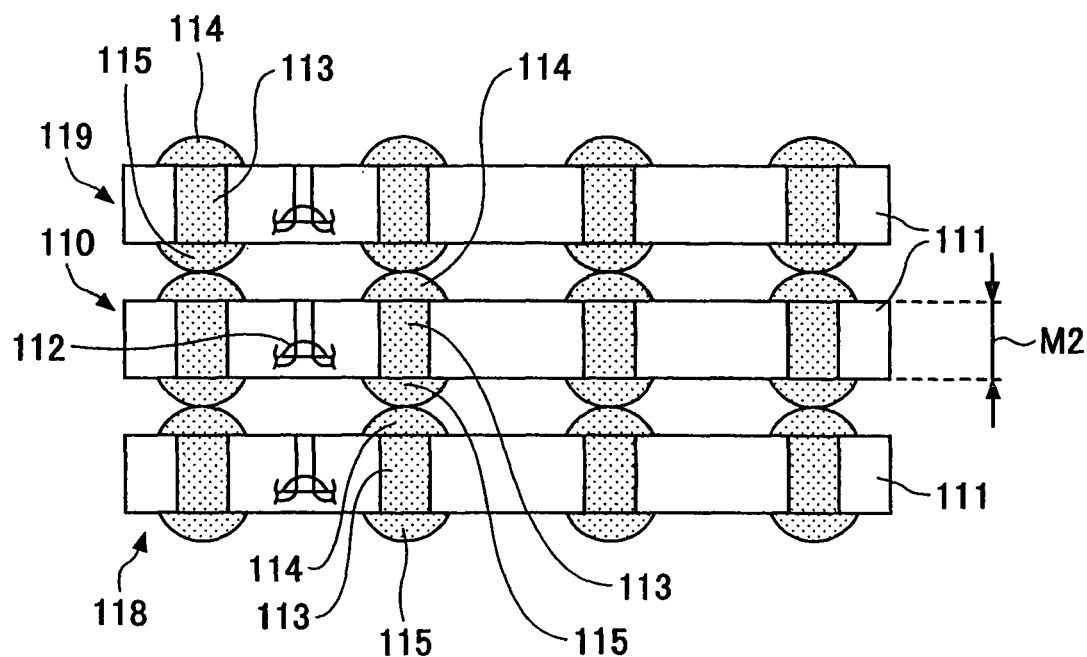
FIG. 9 is a cross-sectional view of a semiconductor device according to a third embodiment of the present invention.

FIG. 9 is a cross-sectional view of a semiconductor device 110 according to a third embodiment of the present invention. Referring to FIG. 9, the semiconductor device 110 includes a semiconductor substrate 111 on which a semiconductor circuit 112, which is an internal circuit, is formed; through vias 113 passing through the semiconductor substrate 111; and external connection terminals 114 and 115 formed at corresponding ends of each through via 113. The semiconductor circuit 112 may include an active element.

The semiconductor substrate 111 is a thinned plate. The thickness M2 of the semiconductor substrate 111 is the same value as the thickness M1 of the Si substrate 36 described in the first embodiment.

The semiconductor circuit 112 is electrically connected to the through vias 113. The through vias 113 are formed by the same method as the through vias 43A and 43B described in the first embodiment (FIGS. 3H through 3K). That is, the through vias 113 are formed after the semiconductor substrate 111 is thinned down. As a result, as in the semiconductor device 11 of the first embodiment, through holes for forming the through vias 113 can be formed with ease. The same material as that of the through vias 43A and 43B described in the first embodiment may be employed as the material of the through vias 113. Further, the through holes in which the through vias 113 are formed may be formed to be, for example, 70 μm in diameter.

The external connection terminals 114 are formed at the upper ends of the corresponding through vias 113. The external connection terminals 115 are formed at the lower ends of the corresponding through vias 113. The external connection terminals 114 are electrically connected to the corresponding external connection terminals 115 through the through vias 113. The external connection terminals 114 and 115 are provided for connection to other semiconductor devices 118 and 119. Like the semiconductor device 110, each of the semiconductor devices 118 and 119 has a thinned semiconductor substrate, the through vias 113, and the external connection terminals 114 and 115.

According to the semiconductor device 110 of this embodiment, the through vias 113 are formed in the thinned semiconductor substrate 111. Accordingly, it is easy to form the through vias 113 in the semiconductor substrate 111. Further, the through vias 113 passing through the semiconductor substrate 111 and the external connection terminals 114 and 115 formed at corresponding ends of the through vias 113 are provided. This makes it possible to connect the other semiconductor devices 118 and 119 in layers, so that it is possible to increase the packaging density of the semiconductor device 110.

Fourth Embodiment

Figure 10:
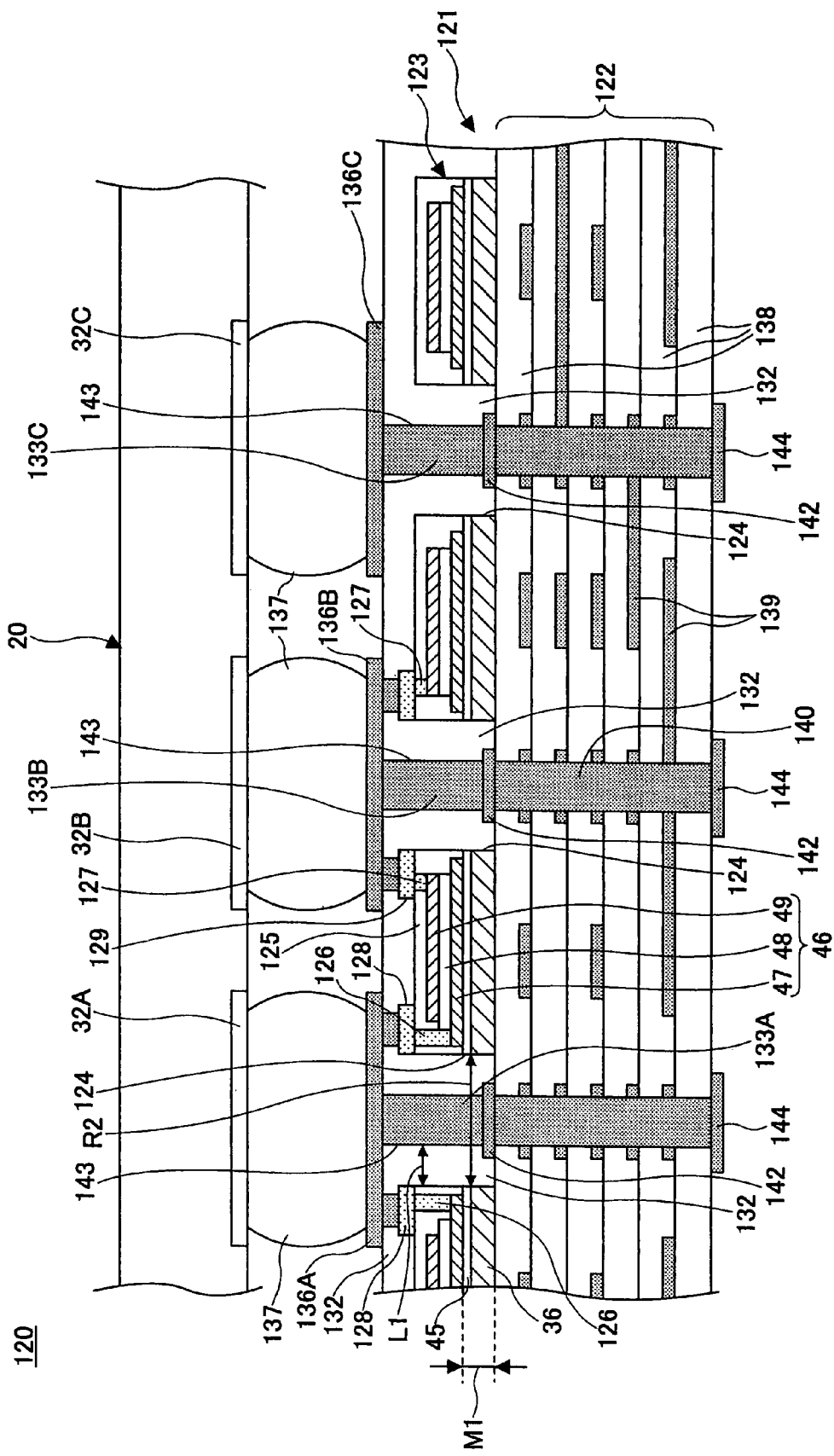
FIG. 10 is a cross-sectional view of a semiconductor device according to a fourth embodiment of the present invention.

FIG. 10 is a cross-sectional view of a semiconductor device 120 according to a fourth embodiment of the present invention. In FIG. 10, the same elements as those of the semiconductor device 11 of the first embodiment are referred to by the same numerals, and a description thereof is omitted.

Referring to FIG. 10, the semiconductor device 120 according to this embodiment includes the semiconductor chip 20 and a circuit board 121 on which the semiconductor chip 20 is mounted.

The semiconductor chip 20 includes the connection pads 32 A and 32B and at least one connection pad 32C. The connection pad 32A, which is a power supply connection pad, is electrically connected to a corresponding internal connection terminal 136A of the circuit board 121 through a corresponding one of solder balls 137. The connection pad 32B, which is a ground connection pad, is electrically connected to a corresponding internal connection terminal 136B of the circuit board 121 through a corresponding one of the solder balls 137. The connection pad 32C, which is an electrode pad for a signal (a signal electrode pad), is electrically connected to a corresponding internal connection terminal 136C of the circuit board 121 through a corresponding one of the solder balls 137. A conductive material such as Sn—Ag solder may be employed as the material of the solder balls 137.

The circuit board 121 includes a multilayer interconnection structure 122, a capacitor structure 123, an insulating film 132, through vias 133A through 133C, and the internal connection terminals 136A through 136C. Substrates such as a printed wiring board and a ceramic circuit board may be employed as the circuit board 121.

The multilayer interconnection structure 122 includes multiple stacked insulating layers 138, multiple interconnection lines 139, through vias 140, pads 142, and external connection terminals 144.

The through vias 140 are provided so as to pass through the stacked insulating layers 138. Each through via 140 has its one end connected to a corresponding one of the pads 142 and the other end connected to a corresponding one of the external connection terminals 144. The through vias 140 are electrically connected to the interconnection lines 139. Conductive materials such as Cu and Ni may be employed as the material of the interconnection lines 139 and the through vias 140.

The pads 142 are provided at the ends of the corresponding through vias 140 positioned on the side to which the capacitor structure 123 is connected. Each pad 142 is electrically connected to a corresponding one of the through vias 133A through 133C. A conductive material may be employed as the material of the pads 142. Specifically, for example, Ni may be employed.

The external connection terminals 144 are provided at the ends of the through vias 140 on the side where the pads 142 are not provided. The external connection terminals 144 are connected to, for example, another circuit substrate not shown in the drawing.

The capacitor structure 123 is adhered to the multilayer interconnection structure 122 on the side where the pads 142 are provided. The capacitor structure 123 is disposed below the semiconductor chip 20. The capacitor structure 123 is covered with the insulating film 132.

The capacitor structure 123 includes the Si substrate 36, the insulating film 45, the thin film capacitors 46, a protection film 125, vertical interconnection lines 126 and 127, and pad electrodes 128 and 129.

The Si substrate 36, which is a thinned plate, has through holes 124 of a diameter R2 formed therein. The through holes 124 correspond to the formation positions of the through vias 133A through 133C. The through holes 124 are formed so that the diameter R2 thereof is greater than the diameter of the through vias 133A through 133C. The thickness M1 of the thin-plate Si substrate 36 is less than the diameter R2 of the through holes 124.

Thus, forming the through holes 124 having the diameter R2 greater than that of the through vias 133A through 133C in the thin Si substrate 36 makes it possible to form good through holes 124 with reduced aspect ratio.

The diameter R2 of the through holes 124 may be, for example, 100 µm. A pitch with which the through holes 124 are disposed at the time of their formation may be, for example, 150 µm to 250 µm. The diameter R2 and the disposition pitch of the through holes 124 are not limited to the above-described numerical values.

Further, preferably, the thickness M1 of the Si substrate 36 is within the range of 30 µm to 100 µm. The Si substrate 36 has insufficient strength with the thickness M1 being less than 30 µm. If the thickness M1 is greater than 100 µm, the aspect ratio (M1/R2) of the through holes 124 becomes high, so that it is difficult to form the through holes 124.

The thin film capacitors 46 are formed on the Si substrate 36 through the insulating film 45. Openings (not graphically illustrated) are formed at positions corresponding to the through holes 124. Each thin film capacitor 46 includes the dielectric film 48, the lower electrode 47, and the upper electrode 49. The dielectric film 48 is sandwiched between the lower electrode 47 and the upper electrode 49. The lower electrode 47, the dielectric film 48, and the upper electrode 49 are stacked on the insulating film 45 in the order described.

Each of the lower electrode 47, the dielectric film 48, and the upper electrode 49 may employ those described above in the first embodiment as its material. Preferably, the dielectric film 48 is formed of a metal oxide material having a perovskite crystal structure having a high dielectric constant. In the case of using a metal oxide material having a perovskite crystal structure as the dielectric film 48, it is preferable to employ Pt as the material of the lower electrode 47. Employment of Pt enables the dielectric film 48 to grow epitaxially, so that the dielectric constant of the dielectric film 48 increases.

The lower electrode 47 of each thin film capacitor 46 is electrically connected to the corresponding internal connection terminal 136A through the corresponding vertical interconnection line 126 and pad electrode 128. The upper electrode 49 of each thin film capacitor 46 is electrically connected to the corresponding internal connection terminal 136B through the corresponding vertical interconnection line 127 and pad electrode 129. Each thin film capacitor 46 is electrically connected to the power supply electrode pad 32A and the ground electrode pad 32B of the semiconductor chip 20 through the corresponding internal connection terminals 136A and 136B so as to function as a decoupling capacitor.

In FIG. 10, the second thin film capacitor 46 from the right is also electrically connected to an internal connection terminal 136A on the front or rear side (not graphically illustrated), and the rightmost thin film capacitor 46 is also electrically connected to internal connection terminals 136A and 136B on the front and rear (or rear and front) sides, respectively (not graphically illustrated). According to this embodiment, the thin film capacitors 46 may be physically separated from or connected to one another.

The protection film 125 is provided on the Si substrate 36. The protection film 125 is formed so as to cover the thin film capacitors 46 and fill in the through holes 124. The same material as that of the insulating film 39 or the protection film 51 described in the first embodiment may be used for the protection film 125.

The vertical interconnection lines 126 are provided in the protection film 125 under the connection pad 128. The vertical interconnection lines 126 are electrically connected to the corresponding lower electrodes 47 and the connection pad 128. The vertical interconnection lines 127 are provided in the protection film 125 under the connection pad 129. The vertical interconnection lines 127 are electrically connected to the corresponding upper electrodes 49 and the connection pad 129.

The pad electrode 128 is provided on the vertical interconnection lines 126 formed in the protection film 125 so as to be electrically connected to the vertical interconnection lines 126 and the internal connection terminal 136A. The pad electrode 129 is provided on the vertical interconnection lines 127 formed in the protection film 125 so as to be electrically connected to the vertical interconnection lines 127 and the internal connection terminal 136B.

The insulating film 132 is provided so as to fill in the through holes 124 and cover the capacitor structure 123. The insulating film 132 includes through holes 143 exposing the corresponding pads 142. The thickness L1 of the insulating film 132 between the Si substrate 36 and each of the through vias 133A through 133C may be, for example, 0.05 µm to 50 µm. The same material as that of the insulating material 39 described in the first embodiment may be used for the insulating film 132.

The through via 133A is formed in the through hole 143 corresponding to the position of formation of the internal connection terminal 136A, and is electrically connected to the internal connection terminal 136A and the corresponding through via 140. The through via 133B is formed in the through hole 143 corresponding to the position of formation of the internal connection terminal 136B, and is electrically connected to the internal connection terminal 136B and the corresponding through via 140. The through via 133C is formed in the through hole 143 corresponding to the position of formation of the internal connection terminal 136C, and is electrically connected to the internal connection terminal 136C and the corresponding through via 140.

The internal connection terminal 136A is provided on the insulating film 132 at a position corresponding to the position of formation of the through via 133A formed in the insulating film 132, and is electrically connected to the pad electrode 128 and the through via 133A. The internal connection terminal 136A is electrically connected through the corresponding solder ball 137 to the power supply connection pad 32A of the semiconductor chip 20. The internal connection terminal 136B is provided on the insulating film 132 at a position corresponding to the position of formation of the through via 133B formed in the insulating film 132, and is electrically connected to the pad electrode 129 and the through via 133B. The internal connection terminal 136B is electrically connected through the corresponding solder ball 137 to the ground connection pad 32B of the semiconductor chip 20. The internal connection terminal 136C is provided on the insulating film 132 at a position corresponding to the position of formation of the through via 133C formed in the insulating film 132, and is electrically connected to the through via 133C. The internal connection terminal 136C is electrically connected through the corresponding solder ball 137 to the signal connection pad 32C of the semiconductor chip 20.

According to the semiconductor device 120 of this embodiment, the thickness M1 of the Si substrate 36 may be less than or equal to the diameter R2 of the through holes 124. Accordingly, it is possible to provide the through holes 124 of good accuracy, and to realize the semiconductor device 120 that can support a further increase in density.

Further, since the thin film capacitors 46 are provided close to the semiconductor chip 20, the semiconductor device 120, in which equivalent series inductance is reduced and the semiconductor chip 20 can operate at high frequencies, can be realized.

According to this embodiment, a description is given of the case where the thin film capacitors 46 are used as decoupling capacitors. However, the thin film capacitors 46 may also be used as capacitors other than decoupling capacitors.

FIGS. 11A through 11J are diagrams showing a process of manufacturing a semiconductor device according to the fourth embodiment. A description is given below, with reference to the drawings, of a method of manufacturing the semiconductor device 120 according to this embodiment.

First, in the process of FIG. 11A, the insulating film 45 is formed by sputtering on the Si substrate 36 with a thermal oxidation film formed on the surface thereof. Further, the lower electrode film 47A, the dielectric film 48A, and the upper electrode film 49A are successively formed as a thin film capacitor multilayer body. The insulating film 45 serves as an adhesion layer.

Specifically, for example, using a multi-target DC-RF magnetron sputtering device, an amorphous alumina film (50 nm in thickness) is formed as the insulating film 45 on the Si substrate 36 on which a $SiO_2$ film is formed with the substrate temperature being 200° C. Next, with the substrate temperature being 200° C., a Pt film (100 nm in thickness) is formed as the lower electrode film 47A. Next, with the substrate temperature being 600° C., a BST film (100 nm in thickness) is formed as the dielectric film 48A. Next, with the substrate temperature being 25° C., an IrOx film and a Au film (100 nm in thickness) are successively formed as the upper electrode film 49A. These multilayer films 45, 47A, 48A, and 49A may be formed by a method other than sputtering, such as vapor deposition or CVD.

Next, in the process of FIG. 11B, the stacked upper electrode film 49A, dielectric film 48A, and lower electrode film 47A are patterned together by ion milling, so that the thin film capacitors 46 each of the lower electrode 47, the dielectric film 48, and the upper electrode 49 are formed. Next, the thin film capacitors 46 are subjected to heat treatment in an oxygen atmosphere so as to remove thermal distortion and supply oxygen atoms to oxygen deficient parts in the dielectric film 48 and the IrOn film. The lower electrode 47, the dielectric film 48, and the upper electrode 49 of each thin film capacitor 46 are formed by patterning the lower electrode film 47A, the dielectric film 48A, and the upper electrode film 49A, respectively.

Thus, forming the thin film capacitors 46 before forming the through holes 124 in the Si substrate 36 makes it possible to form the dielectric film 48 at temperatures as high as 300° C. to 1000° C., so that the thin film capacitors 46 having a high dielectric constant, large capacitance, and high reliability can be formed.

Further, each thin film capacitor 46 is formed by stacking the lower electrode film 47A, the dielectric film 48A, and the upper electrode film 49A successively on the even planar insulating film 45, and thereafter, patterning the lower electrode film 47A, the dielectric film 48A, and the upper electrode film 49A. Accordingly, it is possible to increase the yield of the thin film capacitors 46.

Further, dust and foreign materials generated in forming opening parts (holes) 145 (FIG. 11E), the through holes 124 and 143, and the through vias 133A through 133C are prevented from adhering to part of the insulating film 45 corresponding to the area of formation of the thin film capacitors 46. Accordingly, it is possible to increase the yield of the thin film capacitors 46.

Next, in the process of FIG. 11C, the protection film 125 is formed so as to cover the thin film capacitors 46 and the insulating film 45. At this point, opening parts (holes) 125A exposing the corresponding lower electrodes 47, opening parts (holes) 125B exposing the corresponding upper electrodes 49, and opening parts (holes) 125C exposing the insulating film 45 are formed in the protection film 125. Specifically, for example, a photosensitive polyimide resin (2 µm in thickness) is applied as the protection film 125 by spin coating. The opening parts 125A through 125C are formed by exposing the photosensitive polyimide resin to light and developing the photosensitive polyimide resin. The insulating film 125 may also be formed by a method other than spin coating, such as spraying or dipping.

A $Si_3N_4$ film, a $SiO_2$ film, or an alumina film may be used as the protection film 125. In this case, for example, the protection film 125 is formed using an RF magnetron sputtering device, and then, the opening parts 125A through 125C are formed by ion milling. Then, the protection film 125 is subjected to post-annealing in an oxygen atmosphere. In this case, the protection film 125 may be formed by a method other than sputtering, such as vapor deposition or CVD.

Figure 1:
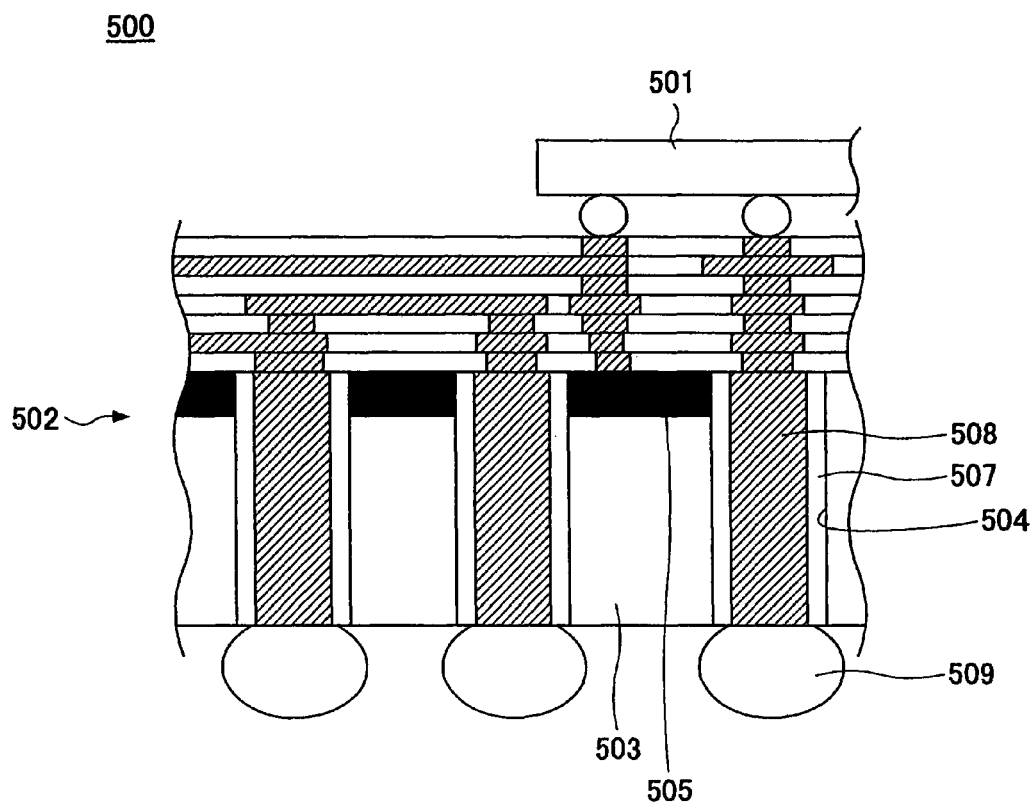
FIG. 1 is a cross-sectional view of a conventional semiconductor device.

Next, in the process of FIG. 1D, the vertical interconnection lines 126 in the corresponding opening parts 125A, the vertical interconnection lines 127 in the corresponding opening parts 125B, and the pad electrodes 128 and 129 are simultaneously formed. Specifically, for example, a Ti film and a Cu film are successively formed on the structure shown in FIG. 11C as a plating seed layer by sputtering. Thereafter, a resist layer is formed on the plating seed layer so as to have opening parts (holes) exposing an area in which the pad electrodes 128 and 129 are formed, and a plating film is deposited on the plating seed layer by electroplating. After the formation of the vertical interconnection lines 126 and 127 and the pad electrodes 128 and 129, the resist layer is removed. Next, an unnecessary part of the plating seed layer on which the plating film is not formed is removed. For example, a Cu plating film may be employed as the plating film. The plating seed layer may be formed by a method other than sputtering, such as vapor deposition or CVD.

Figure 11E:
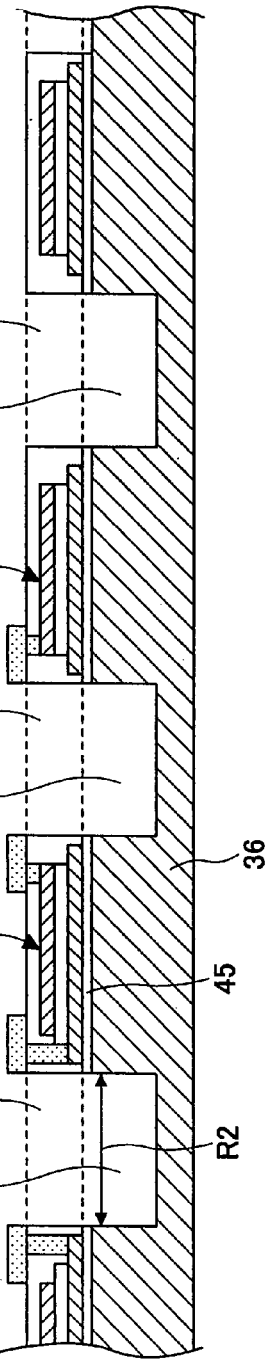

Next, in the process of FIG. 11E, part of the insulating film 45 exposed from the opening parts 125C and part of the Si substrate 36 corresponding to the opening parts 125C are etched from the first main surface side of the Si substrate 36 so that the opening parts 145 of the diameter R2 are formed in the Si substrate 36. The opening parts 145 have substantially the same depth (vertical dimension) as the through holes 124, and become the through holes 124 when the thickness of the Si substrate 36 is reduced. For example, wet etching and plasma etching may be employed as etching methods. A liquid mixture of hydrogen fluoride and nitric acid may be employed as etching liquid used for wet etching.

Figure 11F:
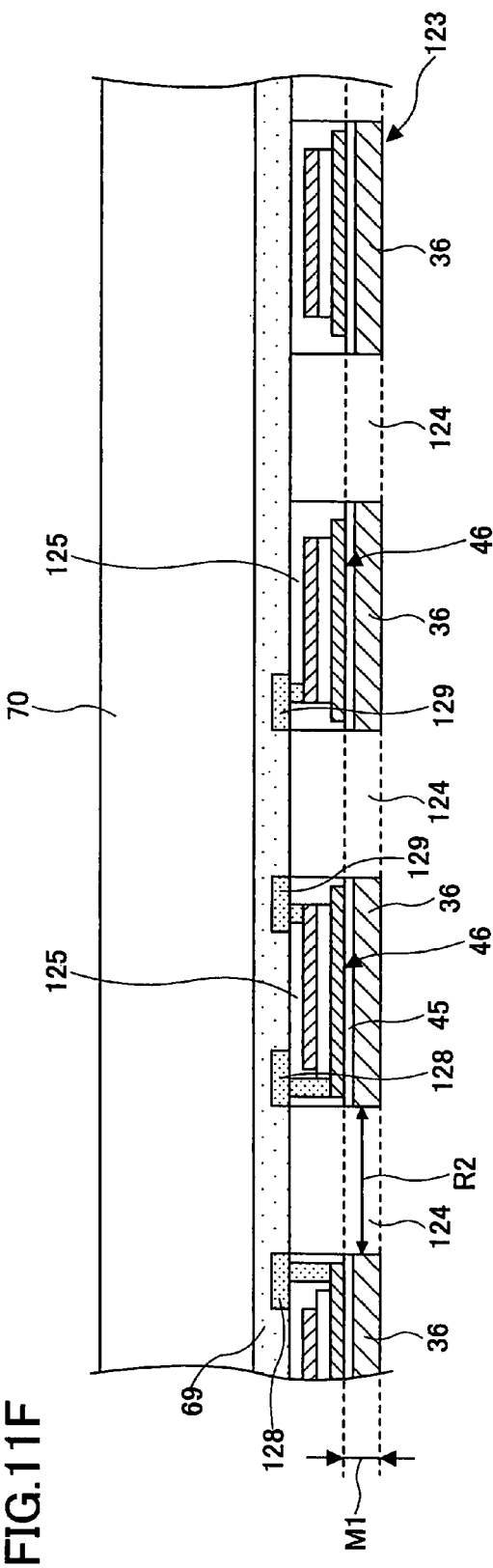

Next, in the process of FIG. 11F, the holding substrate 70 is adhered through the adhesive tape 69 to the structure illustrated in FIG. 11E on its first main surface side, and the Si substrate 36 is thinned from the second main surface side. As a result, the opening parts 145 are exposed on the second main surface of the Si substrate 36 so that the through holes 124 are formed. Thereby, the capacitor structure 123 having the thin film capacitors 46 on the Si substrate 36 is manufactured.

Specifically, for example, the Si substrate 36 is thinned down to 50 μm in thickness with a grinder. After thinning down the Si substrate 36, the adhesive tape 69 is removed. For example, a UV tape, whose adhesiveness is reduced by ultraviolet ray irradiation, may be employed as the adhesive tape 69. For example, grinding or etching may be employed to thin down the Si substrate 36. As grinding methods, polishing such as buffing and CMP and cutting are employable, for example. As etching methods, wet etching and plasma etching are employable, for example.

Thus, by forming the through holes 124 by thinning down the Si substrate 36 until the opening parts 145 are exposed after forming the opening parts 145 having substantially the same depth as the through holes 124 from the first main surface side of the Si substrate 36, the aspect ration (M1/R2) can be reduced. This makes it possible to form the through holes 124 in the Si substrate 36 with ease, thus making it possible to reduce the manufacturing costs of the semiconductor device 120.

Further, by forming the opening parts 145 by plasma etching or wet etching at a lower cost than ICP, it is possible to reduce the manufacturing costs of the semiconductor device 120.

Figure 11G:
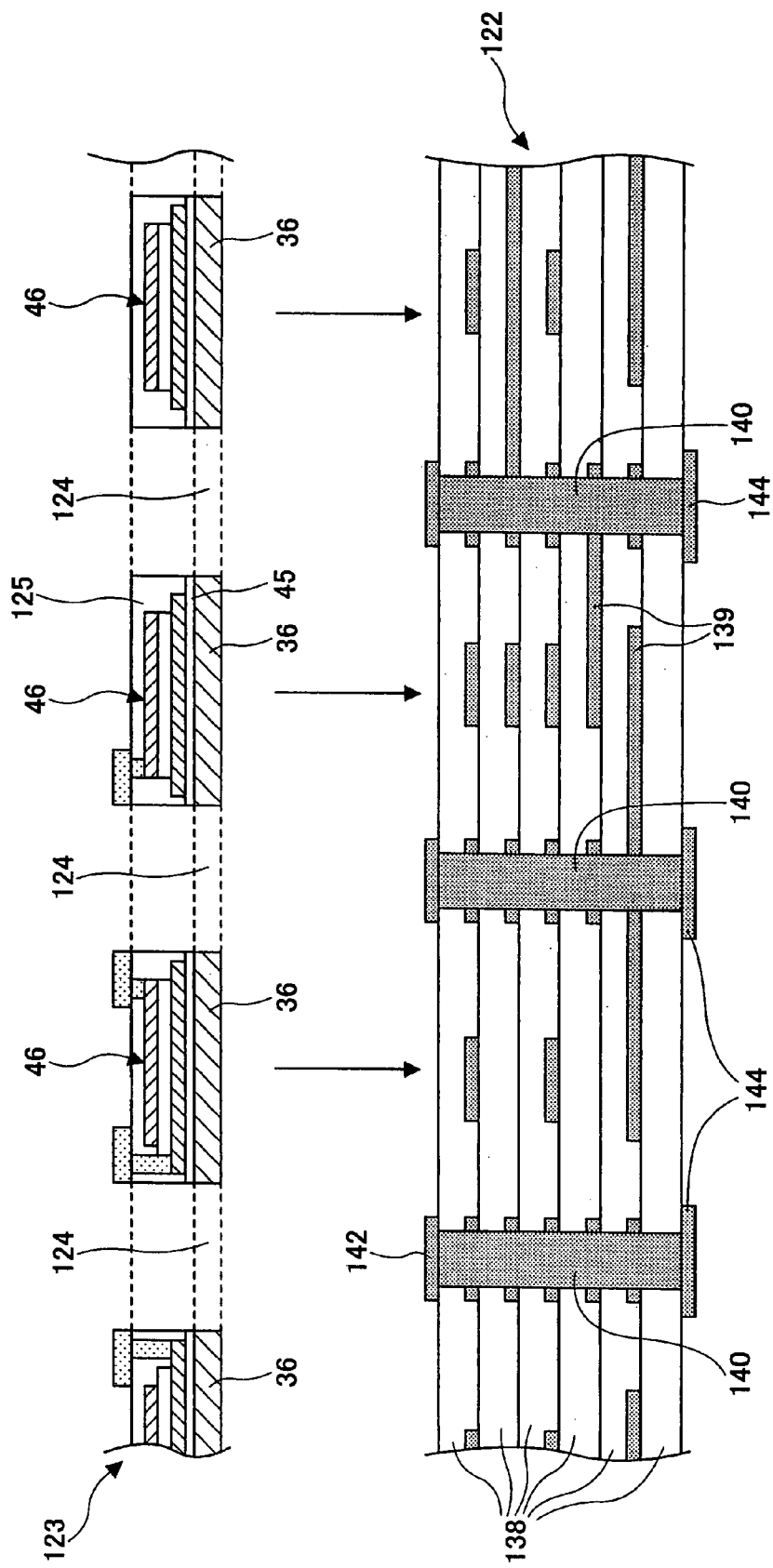

Next, in the process of FIG. 11G, the capacitor structure 123 is adhered to the multilayer interconnection structure 122 so that the through holes 124 expose the pads 142. The capacitor structure 123 is adhered to the multilayer interconnection structure 122 with, for example, an epoxy-based adhesive agent.

Figure 11H:
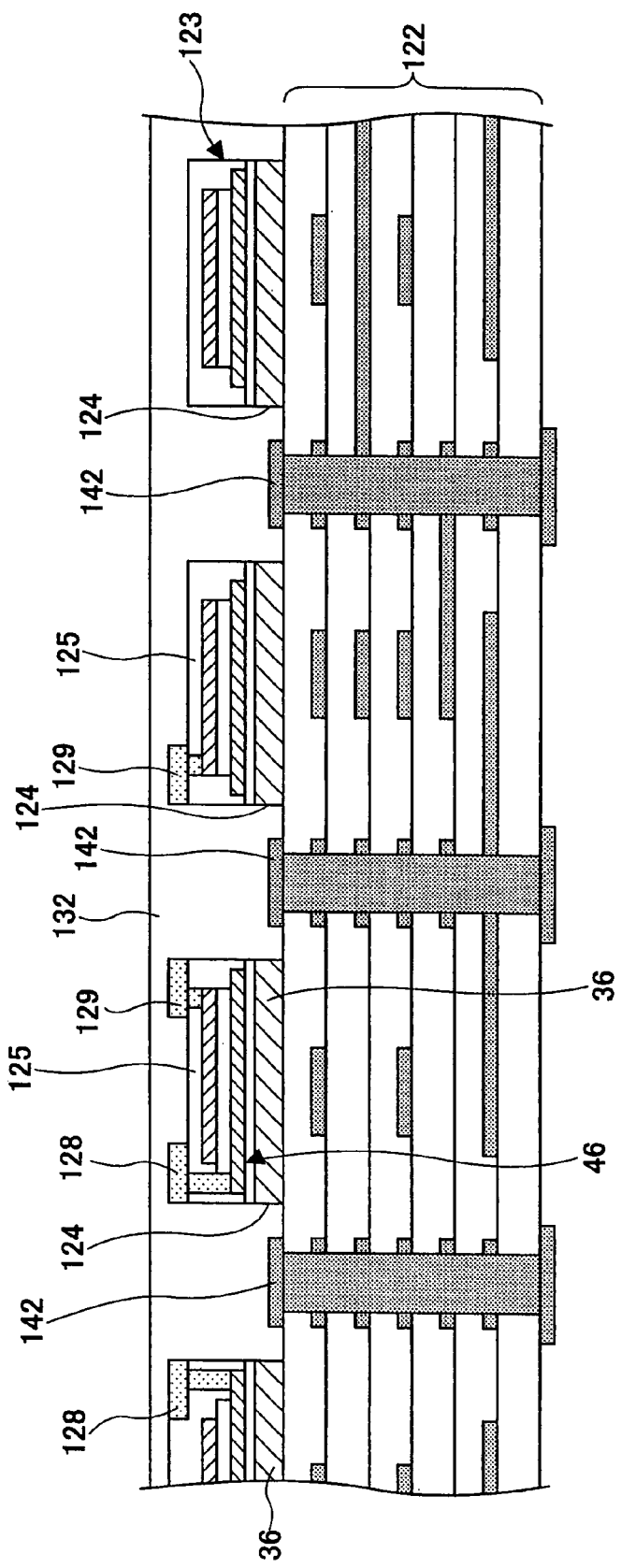

Next, in the process of FIG. 11H, the insulating film 132 is formed so as to cover the capacitor structure 123 and to fill in the through holes 124. Then, the insulating film 132 is hardened. Specifically, for example, an epoxy resin, which is a heat-resistant resin, is applied as the insulating film 132 by spin coating, and thereafter, the epoxy resin is thermoset at a temperature of 200° C. The insulating film 132 may also be applied by a method other than spin coating, such as spraying or dipping. Further, a film-like resin layer may also be used as the insulating film 132. The same material as that of the insulating material 39 described in the first embodiment may be employed as the material of the insulating film 132.

Figure 11I:
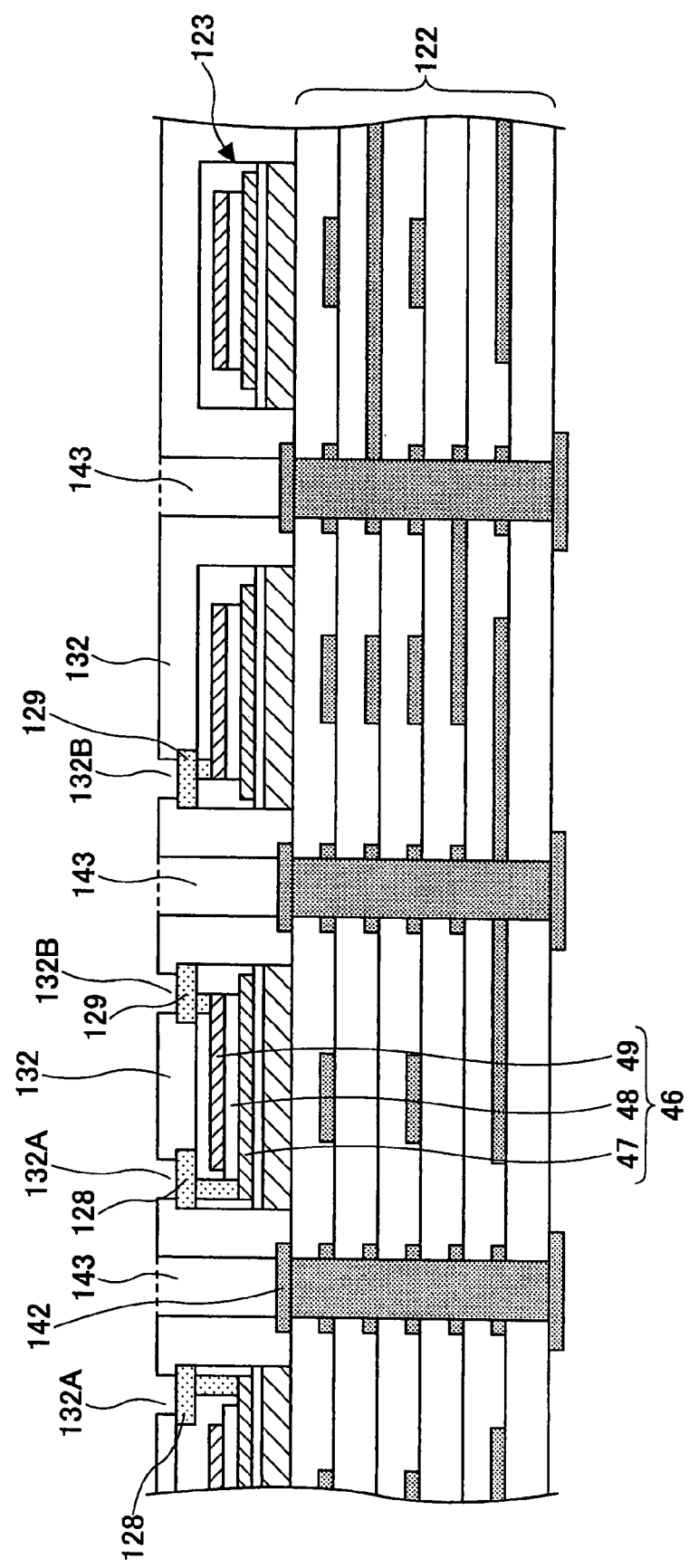

Next, in the process of FIG. 11I, an opening part (hole) 132A exposing the pad electrode 128, an opening part (hole) 132B exposing the pad electrode 129, and the through holes 143 exposing the pads 142 are formed in the insulating film 132. Specifically, the opening parts 132A and 132B and the through holes 143 are formed by ArF excimer laser processing using a heat-resistant resin or a low-k resin as the insulating film 132. The opening parts 132A and 132B and the through holes 143 may also be formed using a laser processing method other than ArF excimer laser processing, or plasma etching. In the case of using a photosensitive resin as the insulating film 132, the opening parts 132A and 132B and the through holes 143 may be formed by exposing and developing part of the insulating film 132 corresponding to the opening parts 132A and 132B and the through holes 143.

Thus, the manufacturing costs are reduced by filling the through holes 124 with an insulating material such as a low-k resin, a heat-resistant resin, or a photosensitive resin, and forming the through holes 143 for the through vias 133A through 133C by laser via processing.

Figure 11J:
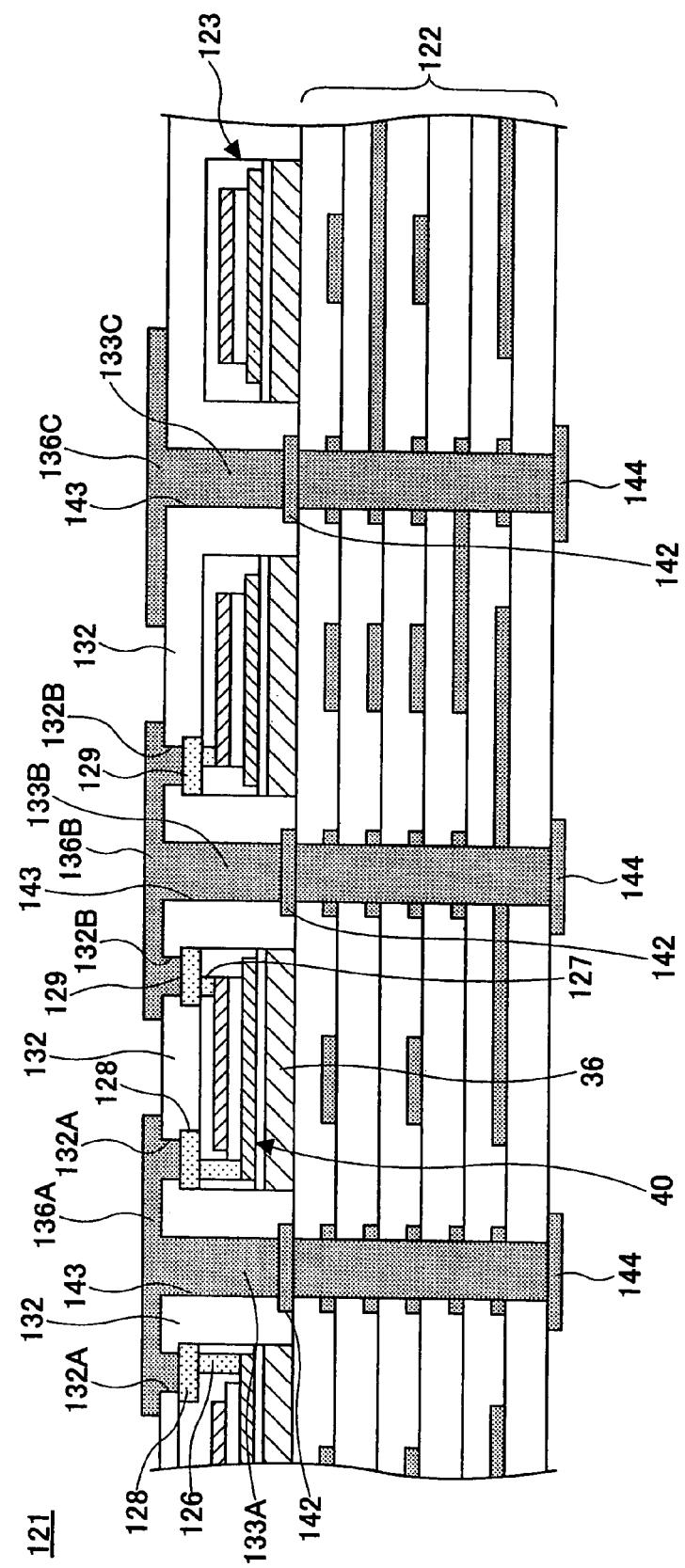

Next, in the process of FIG. 11J, by the same method as in the above-described process of FIG. 11D, the through vias 133A through 133C and the internal connection terminals 136A through 136C are simultaneously formed. As a result, the circuit board 121 having the capacitor structure 123 is manufactured.

Thus, by forming the through vias 133A through 133C and the internal connection terminals 136A through 136C simultaneously, it is possible to simplify the manufacturing process and reduce the manufacturing costs of the semiconductor device 120. Further, forming the through vias 133A through 133C after thinning down the Si substrate 36 reduces the depth (vertical dimension) of the through vias 133A through 133C. Therefore, it is possible to transmit a high-frequency signal at high speed between the semiconductor chip 20 connected to the internal connection terminals 136A through 136C and another circuit board (not graphically illustrated) connected to the external connection terminals 144.

Further, by reducing the aspect ratio (M1/R2) of the through holes 124, it is possible to reduce time for formation of the through vias 133A through 133C and thus improve productivity.

Thereafter, the internal connection terminals 136A through 136C of the circuit board 121 are connected to the connection pads 32A through 32C, respectively, of the semiconductor chip 20. Thereby, the semiconductor device 120 is manufactured.

According to the semiconductor device manufacturing method of this embodiment, the opening parts 145 having substantially the same depth as the through holes 124 are formed in the Si substrate 36 on the side on which the thin film capacitors 46 are formed, and thereafter, the through holes 124 are formed by reducing the thickness of the Si substrate 36 until the opening parts 145 (FIG. 1E) are exposed. Accordingly, it is possible to reduce the aspect ratio of the through holes 124. This makes it possible to form the through holes 124 in the Si substrate 36 with ease, thus making it possible to reduce the manufacturing costs of the semiconductor device 120.

Further, since the thin film capacitors 46 are formed before forming opening parts, it is possible to form the dielectric film 48 of each thin film capacitor 46 at high temperature, thus making it possible to form the thin film capacitors 46 having a high dielectric constant, large capacitance, and high reliability.

Further, dust and foreign materials generated in forming the through holes 124 are prevented from adhering to the thin film capacitors 46. Accordingly, it is possible to increase the yield of the thin film capacitors 46.

FIGS. 12A and 12B are diagrams showing another method of manufacturing a semiconductor device according to the fourth embodiment.

In the above-described semiconductor device manufacturing method according to this embodiment, the opening parts 145 are formed in the Si substrate 36 before the Si substrate 36 is thinned down, and thereafter, the Si substrate 36 is thinned down until the opening parts 145 are exposed, thereby forming the through holes 124. Alternatively, as shown in FIG. 12A, the holding substrate 70 may be adhered through the adhesive tape 69 to the Si substrate 36 of the structure shown in FIG. 11D on the upper surface 36A side of the Si substrate 36, and the Si substrate 36 may be thinned down from its lower surface 36B side (a substrate thinning process). Thereafter, as shown in FIG. 12B, the through holes 124 may be formed in the Si substrate 36 (a through hole formation process). The through holes 124 may be formed from either the upper surface 36A side or the lower surface 36B side of the Si substrate 36.

The electric characteristics and the reliability of a circuit board including a capacitor structure made by the above-described manufacturing process of FIGS. 11A through 11J were evaluated. The circuit board was made using the conditions specified in the manufacturing process of FIGS. 11A through 11J. With respect to the electric characteristics, the results were a capacitance density of 4 µF/cm², an ESR (equivalent series resistance) of 0.01Ω, an ESL (equivalent series inductance) of 10 pH, and a withstand voltage of 20 V or over. These results confirmed that it is possible to form a circuit board having a capacitor structure with large capacitance and reduced ESL.

A high temperature and humidity load test was conducted as a reliability evaluation under the conditions of a temperature of 121° C., a relative humidity of 85%, an applied voltage of 3 V, and a test time of 48 hours. The insulation resistance after the test was higher than or equal to 10 MΩ, which confirmed that the circuit board having the capacitor structure also has sufficient reliability at high temperature and high humidity.

FIG. 13 is a cross-sectional view of a semiconductor device 150 according to a first variation of the fourth embodiment. In FIG. 13, the same elements as those of the above-described semiconductor device 120 of the fourth embodiment are referred to by the same numerals, and a description thereof is omitted.

Referring to FIG. 13, the semiconductor device 150 includes the semiconductor chip 20 and a circuit board 151. The circuit board 151 has the same configuration as the circuit board 121 except that the capacitor structure 123, the insulating film 132, an insulating film 152, the through vias 133A through 133C, the internal connection terminals 136A through 136C, vias 153, and pads 154 are further provided on the circuit board 121. That is, the circuit board 151 includes the two stacked capacitor structures 123.

In the following description, for convenience of description, of the two capacitor structures 123 provided in the circuit board 151, one disposed on the multilayer interconnection structure 122 is referred to as a capacitor structure 123-1, and the other one disposed on the capacitor structure 123-1 is referred to as a capacitor structure 123-2. Further, for the same reason, the insulating film 132 provided on the capacitor structure 123-1, the through vias 133A through 133C provided therein, and the internal connection terminals 136A through 136C provided on the capacitor structure 123-1 are referred to as an insulating film 132-1, through vias 133A-1 through 133C-1, and internal connection terminals 136A-1 through 136C-1, respectively, and the insulating film 132 provided on the capacitor structure 123-2, the through vias 133A through 133C provided therein, and the internal connection terminals 136A through 136C provided on the capacitor structure 123-2 are referred to as an insulating film 132-2, through vias 133A-2 through 133C-2, and internal connection terminals 136A-2 through 136C-2, respectively (FIG. 13).

The insulating film 152 is provided so as to cover the upper surface of the structure (circuit board 121) shown in FIG. 10. For example, the same material as that of the insulating material 39 described in the first embodiment may be employed as the material of the insulating film 152.

The vias 153 are provided in the insulating film 152 disposed between the internal connection terminals 136A-1 through 136C-1 and the pads 154. Each via 153 has its one end connected to a corresponding one of the internal connection terminals 136A-1 through 136C-1, and the other end connected to a corresponding one of the pads 154. A conductive material may be employed as the material of the vias 153.

Specifically, for example, Cu and Ni may be employed. The vias 153 may be formed by, for example, plating, vapor deposition, CVD, or sputtering.

The pads 154 are provided on the insulating film 152 at positions corresponding to the positions of formation of the vias 153. The pads 154 are electrically connected to the vias 153 and the through vias 133A-2 through 133C-2.

The capacitor structure 123-2 is provided on the insulating film 152 having the pads 154 formed thereon. The capacitor structure 123-2 has the same configuration as the capacitor structure 123-1. The insulating film 132-2 is provided so as to cover the capacitor structure 123-2. The insulating film 132-2 includes opening parts that expose the vertical interconnection lines 126 and 127 and the pads 154. The through vias 133A-2 through 133C-2 are provided in the insulating film 132-2 on the pads 154. The through vias 133A-2 through 133C-2 are electrically connected to the corresponding pads 154 and to the internal connection terminals 136A-2 through 136C-2, respectively.

The internal connection terminal 136A-2 is provided on the insulating film 132-2 at a position corresponding to the position of formation of the through via 133A-2. The internal connection terminal 136A-2 is electrically connected through the corresponding solder ball 137 to the power supply connection pad 32A of the semiconductor chip 20.

The internal connection terminal 136B-2 is provided on the insulating film 132-2 at a position corresponding to the position of formation of the through via 133B-2. The internal connection terminal 136B-2 is electrically connected through the corresponding solder ball 137 to the ground connection pad 32B of the semiconductor chip 20. The internal connection terminal 136C-2 is provided on the insulating film 132-2 at a position corresponding to the position of formation of the through via 133C-2. The internal connection terminal 136C-2 is electrically connected through the corresponding solder ball 137 to the signal connection pad 32C of the semiconductor chip 20.

According to the semiconductor device 150 according to the first variation of this embodiment, the capacitance of the thin film capacitors 46 of the circuit board 151 can be increased by stacking the two capacitor structures 123-1 and 123-2 on the multilayer interconnection structure 122. Further, the semiconductor device 150 according to the first variation of this embodiment can produce the same effects as the above-described semiconductor device 120.

The above description of the description of the first variation of this embodiment is given taking the circuit board 151 having the two capacitor structures 123-1 and 123-2 stacked on the multilayer interconnection structure 122 as an example. Alternatively, more than two capacitor structures 123 may be stacked on the multilayer interconnection structure 122. Further, one or more capacitor structures 123 may be provided on the side of the multilayer interconnection structure 122 on which the external connection terminals 144 are provided.

The semiconductor device 150 having this configuration is formed by forming the insulating film 152 and the vias 153 successively after formation of the above-described structure (circuit board 121) shown in FIG. 11J and thereafter performing the same processing as that of the above-described manufacturing process shown in FIGS. 11G through 11J.

FIG. 14 is a cross-sectional view of a semiconductor device 155 according to a second variation of the fourth embodiment. In FIG. 14, the same elements as those of the above-described semiconductor device 120 of the fourth embodiment are referred to by the same numerals, and a description thereof is omitted. Further, in FIG. 14, the positional relationship between multiple capacitor structures 157 provided in a circuit board 156 and the semiconductor chip 20 is mainly shown, and graphical illustration of the components of the circuit board 156 other than the capacitor structures 157 is omitted.

Referring to FIG. 14, the semiconductor device 155 includes the semiconductor chip 20 and the circuit board 156. The circuit board 156 has the same configuration as the circuit board 121 described with reference to FIG. 10 except that the capacitor structures 157 are disposed below and close to the semiconductor chip 20.

The capacitor structures 157 are disposed below and close to the semiconductor chip 20. The multiple capacitor structures 157 are provided for the single semiconductor chip 20. Each capacitor structure 157 has a smaller area than the semiconductor chip 20.

Each capacitor structure 157 has the same configuration as the capacitor structure 123 except that the area is smaller than that of the semiconductor chip 20. Further, although not graphically illustrated, each thin film capacitor 46 formed in the capacitor structure 157 is electrically connected to the corresponding power supply connection pad 32A and ground connection pad 32B of the semiconductor chip 20 so as to serve as a decoupling capacitor.

According to the semiconductor device 155 according to the second variation of this embodiment, the area of each capacitor structure 157 is smaller than that of the semiconductor chip 20, so that variations in the film quality and thickness of the lower electrode film 47A, the dielectric film 48A, and the upper electrode film 49A are reduced. Therefore, it is possible to increase the yield of the capacitor structures 157. Further, the semiconductor device 155 according to the second variation of this embodiment can produce the same effects as the above-described semiconductor device 120.

FIG. 15 is a cross-sectional view of a semiconductor device 160 according a third variation of the fourth embodiment. In FIG. 15, the same elements as those of the above-described semiconductor device 120 of the fourth embodiment are referred to by the same numerals, and a description thereof is omitted. Further, in FIG. 15, the positional relationship between the semiconductor chips 20 and the capacitor structures 123 is mainly shown, and graphical illustration of the components of a circuit board 161 other than the capacitor structures 123 is omitted.

Referring to FIG. 15, the semiconductor device 160 includes the semiconductor chips 20 and the circuit board 161 including the capacitor structures 123. The circuit board 161 is, for example, a multi-chip module (MCM) substrate.

The capacitor structures 123 are disposed below and close to the corresponding semiconductor chips 20. Each capacitor structure 123 has substantially the same area as each semiconductor chip 20. Each capacitor structure 123 is provided for a corresponding one of the semiconductor chips 20. Although not graphically illustrated, each thin film capacitor 46 formed in each capacitor structure 123 is electrically connected to the corresponding power supply connection pad 32A and ground connection pad 32B of the corresponding semiconductor chip 20 so as to serve as a decoupling capacitor.

Thus, in the circuit board 161 on which the multiple semiconductor chips 20 are to be mounted, the multiple capacitor structures 123 each having substantially the same area as each semiconductor chip 20 may be provided with a one-to-one correspondence to the semiconductor chips 20.

The semiconductor device 160 according to the third variation of this embodiment can produce the same effects as the above-described semiconductor device 120. Further, instead of the capacitor structures 123, the multiple capacitor structures 157 (FIG. 14) may be provided for each of the semiconductor chips 20.

Figure 16:
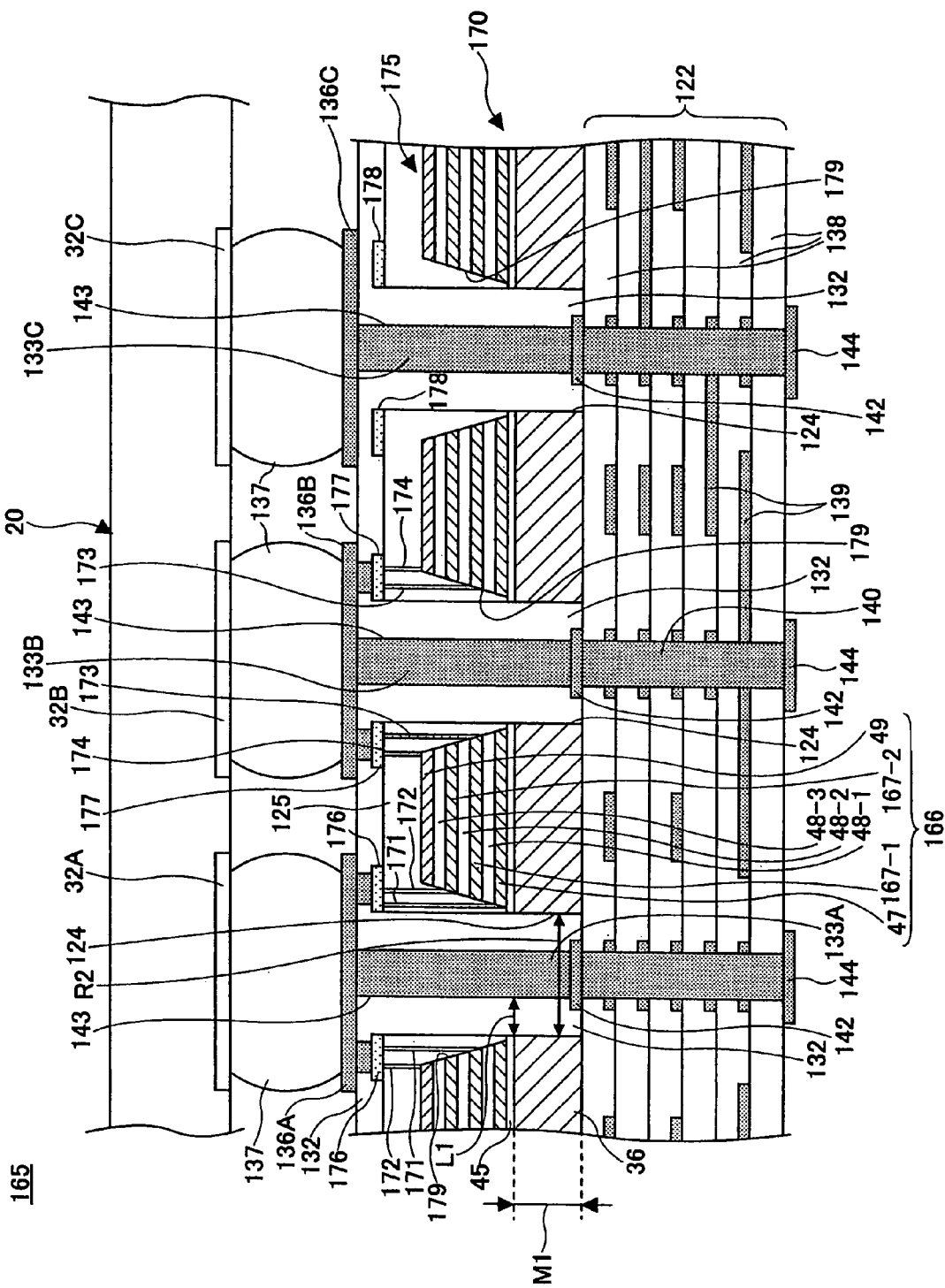
FIG. 16 is a cross-sectional view of a semiconductor device according to a fourth variation of the fourth embodiment of the present invention.

FIG. 16 is a cross-sectional view of a semiconductor device 165 according to a fourth variation of the fourth embodiment. In FIG. 16, the same elements as those of the above-described semiconductor device 120 are referred to by the same numerals, and a description thereof is omitted.

Referring to FIG. 16, the semiconductor device 165 includes the semiconductor chip 20 and a circuit board 170 on which the semiconductor chip 20 is mounted.

The circuit board 170 has the same configuration as the circuit board 121 (FIG. 10) described in the fourth embodiment except that a capacitor structure 175 replaces the capacitor structure 123.

The capacitor structure 175 has the same configuration as the capacitor structure 123 described in the fourth embodiment except that multilayer thin film capacitors 166 each of a three-layer structure, vertical interconnection lines 171 through 174, and pad electrodes 176 through 178 replace the thin film capacitors 46, the vertical interconnection lines 126 and 127, and the pad electrodes 128 and 129, respectively, provided in the capacitor structure 123.

The multilayer thin film capacitors 166 are provided on the insulating film 45 covering the thinned Si substrate 36. Each multilayer thin film capacitor 166 is disposed between the corresponding pad electrode 176 electrically connected to the power supply connection pad 32A of the semiconductor chip 20 and the corresponding pad electrode 177 electrically connected to the ground connection pad 32B of the semiconductor chip 20. The multilayer thin film capacitors 166 are covered with the protection film 125. According to this variation, the multilayer thin film capacitors 166 may be physically separated from or connected to one another.

Each multilayer thin film capacitor 166 includes the lower electrode 47, a first dielectric film 48-1, an intermediate electrode 167-1, a second dielectric film 48-2, an intermediate electrode 167-2, a third dielectric film 48-3, and the upper electrode 49, which are stacked successively on the insulating film 45 in the order described. Each of the intermediate electrodes 167-1 and 167-2 is provided so as to be sandwiched between corresponding adjacent two of the dielectric films 48-1 through 48-3. The same material as that of the lower electrode 47 or the upper electrode 49 described in the first embodiment may be used for the intermediate electrodes 167-1 and 167-2. The intermediate electrodes 167-1 and 167-2 may be, but are not limited to, for example, 100 nm in thickness.

Multiple opening parts (holes) 179 are formed among the thin film capacitors 166 at positions corresponding to the positions of formation of the through vias 133A through 133C. The opening parts 179 are shaped so as to widen toward the upper electrodes 49 from the Si substrate 36. Each opening part 179 exposes the side face of each of the lower electrode 47, the dielectric film 48-1, the intermediate electrode 167-1, the dielectric film 48-2, the intermediate electrode 167-2, the dielectric film 48-3, and the upper electrode 49 of each corresponding thin film capacitor 166.

Providing the opening parts 179 having such a widening shape among the thin film capacitors 166 makes it possible to electrically connect the electrodes 47, 167-1, 167-2, and 49 positioned below the pad electrodes 176 and 177 to the pad electrodes 176 and 177 through the vertical interconnection lines 171 through 174.

The vertical interconnection lines 171 are provided in the protection film 125 at positions corresponding to the position of formation of the pad electrode 176. The vertical interconnection lines 171 electrically connect the lower electrodes 47 exposed by the corresponding opening part 179 and the pad electrode 176. The vertical interconnection lines 172 are provided in the protection film 125 at positions close to the vertical interconnection lines 171. The vertical interconnection lines 172 electrically connect the intermediate electrodes 167-2 exposed by the corresponding opening part 179 and the pad electrode 176.

The vertical interconnection lines 173 are provided in the protection film 125 at positions corresponding to the position of formation of the pad electrode 177. The vertical interconnection lines 173 electrically connect the intermediate electrodes 167-1 exposed by the corresponding opening part 179 and the pad electrode 177. The vertical interconnection lines 174 are provided in the protection film 125 at positions close to the vertical interconnection lines 173. The vertical interconnection lines 174 electrically connect the upper electrodes 49 exposed by the corresponding opening part 179 and the pad electrode 177. As the material of the vertical interconnection lines 171 through 174, for example, a conductive material such as Cu or Ni may be used.

Figure 17:
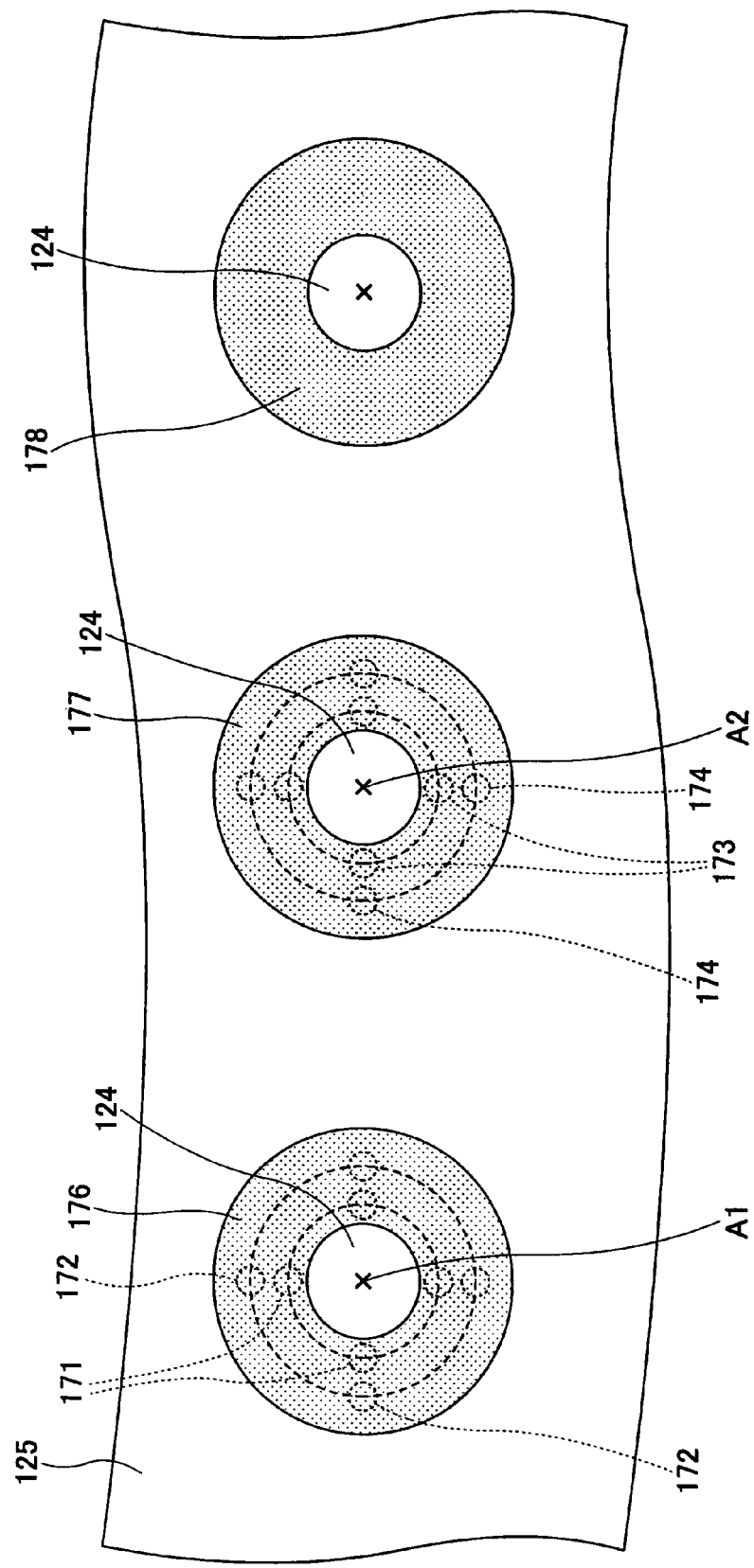
FIG. 17 is a plan view of a capacitor structure for illustrating the positions of disposition of vertical interconnection lines according to the fourth variation of the fourth embodiment of the present invention.

FIG. 17 is a plan view of the capacitor structure 175 for illustrating the positions of disposition of the vertical interconnection lines 171 through 174.

As shown in FIG. 17, the vertical interconnection lines 171 and the vertical interconnection lines 172 are provided on respective concentric circles centering on the center axis A1 of the corresponding through hole 124, and the vertical interconnection lines 173 and the vertical interconnection lines 174 are provided on respective concentric circles centering on the center axis A2 of the corresponding through hole 124.

The same material as that of the vertical interconnection lines 126 and 127 described in the fourth embodiment may be employed for the vertical interconnection lines 171 through 174. The shape of the vertical interconnection lines 171 through 174 may be, but is not limited to, a cylindrical shape as shown in FIG. 17. For example, the vertical interconnection lines 171 through 174 may also have quadrangular prism shapes.

The pad electrode 176 is provided on the protection film 125 at a position corresponding to the positions of formation of the vertical interconnection lines 171 and 172 so as to surround the corresponding through hole 124. The pad electrode 176 is electrically connected to the vertical interconnection lines 171 and 172 and the internal connection terminal 136A. The pad electrode 176 is electrically connected through the vertical interconnection lines 171 and 172 to the odd-numbered ones of the stacked electrodes 47, 167-1, 167-2, and 49 from the Si substrate 36 side, that is, the first electrode 47 and the third electrode 167-2, of each corresponding thin film capacitor 166. Further, the pad electrode 176 is electrically connected to the power supply connection pad 32A of the semiconductor chip 20 through the internal connection terminal 136A.

The pad electrode 177 is provided on the protection film 125 at a position corresponding to the positions of formation of the vertical interconnection lines 173 and 174 so as to surround the corresponding through hole 124. The pad electrode 177 is electrically connected to the vertical interconnection lines 173 and 174 and the internal connection terminal 136B. The pad electrode 177 is electrically connected through the vertical interconnection lines 173 and 174 to the even-numbered ones of the stacked electrodes 47, 167-1, 167-2, and 49 from the Si substrate 36 side, that is, the second electrode 167-1 and the fourth electrode 49, of each corresponding thin film capacitor 166. Further, the pad electrode 177 is electrically connected to the ground connection pad 32B of the semiconductor chip 20 through the internal connection terminal 136B.

By thus electrically connecting the pad electrode 176 and the odd-numbered electrodes 47 and 167-2 from the Si substrate 36 side and electrically connecting the pad electrode 177 and the even-numbered electrodes 167-1 and 49 from the Si substrate 36 side, the multiple capacitors provided in each multilayer thin film capacitor 166 are connected in parallel, so that each multilayer thin film capacitor 166 functions as a decoupling capacitor.

The pad electrode 178 is provided on the protection film 125 in a part where the vertical interconnection lines 171 through 174 are not formed, so as to surround the corresponding through hole 124. The pad electrode 178 is electrically connected to the signal connection pad 32C of the semiconductor chip 20. The same material as that of the pad electrodes 128 and 129 described in the fourth embodiment may be used for the pad electrodes 176 through 178.

According to the semiconductor device 165 of the fourth variation of this embodiment, the multiple capacitors provided in each multilayer thin film capacitor 166 are connected in parallel. Accordingly, it is possible to increase capacitor capacitance.

The above description of the fourth variation of this embodiment is given taking the multilayer thin film capacitors 166 of a three-layer structure as an example. Alternatively, the number of stacked layers of a capacitor may be two or more than three. The capacitor structure 175 may be manufactured in the same manner as the above-described processes of FIGS. 11A through 11F.

Fifth Embodiment

Figure 18:
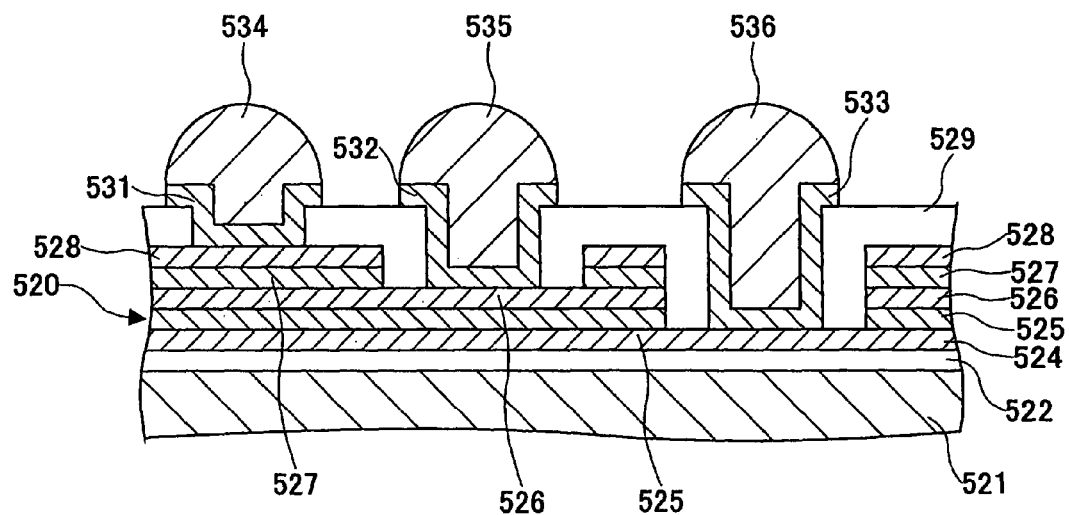
FIG. 18 is a cross-sectional view of a conventional multi-layer thin film capacitor.

FIG. 18 is a cross-sectional view of a conventional multilayer thin film capacitor 520.

A description is given, with reference to FIG. 18, of the conventional multilayer thin film capacitor 520. The multilayer thin film capacitor 520 is covered with photosensitive polyimide 529. The multilayer thin film capacitor 520 includes a Si substrate 521, a SrTiO$_3$ layer 522, a lower electrode 524, a dielectric film 525, an intermediate electrode 526, a dielectric film 527, an upper electrode 528, pad electrodes 531 through 533, and terminals 534 through 536. The SrTiO$_3$ layer 522 is an intermediate layer. The SrTiO$_3$ layer 522, the lower electrode 524, the dielectric film 525, the intermediate electrode 526, the dielectric film 527, and the upper electrode 528 are stacked successively on the Si substrate 521 in the order described.

The pad electrode 531 is connected to the upper electrode 528. The pad electrode 532 is connected to the intermediate electrode 526. The pad electrode 533 is connected to the lower electrode 524. Thereby, a capacitor B1 formed of the upper electrode 528, the dielectric film 527, and the intermediate electrode 526 and a capacitor B2 formed of the lower electrode 524, the dielectric film 525, and the intermediate electrode 526 are formed. The capacitors B1 and B2 are different in capacitance.

The terminal 534 is provided on the pad electrode 531. The terminal 535 is provided on the pad electrode 532. The terminal 536 is provided on the pad electrode 533. Each of the terminals 534 through 536 are connected to a corresponding one of a power supply connection pad and a ground connection pad of a semiconductor chip not graphically illustrated.

Figure 19:
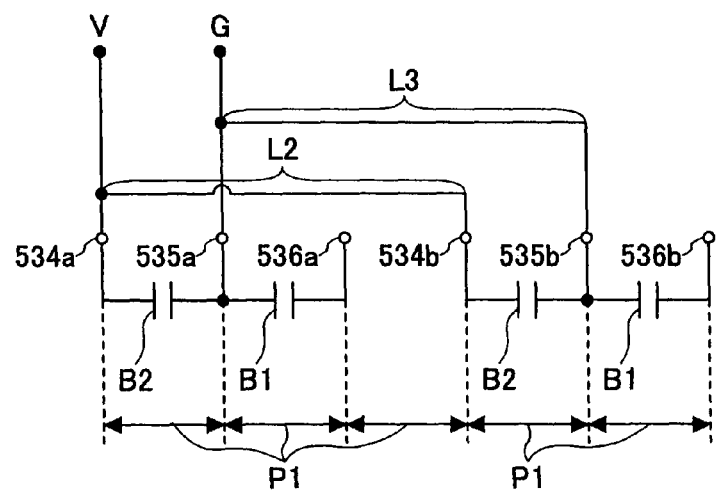
FIG. 19 is a circuit diagram showing an equivalent circuit in the case of connecting two capacitors of the same capacitance in parallel by arranging two structures equal to that shown in FIG. 18.

FIG. 19 is a circuit diagram showing an equivalent circuit in the case of connecting two capacitors of the same capacitance in parallel. As an example, FIG. 19 shows the case of connecting the two capacitors B2 in parallel between a power supply connection pad and a ground connection pad of a semiconductor chip for high frequencies. Further, in FIG. 19, P1 indicates the pitch at which terminals 534a, 534b, 535a, 535b, 536a, and 536b are disposed. Hereinafter, this pitch is referred to as "terminal pitch P1."

In the case of using the multilayer thin film capacitor 520 as a decoupling capacitor, multiple capacitors of the same capacitance are connected in parallel between a power supply connection pad and a ground connection pad of a high-frequency semiconductor chip so as to increase the capacitance of the multilayer thin film capacitor 520, thereby making it possible to absorb the noise of the high-frequency semiconductor chip sufficiently.

In this case, as shown in FIG. 19, an interconnection line L2 (for electrical connection to the power supply connection pad of the high-frequency semiconductor chip) and an interconnection line L3 (for electrical connection to the ground connection pad of the high-frequency semiconductor chip) are required in order to connect the capacitors B2 of the same capacitance in parallel. Further, in this case, each of the interconnection lines L2 and L3 is required to be three times as long as the terminal pitch P1.

Accordingly, in the multilayer thin film capacitor 520, each of the interconnection lines L2 and L3 is three times as long as the terminal pitch P1 in the case of configuring a decoupling capacitor by connecting capacitors of the same capacitance in parallel. This causes a problem in that inductance increases to prevent impedance from being reduced. Although not graphically illustrated, in the case of connecting the two capacitors B1 of the same capacitance in parallel, the interconnection lines L2 and L3 are also required, thus causing the same problem.

Figure 20:
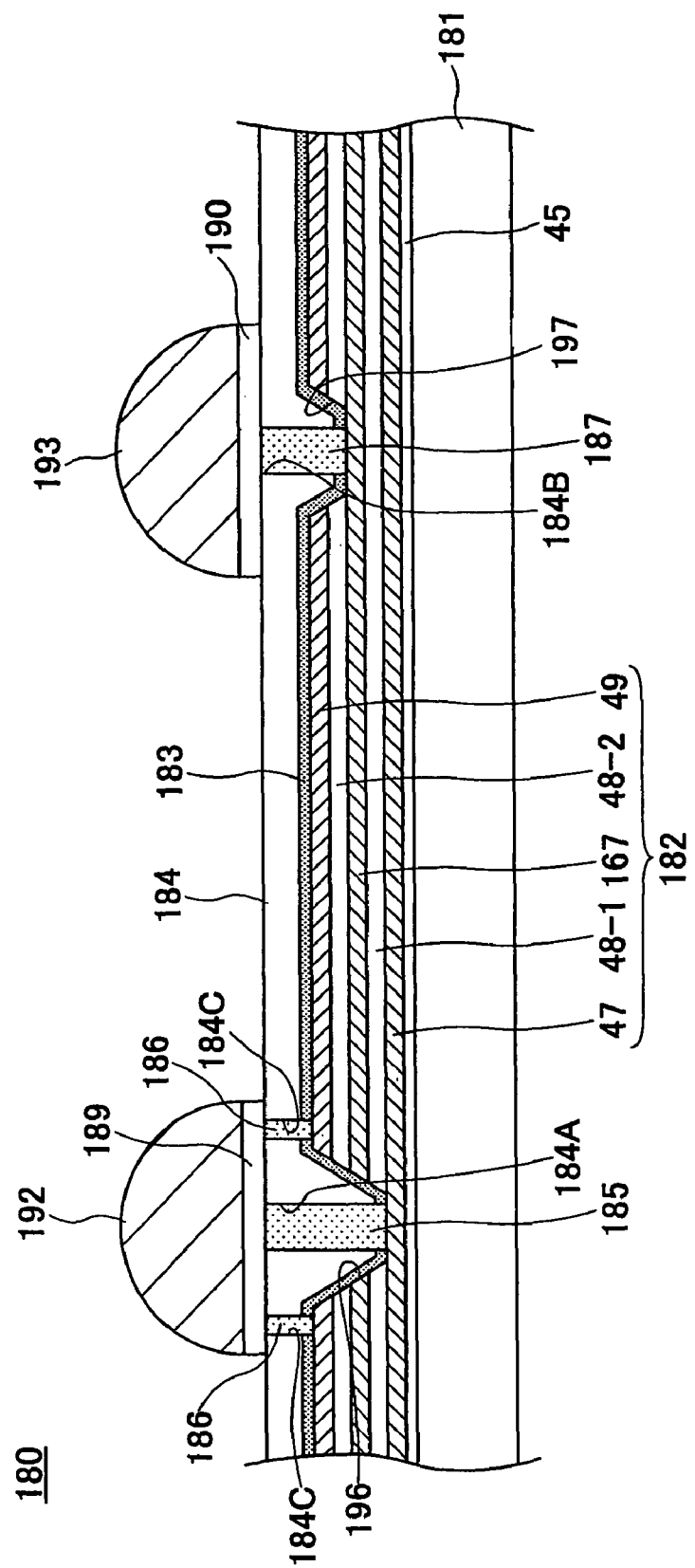
FIG. 20 is a cross-sectional view of a capacitor structure according to a fifth embodiment of the present invention.

FIG. 20 is a cross-sectional view of a capacitor structure 180 according to the fifth embodiment of the present invention. In FIG. 20, the same elements as those of the capacitor structure 175 according to the fourth variation of the fourth embodiment are referred to by the same numerals, and a description thereof is omitted.

Referring to FIG. 20, the capacitor structure 180 includes a Si substrate 181, the insulating film 45, an insulating film 184, a thin film capacitor 182, a protection film 183, vertical interconnection lines 185 through 187, a pair of pad electrodes 189 and 190, and external connection terminals 192 and 193.

A material inexpensive and excellent in smoothness and heat resistance may be used for the substrate 181. For example, Si is a suitable material for the substrate 181. Other materials for the substrate 181 may be, for instance, ceramics such as glass and alumina, metals such as Mo and W, resins such as epoxy, and composites of two or more of these materials. The insulating film 45 is provided on the substrate 181. A $SiO_2$ film of 100 nm in thickness may be used as the insulating film 45.

The thin film capacitor 182 is provided on the insulating film 45. The thin film capacitor 182 is disposed between the pad electrodes 189 and 190 so as to be electrically connected to the pad electrode 189 to which the external connection terminal 192 is connected and the pad electrode 190 to which the external connection terminal 193 is connected.

By thus providing the thin film capacitor 182 electrically connected to the external connection terminals 192 and 193 between the paired pad electrodes 189 and 190, it is possible to reduce the areawise size of the thin film capacitor 182 compared with the conventional multilayer thin film capacitor 520.

The thin film capacitor 182 is a multilayer thin film capacitor in which the lower electrode 47, the first dielectric film 48-1, an intermediate electrode 167, the second dielectric film 48-2, and the upper electrode 49 are stacked successively in the order described. An opening part (hole) 196 is formed in a thin film capacitor multilayer body including the thin film capacitor 182 below the pad electrode 189, and an opening part (hole) 197 is formed in the thin film capacitor multilayer body including the thin film capacitor 182 below the pad electrode 190. The opening part 196 exposes the upper surface of the lower electrode 47 and defines the end face of each of the intermediate electrode 167 and the upper electrode 49. The opening part 197 exposes the upper surface of the intermediate electrode 167 and defines the end face of the upper electrode 49. Further, the opening parts 196 and 197 are shaped like substantially inverse truncated cones, tapered in a direction from the bottom surface of the pad electrodes 189 and 190 to the substrate 181. That is, in the opening parts 196 and 197, the distance between the opposing sides of the end face of the electrode (or the diameter of the opening) is gradually reduced in the direction from the bottom surface of the pad electrodes 189 and 190 to the substrate 181. In other words, the area of a cross section of each of the opening parts 196 and 197 perpendicular to its axis is reduced in the direction from the bottom surface of the pad electrodes 189 and 190 to the substrate 181.

Providing the opening parts 196 and 197 having such a shape in the thin film capacitor 182 makes it possible to connect the pad electrodes 189 and 190 and the electrodes 47, 167, and 49 through the vertical interconnection lines 185 through 187. In FIG. 20, each of the opening parts 196 and 197 has a substantially inverse truncated cone-like shape. Alternatively, the opening parts 196 and 197 may have substantially inverse truncated pyramid-like shapes.

The thin film capacitor 182 includes a capacitor D1 formed of the lower electrode 47, the first dielectric film 48-1, and the intermediate electrode 167 and a capacitor D2 formed of the intermediate electrode 167, the second dielectric film 48-2, and the upper electrode 49.

For example, the thin film capacitor 182 is connected to a semiconductor chip through a circuit board not graphically illustrated. In this case, the thin film capacitor 182 is electrically connected to a power supply connection pad and a ground connection pad of the semiconductor chip through the external connection terminals 192 and 193 so as to function as a decoupling capacitor.

Metal oxide materials having a perovskite crystal structure having a high dielectric constant described in the first embodiment are the most desirable as the material of the dielectric films 48-1 and 48-2. In addition to the materials described in the first embodiment, metal oxides of Ta, Nb, Hf, Y and Al, composite oxides, and mixtures of these oxides may also be used. With respect to the crystal structure of these materials, desirably, these materials are polycrystalline bodies in terms of properties and costs. Alternatively, single crystalline bodies, which are expensive and have a high dielectric constant, amorphous bodies, which have excellent leakage characteristics, and crystalline bodies having the mixed phase of these may also be used.

As the material of the lower electrode 47, the intermediate electrode 167, and the upper electrode 49, noble metals such as Ir, Ru, and Rh, conductive oxides such as $SrRuO_3$, $LaNiO_3$, and $LaSrCoO_3$, and conductive nitrides such as AlTiN may be used in addition to the materials for the lower electrode 47 and the upper electrode 49 described in the first embodiment. Further, materials such as Pt (described above), Ir, Ru, and Rh are suitable because noble metals are less susceptible to oxidation and have low resistance.

The protection film 183 is, for example, 50 nm in thickness, and is provided so as to cover the thin film capacitor 182. The protection film 183 is formed of an insulating material. The insulating material is not limited in particular, but $Si_3N_4$, $SiO_2$, and alumina, which have excellent water resistance, are preferable. Employment of these materials makes it possible to prevent degradation of the dielectric films 48-1 and 48-2 having a perovskite crystal structure.

The insulating film 184 is, for example, 2 μm in thickness, and is provided so as to cover the protection film 183. An opening part (hole) 184A corresponding to the position of formation of the vertical interconnection line 185, an opening part (hole) 184B corresponding to the position of formation of the vertical interconnection line 187, and opening parts (holes) 184C corresponding to the positions of formation of the vertical interconnection lines 186 are formed in the insulating film 184. The opening part 184A exposes part of the lower electrode 47. The opening part 184B exposes part of the intermediate electrode 167. The opening parts 184C expose parts of the upper electrode 49.

The same material as that of the insulating film 52 described in the first embodiment may be used as the material of the insulating film 184. For example, resins such as polyimide and epoxy, oxides such as alumina and silica, nitrides, various insulating materials, mixtures, and multilayer films may be used.

The vertical interconnection line 185 is provided in the insulating film 184 so as to extend from the bottom surface of the pad electrode 189 to the upper surface of the lower electrode 47 exposed in the opening part 196. The vertical interconnection line 185 is electrically connected to the pad electrode 189 and the lower electrode 47. The vertical interconnection lines 186 are provided in the insulating film 184 so as to extend from the bottom surface of the pad electrode 189 to the upper surface of the upper electrode 49. The vertical interconnection lines 186 are electrically connected to the pad electrode 189 and the upper electrode 49. The vertical interconnection line 187 is provided in the insulating film 184 so as to extend from the bottom surface of the pad electrode 190 to the upper surface of the intermediate electrode 167. The vertical interconnection line 187 is electrically connected to the pad electrode 190 and the intermediate electrode 167.

Figure 21:
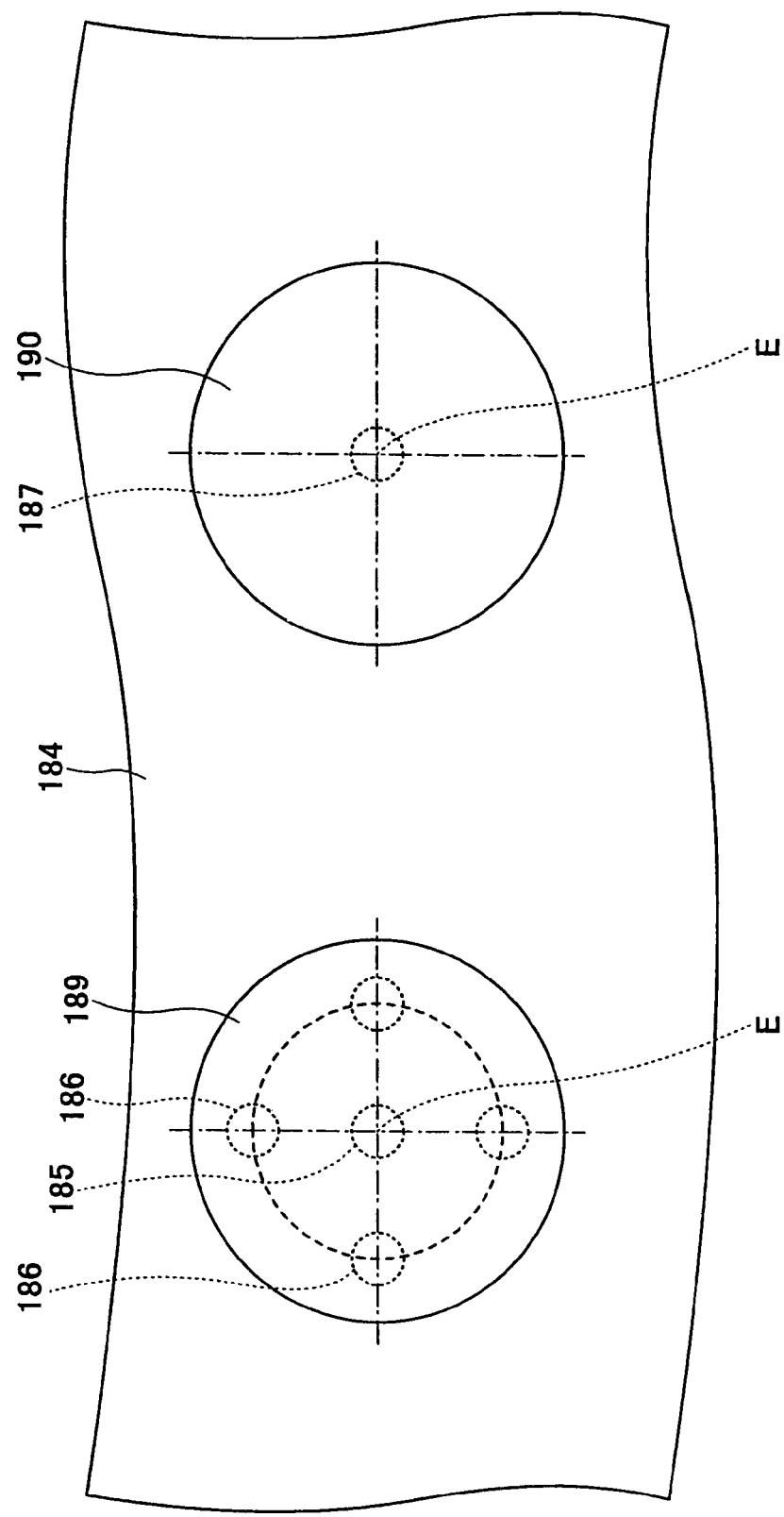
FIG. 21 is a plan view of the capacitor structure for illustrating the positions of disposition of vertical interconnection lines according to the fifth embodiment of the present invention.

FIG. 21 is a plan view of the capacitor structure 180 for illustrating the positions of disposition of the vertical interconnection lines 185 through 187.

As shown in FIG. 21, the multiple (four in FIG. 21) vertical interconnection lines 186 are provided in a circle centered on the center axis E of the vertical interconnection line 185 so that the circle is concentric with the vertical interconnection line 185. In FIG. 21, the vertical interconnection lines 185 through 187 have a cylindrical shape. However, the vertical interconnection lines 185 through 187 are not limited to this shape, and may also have a quadrangular prism shape. As the material of the vertical interconnection lines 185 through 187, for example, conductive materials such as Cu and Ni may be employed.

The pad electrode 189 is provided on the insulating film 184 at a position corresponding to the positions of formation of the vertical interconnection lines 185 and 186. The pad electrode 189 is electrically connected to the odd-numbered ones of the electrodes 47, 167, and 49 from the substrate 181 side, that is, the first electrode 47 and the third electrode 49.

The pad electrode 190 is provided on the insulating film 184 at a position corresponding to the position of formation of the vertical interconnection line 187. The pad electrode 190 is electrically connected to the even-numbered (second) electrode 167 from the substrate 181 side. The pad electrodes 189 and 190 serve as terminals substituting for the external connection terminals 192 and 193 if the external connection terminals 192 and 193 are not provided.

Of the electrodes 47, 167, and 49 of the thin film capacitor 182 disposed between the paired pad electrodes 189 and 190, the odd-numbered electrodes 47 and 49 from the substrate 181 side are electrically connected to the pad electrode 189 through the vertical interconnection lines 185 and 186, respectively, and the even-numbered electrode 167 from the substrate 181 side is electrically connected to the pad electrode 190 through the interconnection line 187. Thereby, it is possible to make the capacitors D1 and D2 substantially equal in capacitance.

In FIG. 21, the pad electrodes 189 and 190 have a circular shape. However, the pad electrodes 189 and 190 are not limited to this shape, and may also have a quadrangular shape. As the material of the pad electrodes 189 and 190, for example, conductive materials such as Cu and Ni may be used.

The external connection terminal 192 is provided on the pad electrode 189. The external connection terminal 193 is provided on the pad electrode 190. Of the external electrodes 192 and 193, for example, one is electrically connected to a power supply connection pad and the other is electrically connected to a ground connection pad of a semiconductor chip. As the material of the external connection terminals 192 and 193, a conductive material may be used. Specifically, for example, Sn—Ag solder may be used.

Figure 22:
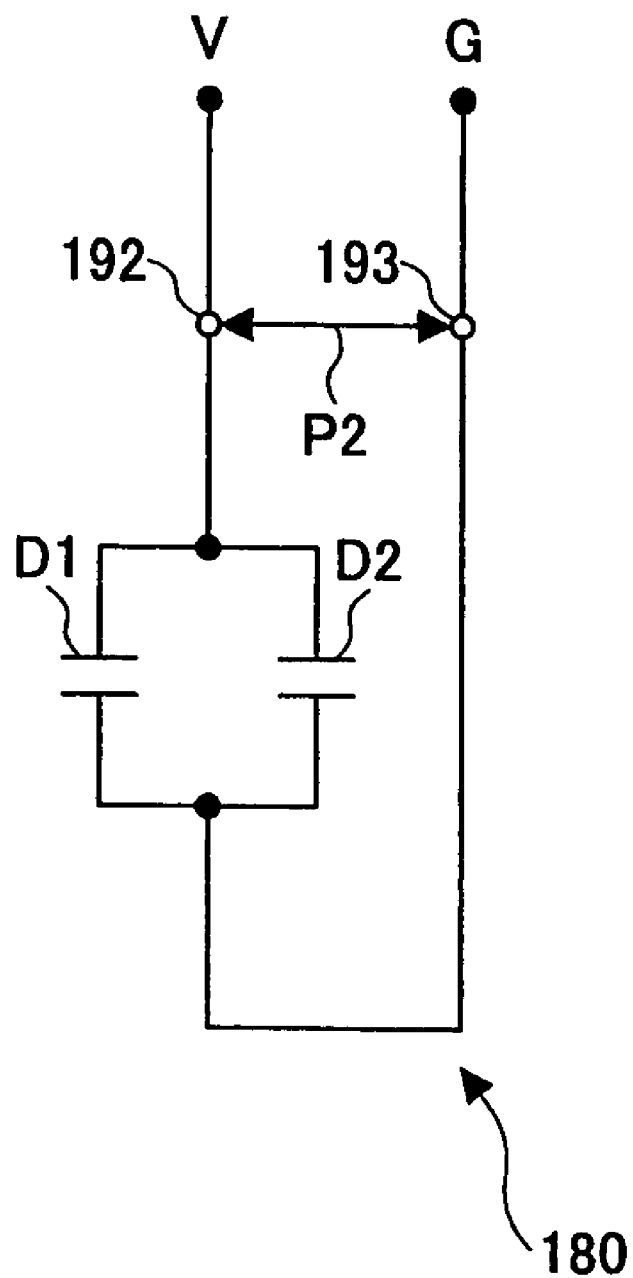
FIG. 22 is a circuit diagram showing an equivalent circuit in the case of connecting two capacitors of the same capacitance in parallel by arranging two structures equal to that shown in FIG. 20 according to the fifth embodiment of the present invention.

FIG. 22 is a circuit diagram showing an equivalent circuit in the case of connecting two capacitors of the same capacitance in parallel. In FIG. 22, P2 indicates the pitch at which the external connection terminals 192 and 193 are disposed.

As shown in FIG. 22, in the case of configuring a decoupling capacitor by connecting the two capacitors D1 and D2 of the same capacitance in parallel, the electrodes 47, 167, and 49 and the pad electrodes 189 and 190 are electrically connected through the vertical interconnection lines 185 through 187 in the capacitor structure 180. Accordingly, the interconnection lines L2 and L3 required in the conventional thin film capacitor 520 (FIG. 18) are not required in the capacitor structure 180. As a result, the length of interconnection lines required in the case of connecting the capacitors D1 and D2 in parallel (using the thin film capacitor 182 as a decoupling capacitor) is reduced, so that the inductance of the interconnection lines is reduced. As a result, it is possible to realize the thin film capacitor 182 with low impedance.

According to the capacitor structure 180 of this embodiment, the pad electrode 189 is electrically connected to the odd-numbered electrodes 47 and 49 from the substrate 181 side, and the pad electrode 190 is electrically connected to the even-numbered electrode 167 from the substrate 181 side. As a result, the multiple capacitors D1 and D2 having substantially the same capacitance and disposed between the pad electrodes 189 and 190 are connected in parallel. Accordingly, it is possible to reduce impedance by reducing inductance by reducing interconnection line length required in the case of configuring a decoupling capacitor. Further, by providing the thin film capacitor 182 electrically connected to the two external connection terminals 192 and 193 between the paired pad electrodes 189 and 190, it is possible to reduce the thin film capacitor in size.

In the capacitor structure 180 of this embodiment, the thin film capacitor 182 has the capacitors D1 and D2 in two layers. Alternatively, the thin film capacitor 182 may be configured by stacking capacitors in three or more layers. By providing a thin film capacitor configured by stacking capacitors in three or more layers in the capacitor structure 180 and connecting the capacitors having substantially the same capacitance in parallel, it is possible to further increase the capacitance of the thin film capacitor.

FIGS. 23A through 23I are diagrams showing a process of manufacturing a capacitor structure according to the fifth embodiment. A description is given below, with reference to the drawings, of a method of manufacturing the capacitor structure 180 according to this embodiment.

First, in the process of FIG. 23A, by sputtering, the insulating film 45 is formed on the Si substrate 181, and then the lower electrode film 47A, a dielectric film 48-1A, an intermediate electrode film 167A, a dielectric film 48-2A, and the upper electrode film 49A are successively formed as the thin film capacitor multilayer body.

Specifically, for example, using a multi-target DC-RF magnetron sputtering device, a $SiO_2$ film (100 nm in thickness) is formed as the insulating film 45 on the Si substrate 181 having a (111) main surface with the substrate temperature being 200° C. Next, with the substrate temperature being 600° C., a Pt film (100 nm in thickness) is formed as the lower electrode film 47A in an Ar atmosphere. Next, with the substrate temperature being 600° C., a BST film (100 nm in thickness) is formed as the first dielectric film 48-1A in an $Ar/O_2$ atmosphere. Next, with the substrate temperature being 300° C., a Pt film (100 nm in thickness) is formed as the intermediate electrode film 167A in an Ar atmosphere. Next, a BST film (100 nm in thickness) is formed as the second dielectric film 48-2A. Next, a Pt film (100 nm in thickness) is formed as the upper electrode film 49A. In forming the second dielectric film 48-2A, the same film formation conditions as for the first dielectric film 48-1A are employed. In forming the upper electrode film 49A, the same film formation conditions as for the intermediate electrode film 167A are employed. These multilayer films 45, 47A, 48-1A, 167A, 48-2A, and 49A may be formed by a method other than sputtering, such as vapor deposition or CVD.

Next, in the process of FIG. 23B, the stacked films 47A, 48-1A, 167A, 48-2A, and 49A are patterned by ion milling, so that the thin film capacitor 182 including the lower electrode 47, the two layers of the dielectric films 48-1 and 48-2, the intermediate electrode 167, and the upper electrode 49 is formed. The opening parts 196 and 197 are formed in the thin film capacitor multilayer body including the thin film capacitor 182 by this patterning.

Specifically, a resist film having openings corresponding to the positions of formation of the opening parts 196 and 197 is formed, and the opening parts 196 and 197 are formed by ion milling by inputting ions at an angle with the Si substrate 181.

Next, the thin film capacitor 182 is subjected to heat treatment in an oxygen atmosphere so as to remove thermal distortion from the dielectric films 48-1 and 48-2 and supply oxygen atoms to oxygen deficient parts in the dielectric films 48-1 and 48-2. The lower electrode 47, the intermediate electrode 167, and the upper electrode 49 of the thin film capacitor 182 are formed by patterning the lower electrode film 47A, the intermediate electrode film 167A, and the upper electrode film 49A, respectively.

By thus stacking the lower electrode film 47A, the dielectric film 48-1A, the intermediate film 167A, the dielectric film 48-2A, and the upper electrode film 49A in sequence in a vacuum, it is possible to prevent dust or foreign materials from adhering to the stacked films 47A, 48-1A, 167A, 48-2A, and 49A, and to prevent the surface of each of the films 47A, 48-1A, 167A, 48-2A, and 49A from being contaminated.

Further, by performing patterning after forming the stacked films 47A, 48-1A, 167A, 48-2A, and 49A on the even planar insulating film 45, it is possible to process the stacked films 47A, 48-1A, 167A, 48-2A, and 49A with good accuracy, and increase the yield of the thin film capacitor 182.

Further, by patterning the stacked films 47A, 48-1A, 167A, 48-2A, and 49A together with a single mask, it is possible to reduce the manufacturing costs of the capacitor structure 180 compared with the case of performing patterning with multiple masks prepared.

Figure 23C:
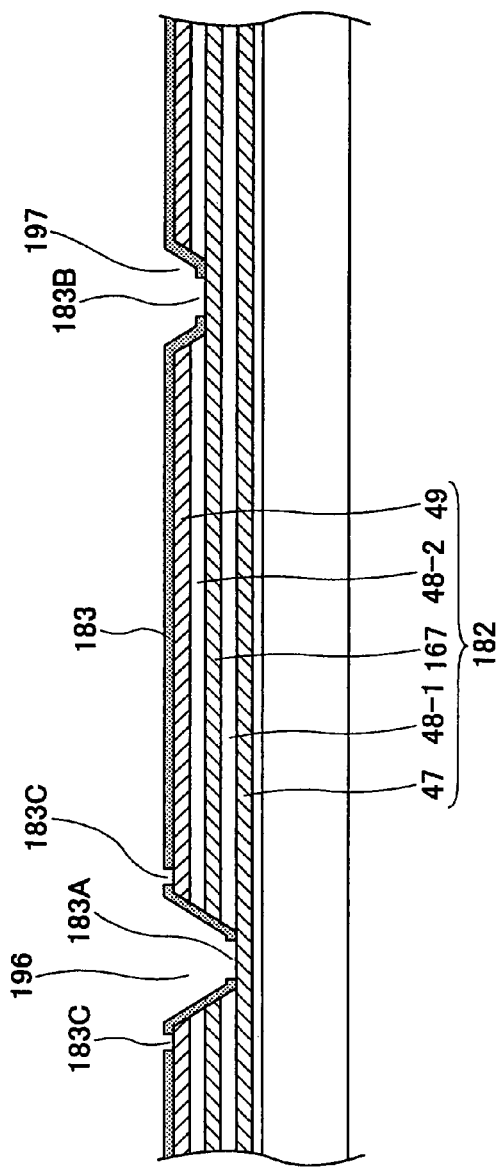

Next, in the process of FIG. 23C, the protection film 183 is formed so as to cover the thin film capacitor 182. Next, the opening 183A exposing the lower electrode 47, the opening 183B exposing the intermediate electrode 167, and the openings 183C exposing the upper surface of the upper electrode 49 are formed by ion milling in the protection film 183 at positions corresponding to the positions of formation of the vertical interconnection lines 185, 187, and 186, respectively. Next, the protection film 183 is subjected to post-annealing in an oxygen atmosphere. Specifically, for example, an amorphous alumina film (50 nm in thickness) is formed as the protection film 183 by sputtering using an RF magnetron sputtering device. The protection film 183 may be formed by a method other than sputtering, such as vapor deposition or CVD.

Figure 23D:
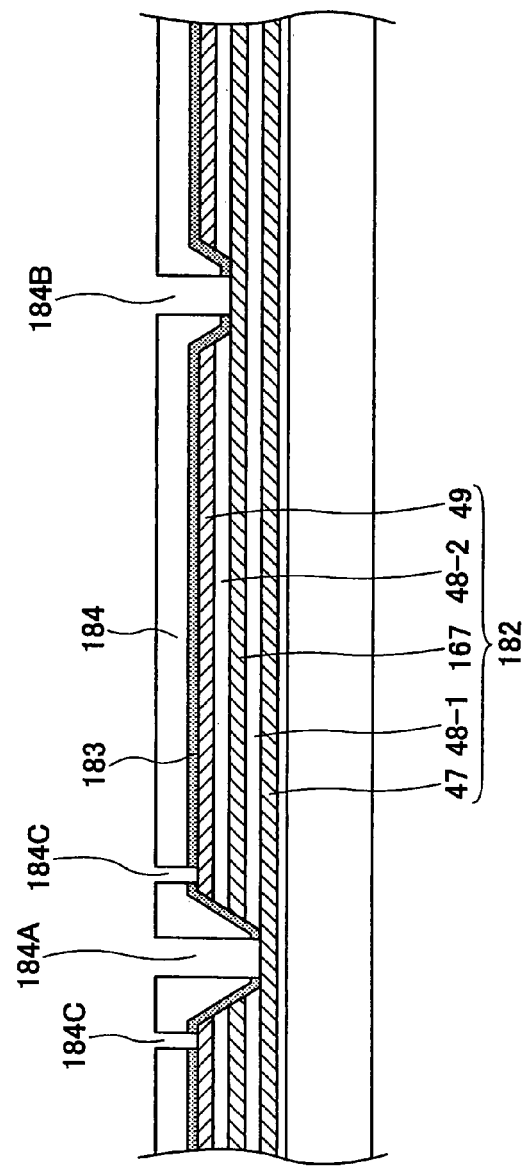

Next, in the process of FIG. 23D, the insulating film 184 is formed so as to cover the upper surface side of the structure shown in FIG. 23C. Next, the opening parts 184A through 184C are formed in the insulating film 184. Specifically, for example, a photosensitive polyimide resin (2 μm in thickness) is formed as the insulating film 184 by spin coating. The opening parts 184A, 184B, and 184C are formed by exposing to light and developing the photosensitive polyimide resin. The insulating film 184 may also be formed by a method other than spin coating, such as spraying or dipping.

Figure 23E:
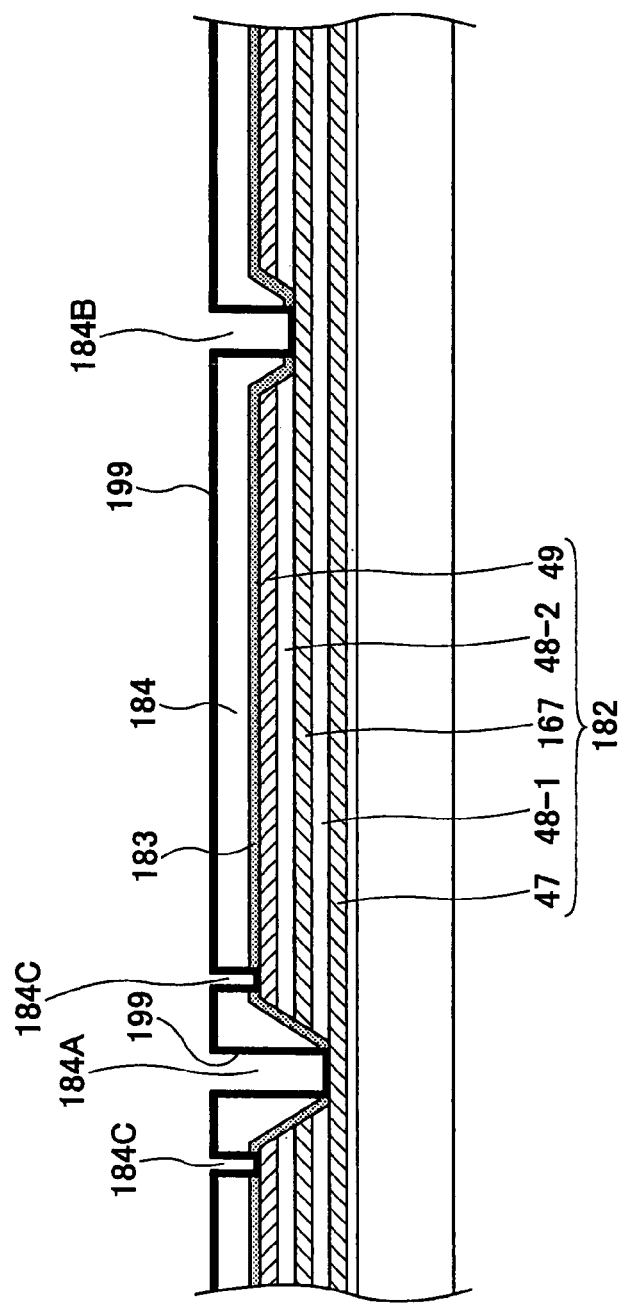

Next, in the process of FIG. 23E, a metal film 199 serving as a plating seed layer is formed on the upper surface of the insulating film 184 and the opening parts 184A through 184C. Specifically, for example, a Ti film, a Cu film, and a Ni film are successively formed by sputtering so as to serve as the metal film 199. The metal film 199 may be formed by a method other than sputtering, such as vapor deposition or CVD.

Figure 23F:
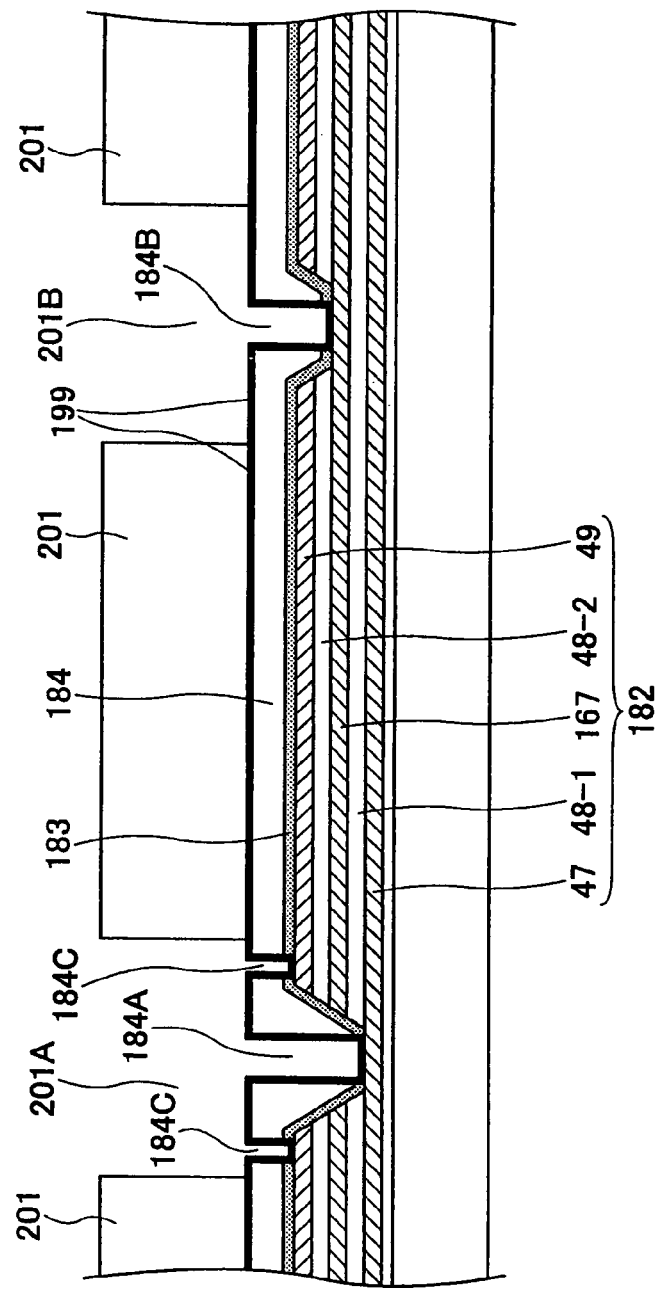

Next, in the process of FIG. 23F, a resist layer 201 having an opening part (hole) 201A corresponding to the position of formation of the pad electrode 189 and an opening part (hole) 201B corresponding to the position of formation of the pad electrode 190 is formed on the metal film 199.

Figure 23G:
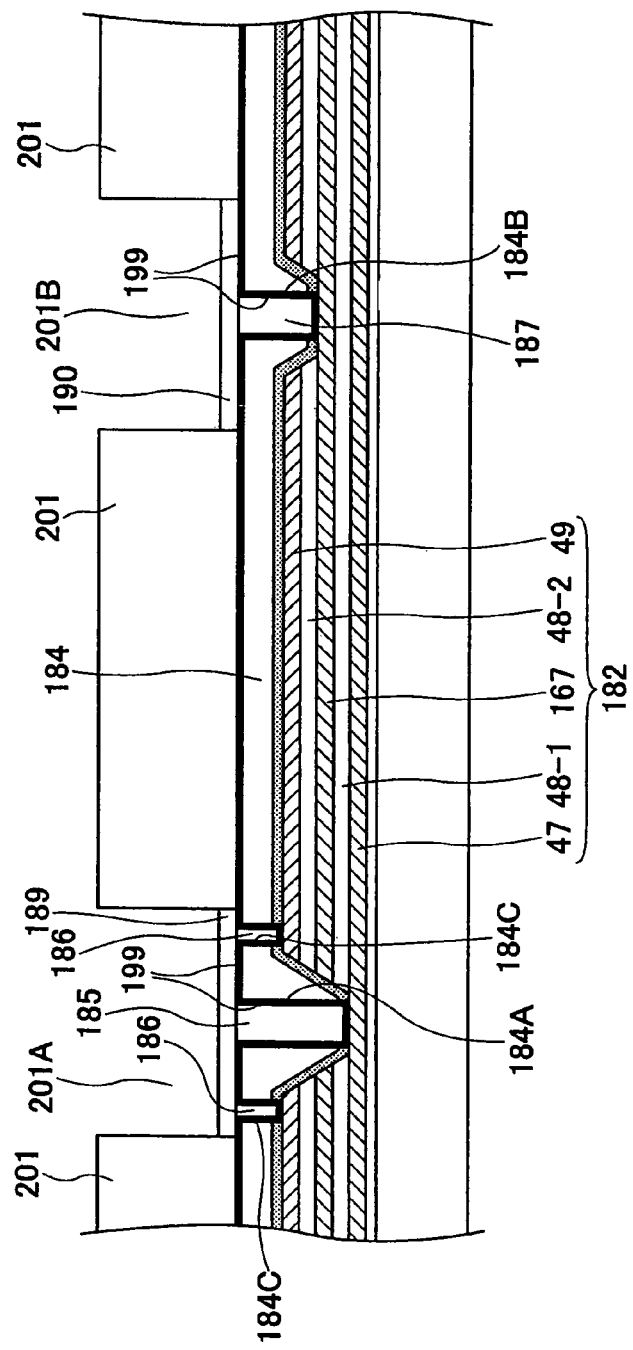

Next, in the process of FIG. 23G, the vertical interconnection lines 185 through 187 are formed in the opening parts 184A through 184C, respectively. Next, the pad electrode 189 is formed in the area exposed in the opening part 201A of the resist layer 201, and the pad electrode 190 is formed in the area exposed in the opening part 201B of the resist layer 201. Specifically, a Cu film to serve as the vertical interconnection lines 185 through 187 is deposited on part of the metal film 199 corresponding to the opening parts 184A through 184C by electroplating, and thereafter, a Ni film to serve as the pad electrodes 189 and 190 is formed by electroplating.

Figure 23H:
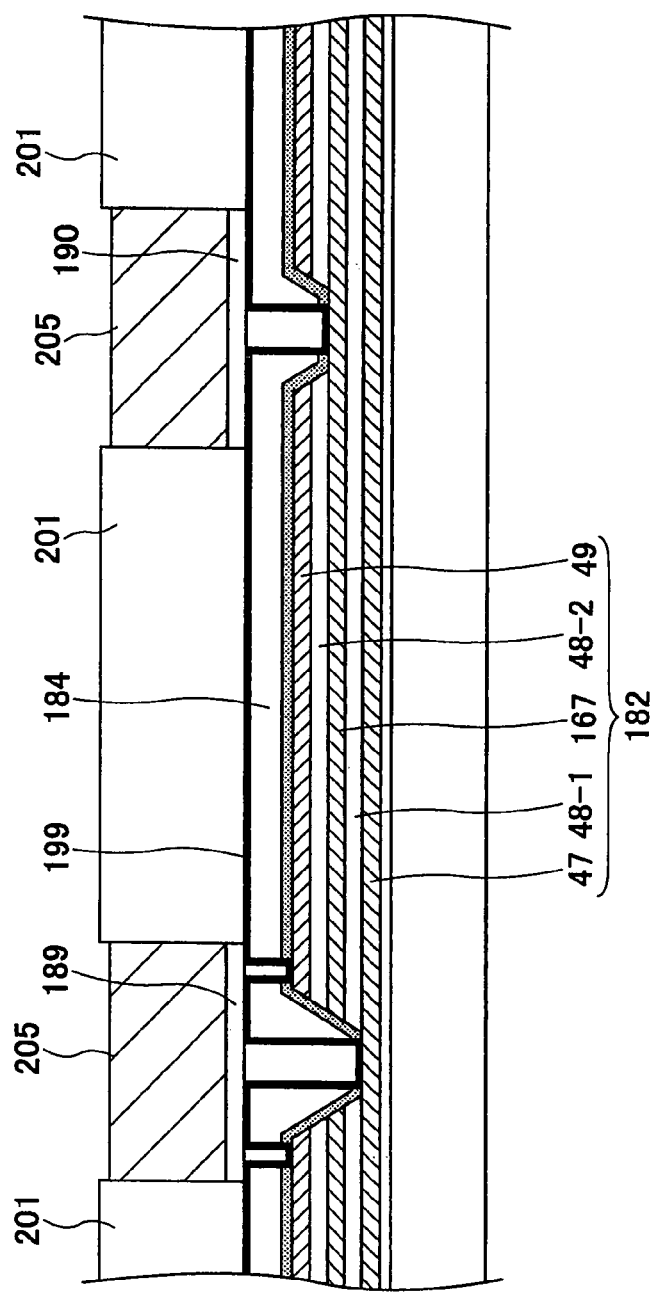

Next, in the process of FIG. 23H, a conductive material 205 of Sn—Ag solder is formed on the pad electrodes 189 and 190. Next, the resist layer 201 is removed. The conductive material 205 is later reflowed so as to serve as the external connection terminals 192 and 193.

Figure 23I:
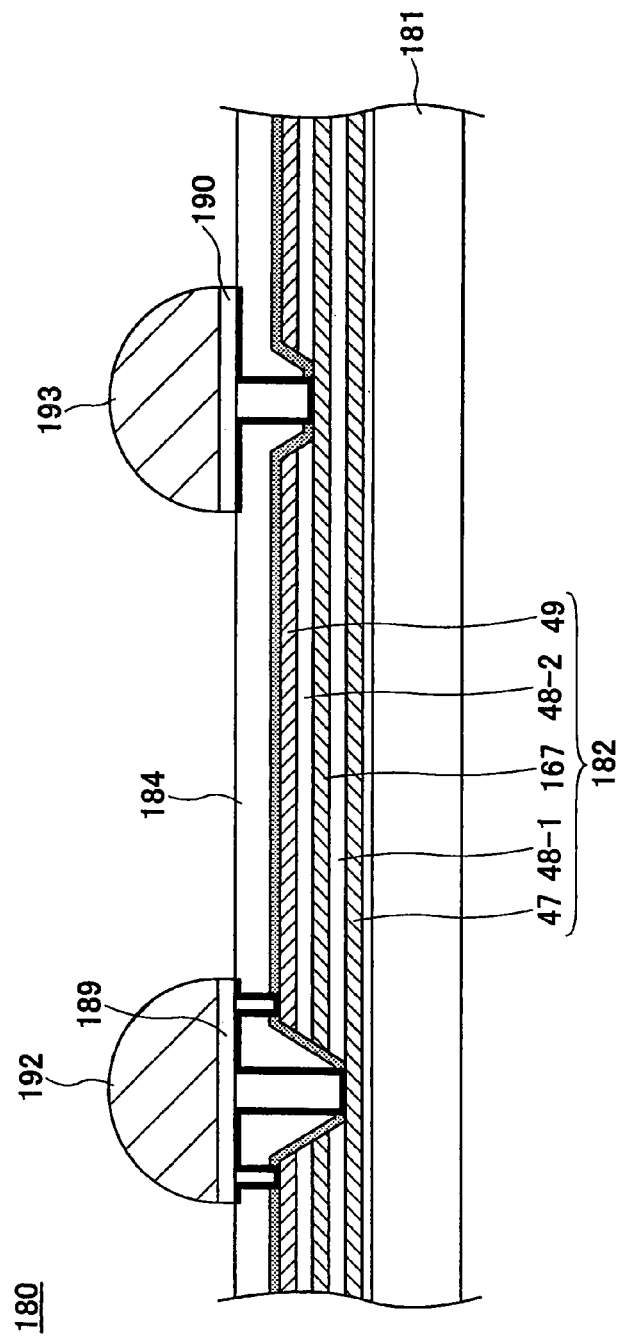

Next, in the process of FIG. 23I, an unnecessary part of the metal film 199 not covered with the pad electrodes 189 and 190 is removed.

Next, the conductive material 205 is reflowed by heating, so that the external connection terminals 192 and 193 are formed. Thereafter, the Si substrate 181 is cut by dicing, so that the capacitor structure 180 is formed.

According to the capacitor structure manufacturing method of this embodiment, the thin film capacitor 182 is formed between the paired pad electrodes 189 and 190, and of the multiple electrodes 47, 167, and 49 of the thin film capacitor 182, the odd-numbered electrodes 47 and 49 from the substrate 181 side are electrically connected to the pad electrode 189 through the vertical interconnection lines 185 and 186, and the even-numbered electrode 167 from the substrate 181 side is electrically connected to the pad electrode 190 through the vertical interconnection line 187. Thereby, it is possible to reduce impedance by reducing the inductance of interconnection lines by reducing interconnection line length required in connecting the capacitors D1 and D2 of substantially the same capacitance in parallel (using the thin film capacitor 182 as a decoupling capacitor).

Further, by stacking the lower electrode film 47A, the dielectric film 48-1A, the intermediate film 167A, the dielectric film 48-2A, and the upper electrode film 49A in sequence in a vacuum, it is possible to prevent dust or foreign materials from adhering to the stacked films 47A, 48-1A, 167A, 48-2A, and 49A, and to prevent the surface of each of the films 47A, 48-1A, 167A, 48-2A, and 49A from being contaminated. Accordingly, it is possible to increase the yield of the thin film capacitor 182.

Further, by performing patterning after forming the stacked films 47A, 48-1A, 167A, 48-2A, and 49A on the even planar insulating film 45, it is possible to increase the yield of the thin film capacitor 182.

Further, by patterning the stacked films 47A, 48-1A, 167A, 48-2A, and 49A together with a single mask, it is possible to reduce the manufacturing costs of the capacitor structure 180 compared with the case of performing patterning with a mask being prepared for each of the films 47A, 48-1A, 167A, 48-2A, and 49A.

A thin film capacitor of a three-layer structure of the lower electrode 47, the dielectric film 48-1, the intermediate electrode 167, the dielectric film 48-2, the intermediate electrode 167, the dielectric film 48-3, and the upper electrode 49 formed by the same method as the above-described processes of FIGS. 23A and 23B according to this embodiment (an example) and a conventional thin film capacitor of a three-layer structure formed by performing patterning every time each of the films 47, 48-1, 167, 48-2, 167, 48-3, and 49 is formed (a comparative example) were prepared, and evaluation of the electric characteristics of the example and the comparative example was performed. The example thin film capacitor was formed using the conditions specified in the processes of FIGS. 23A and 23B.

With respect to the example thin film capacitor, the results were a capacitance density of 12 μF/cm$^2$, an ESR (equivalent series resistance) of 0.02Ω, an ESL (equivalent series inductance) of 10 pH, and a withstand voltage of 30 V or over. With respect to the comparative example thin film capacitor, the results were a capacitance density of 12 μF/cm$^2$, an ESR (equivalent series resistance) of 0.02Ω, an ESL (equivalent series inductance) of 10 pH, and a withstand voltage of 20 V or less.

These results confirmed that it is possible to form a thin film capacitor with large capacitance, reduced ESL, and an excellent withstand voltage characteristic according to this embodiment.

Further, thin film capacitors of a single-layer structure of the lower electrode 47, the dielectric film 48, and the upper electrode 49 formed by the same method as the above-described processes of FIGS. 23A and 23B according to this embodiment (examples) and conventional thin film capacitors of a single-layer structure formed by performing patterning every time each of the films 47, 48, and 49 is formed (comparative examples) were prepared, and evaluation of the defect rates of both types of thin film capacitors (of the example and the comparative example) having a withstand voltage of 10 V or over was performed. The example thin film capacitors were formed using the conditions specified in the processes of FIGS. 23A and 23B.

Figure 24:
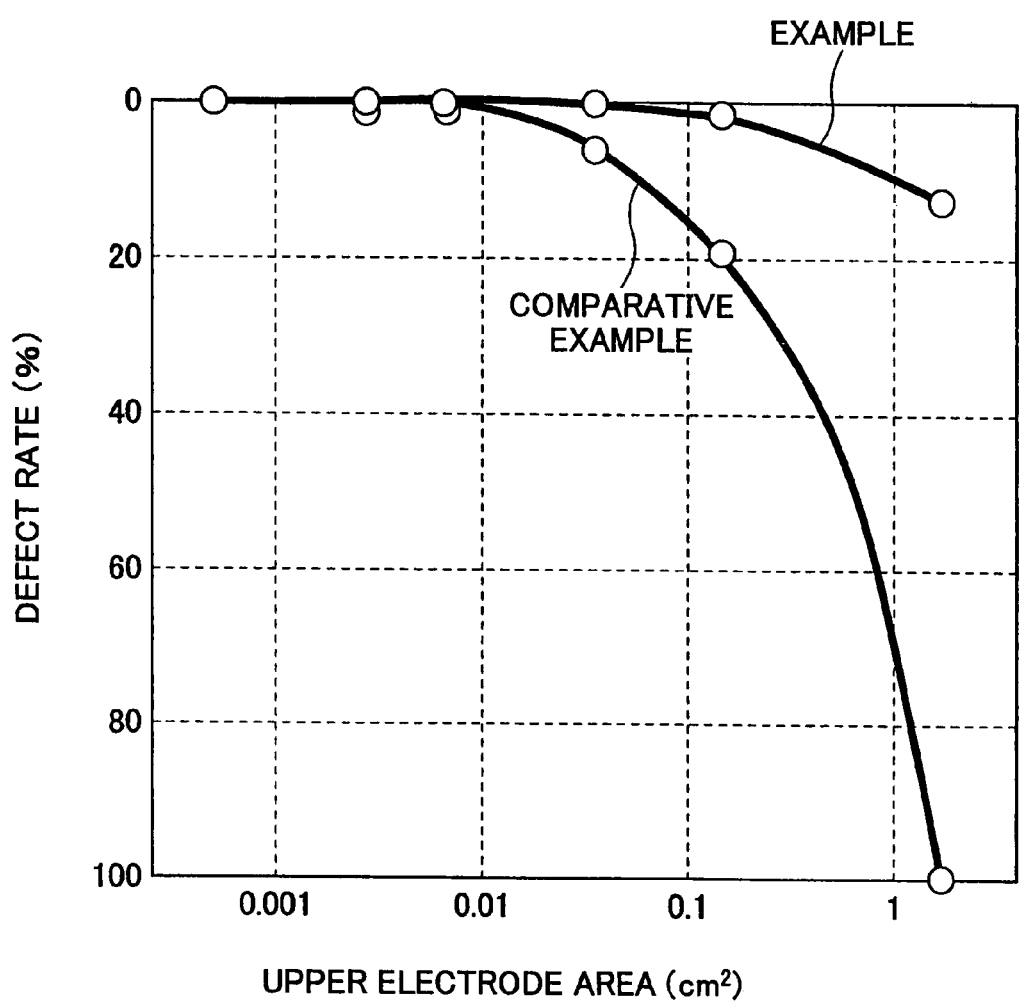
FIG. 24 is a graph showing the relationship between electrode area and defect rate of an example thin film capacitor and its comparative example according to the fifth embodiment of the present invention.

FIG. 24 is a graph showing the relationship between electrode area and defect rate of each type of thin film capacitor. The upper electrode area in FIG. 24 refers to the contact area of the upper electrode 49 with the dielectric film 48.

As shown in FIG. 24, as the area of the upper electrode 49 increases, the defect rate of the comparative example thin film capacitor increases sharply. On the other hand, the defect rate of the example thin film capacitor hardly increases as the area of the upper electrode 49 increases. Specifically, for example, when the area of the upper electrode 49 is 1 cm$^2$, the yield of the comparative example is 32% (the defect rate is 68%) while the yield of the example is 92% (the defect rate is 8%).

These results confirmed that the example thin film capacitor can have a better yield than the comparative example thin film capacitor. Further, since the above-described results have been obtained for the single-layer thin film capacitor according to this embodiment, the difference in yield is presumed to be more remarkable for a multilayer thin film capacitor formed by the same method.

Figure 25:
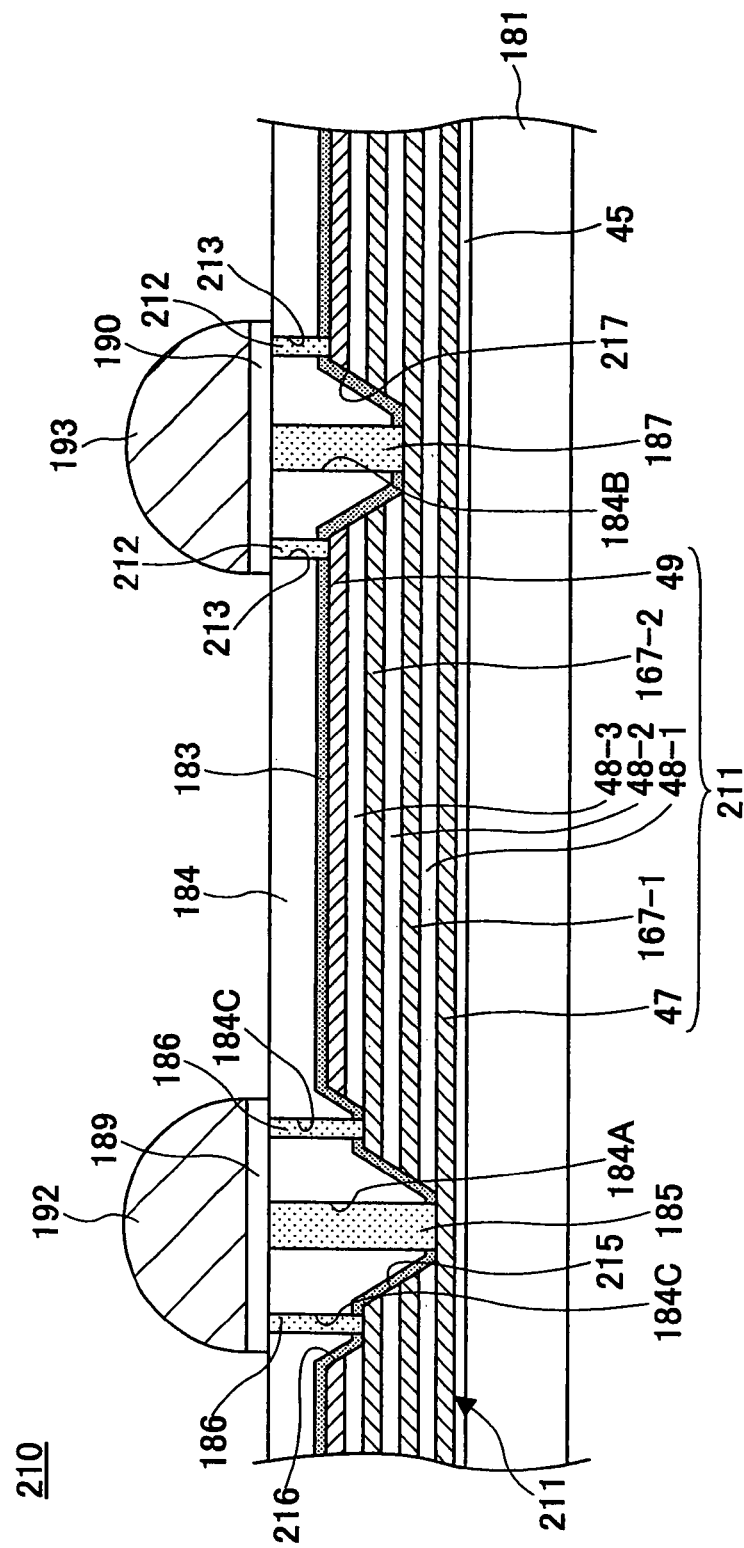
FIG. 25 is a cross-sectional view of a capacitor structure according to a first variation of the fifth embodiment of the present invention.

FIG. 25 is a cross-sectional view of a capacitor structure 210 according to a first variation of the fifth embodiment. In FIG. 25, the same elements as those of the capacitor structure 180 (FIG. 20) according to the fifth embodiment are referred to by the same numerals, and a description thereof is omitted.

Referring to FIG. 25, the capacitor structure 210 has the same configuration as the capacitor structure 180 of the fifth embodiment except that a thin film capacitor 211 of a three-layer structure replaces the thin film capacitor 182 provided in the above-described thin film capacitor 180 and that vertical interconnection lines 212 are further provided.

The thin film capacitor 211 includes the lower electrode 47, the first dielectric film 48-1, the intermediate electrode 167-1, the second dielectric film 48-2, the intermediate electrode 167-2, the third dielectric film 48-3, and the upper electrode 49, which are stacked successively in the order described.

Opening parts (holes) 215 and 216 are formed in a thin film capacitor multilayer body including the thin film capacitor 211 below the pad electrode 189. The opening part 215 exposes the upper surface of the lower electrode 47 and defines the end face of each of the intermediate electrodes 167-1 and 167-2. The opening part 216 exposes the upper surface of the intermediate electrode 167-2 and defines the end face of the upper electrode 49.

The opening part 215 is shaped like a substantially inverse truncated cone, tapered in a direction from the bottom surface of the pad electrode 189 to the substrate 181. That is, in the opening part 215, the distance between the opposing sides of the end face of the electrode (or the diameter of the opening) is gradually reduced in the direction from the bottom surface of the pad electrode 189 to the substrate 181. In other words, the area of a cross section of the opening part 215 perpendicular to its axis is reduced in the direction from the bottom surface of the pad electrode 189 to the substrate 181.

The opening part 216 is shaped like a substantially inverse truncated cone, tapered in a direction from the bottom surface of the pad electrode 189 to the substrate 181. That is, in the opening part 216, the distance between the opposing sides of the end face of the electrode (or the diameter of the opening)

is gradually reduced in the direction from the bottom surface of the pad electrode 189 to the substrate 181. In other words, the area of a cross section of the opening part 216 perpendicular to its axis is reduced in the direction from the bottom surface of the pad electrode 189 to the substrate 181.

An opening part (hole) 217 is formed in the thin film capacitor multilayer body including the thin film capacitor 211 below the pad electrode 190. The opening part 217 exposes the upper surface of the intermediate electrode 167-1 and defines the end face of each of the intermediate electrode 167-2 and the upper electrode 49. The opening part 217 is shaped like a substantially inverse truncated cone, tapered in a direction from the bottom surface of the pad electrode 190 to the substrate 181. That is, in the opening part 217, the distance between the opposing sides of the end face of the electrode (or the diameter of the opening) is gradually reduced in the direction from the bottom surface of the pad electrode 190 to the substrate 181. In other words, the area of a cross section of the opening part 217 perpendicular to its axis is reduced in the direction from the bottom surface of the pad electrode 190 to the substrate 181.

Providing the opening parts 215 through 217 having such a shape in the thin film capacitor multilayer body including the thin film capacitor 211 makes it possible to connect the pad electrodes 189 and 190 and the electrodes 47, 167-1, 167-2, and 49 through the vertical interconnection lines 185 through 187 and 212. In FIG. 25, each of the opening parts 215 through 217 has a substantially inverse truncated cone-like shape. Alternatively, the opening parts 215 through 217 may have substantially inverse truncated pyramid-like shapes. The opening parts 215 through 217 may be formed by the same method as the process of FIG. 23B.

Figure 26:
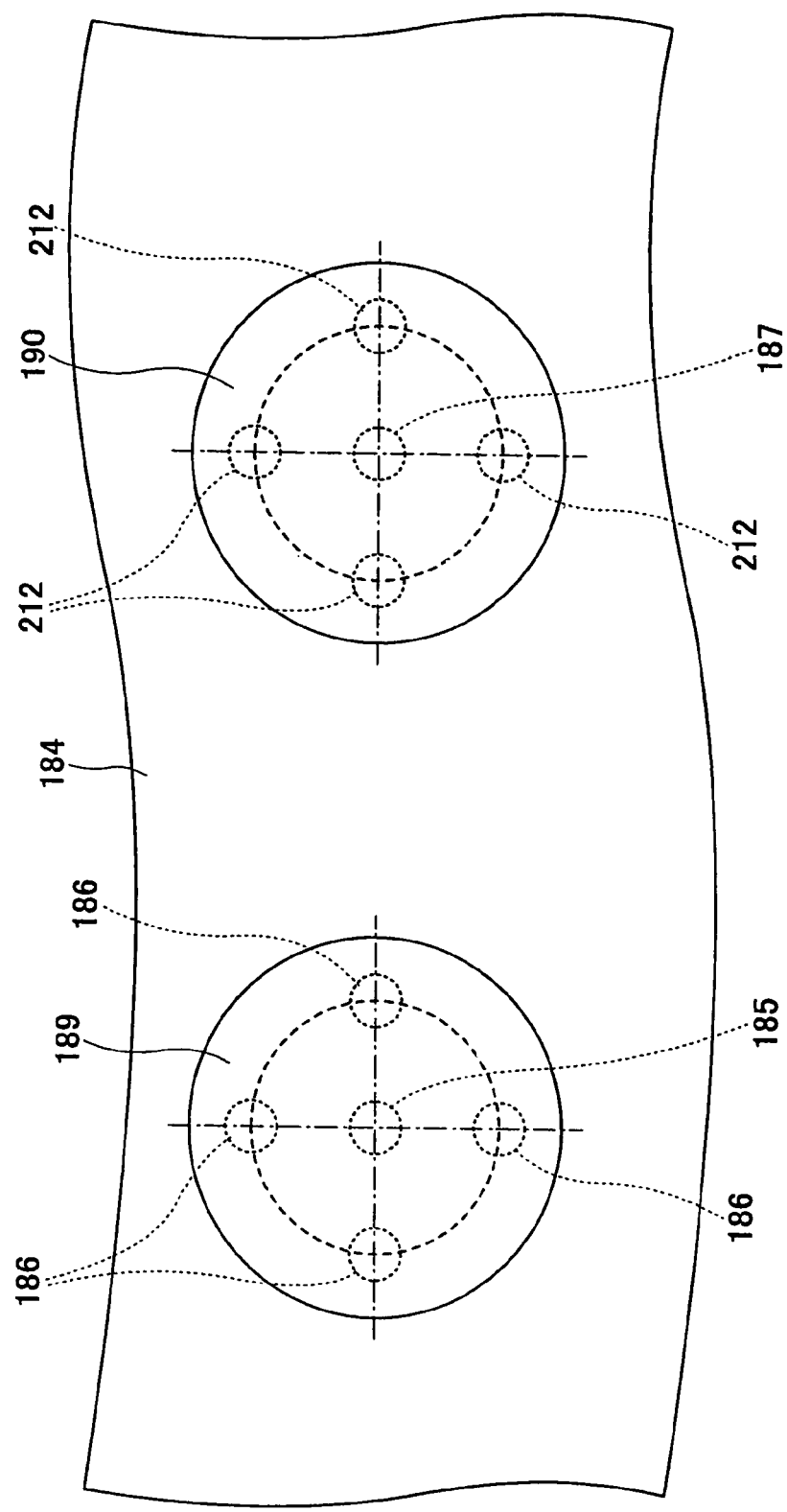
FIG. 26 is a diagram for illustrating the positions of disposition of vertical interconnection lines according to the first variation of the fifth embodiment of the present invention.

FIG. 26 is a diagram for illustrating the positions of disposition of the vertical interconnection lines 185 through 187 and 212.

Referring to FIGS. 25 and 26, the vertical interconnection line 185 is provided in the insulating film 184 so as to electrically connect the lower electrode 47 and the pad electrode 189. The multiple vertical interconnection lines 186 are provided in the insulating film 184 so as to electrically connect the intermediate electrode 167-2 and the pad electrode 189. The vertical interconnection lines 186 are disposed in a circle centered on the center axis of the vertical interconnection line 185 so that the circle is concentric with the vertical interconnection line 185. The vertical interconnection line 187 is provided in the insulating film 184 so as to electrically connect the intermediate electrode 167-1 and the pad electrode 190. The vertical interconnection lines 212 are provided in the insulating film 184 so as to extend from the bottom surface of the pad electrode 190 to the upper surface of the upper electrode 49. The vertical interconnection lines 212 electrically connect the upper electrode 49 and the pad electrode 190. The vertical interconnection lines 212 are disposed in a circle centered on the center axis of the vertical interconnection line 187 so that the circle is concentric with the vertical interconnection line 187.

The pad electrode 189 is electrically connected to the odd-numbered ones of the electrodes 47, 167-1, 167-2, and 49 from the substrate 181 side, that is, the first electrode 47 and the third electrode 167-2, through the vertical interconnection lines 185 and 186.

The pad electrode 190 is electrically connected to the even-numbered ones of the electrodes 47, 167-1, 167-2, and 49 from the substrate 181 side, that is, the second electrode 167-1 and the fourth electrode 49, through the vertical interconnection lines 187 and 212.

The capacitor structure 210 having the thin film capacitor 211 of such a three-layer structure can also produce the same effects as the capacitor structure 180 according to the fifth embodiment. Further, a capacitor structure having a thin film capacitor of a structure of four or more layers can also produce the same effects as the capacitor structure 180 according to the fifth embodiment. The capacitor structure 210 may be manufactured by the same method as the above-described processes of FIGS. 23A through 23I.

In FIG. 26, each of the vertical interconnection lines 212 has a cylindrical shape. However, the vertical interconnection lines 212 are not limited to this shape, and may also have quadrangular prism shapes. As the material of the vertical interconnection lines 212, the same material as that of the vertical interconnection lines 185 through 187 may be used.

Figure 27:
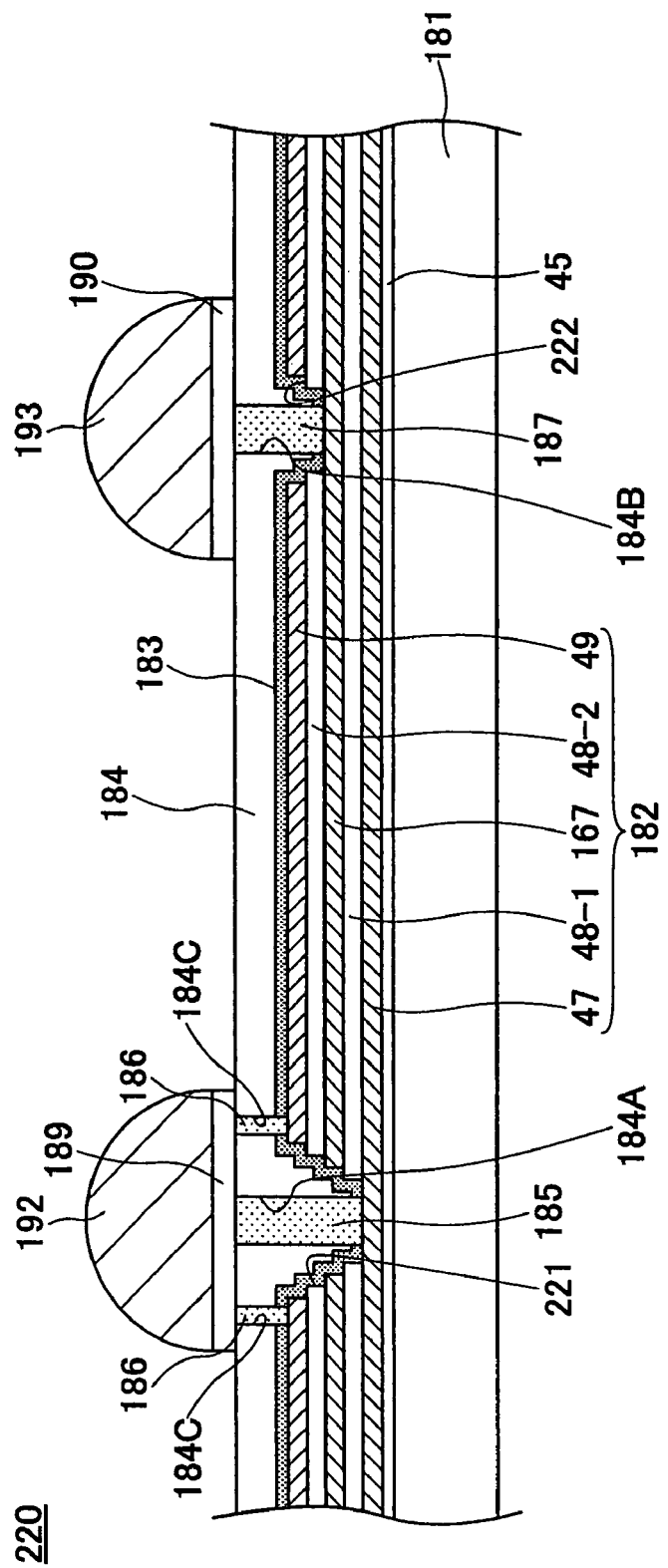
FIG. 27 is a cross-sectional view of a capacitor structure according to a second variation of the fifth embodiment of the present invention.

FIG. 27 is a cross-sectional view of a capacitor structure 220 according to a second variation of the fifth embodiment. In FIG. 27, the same elements as those of the capacitor structure 180 (FIG. 20) according to the fifth embodiment are referred to by the same numerals, and a description thereof is omitted.

Referring to FIG. 27, the capacitor structure 220 is configured in the same manner as the above-described thin film capacitor 180 except that a corresponding mask is prepared for each of the electrodes 47, 49, and 167 and the two dielectric films 48-1 and 48-2 forming the thin film capacitor 182, and that patterning is performed through the corresponding mask every time each of the films 47A, 48-1A, 167A, 48-2A, and 49A is formed.

As a result of thus preparing multiple masks and performing patterning every time each of the films 47A, 48-1A, 167A, 48-2A, and 49A is formed, opening parts (holes) 221 and 222 each having a stepped sidewall surface are formed in a thin film capacitor multilayer body (of the films 47A, 48-1A, 167A, 48-2A, and 49A) including the thin film capacitor 182. The opening part 221 is positioned below the pad electrode 189 so as to expose the upper surface of the lower electrode 47 and define the end face of each of the intermediate electrode 167 and the upper electrode 49. The opening part 222 is positioned below the pad electrode 190 so as to expose the upper surface of the intermediate electrode 167 and define the end face of the upper electrode 49.

Thus, the pad electrodes 189 and 190 and the electrodes 47, 167, and 49 may be electrically connected through the vertical interconnection lines 185 through 187 by thus forming the opening parts 221 and 222 having a step-like sidewall surface in the thin film capacitor multilayer body including the thin film capacitor 182.

Figure 28:
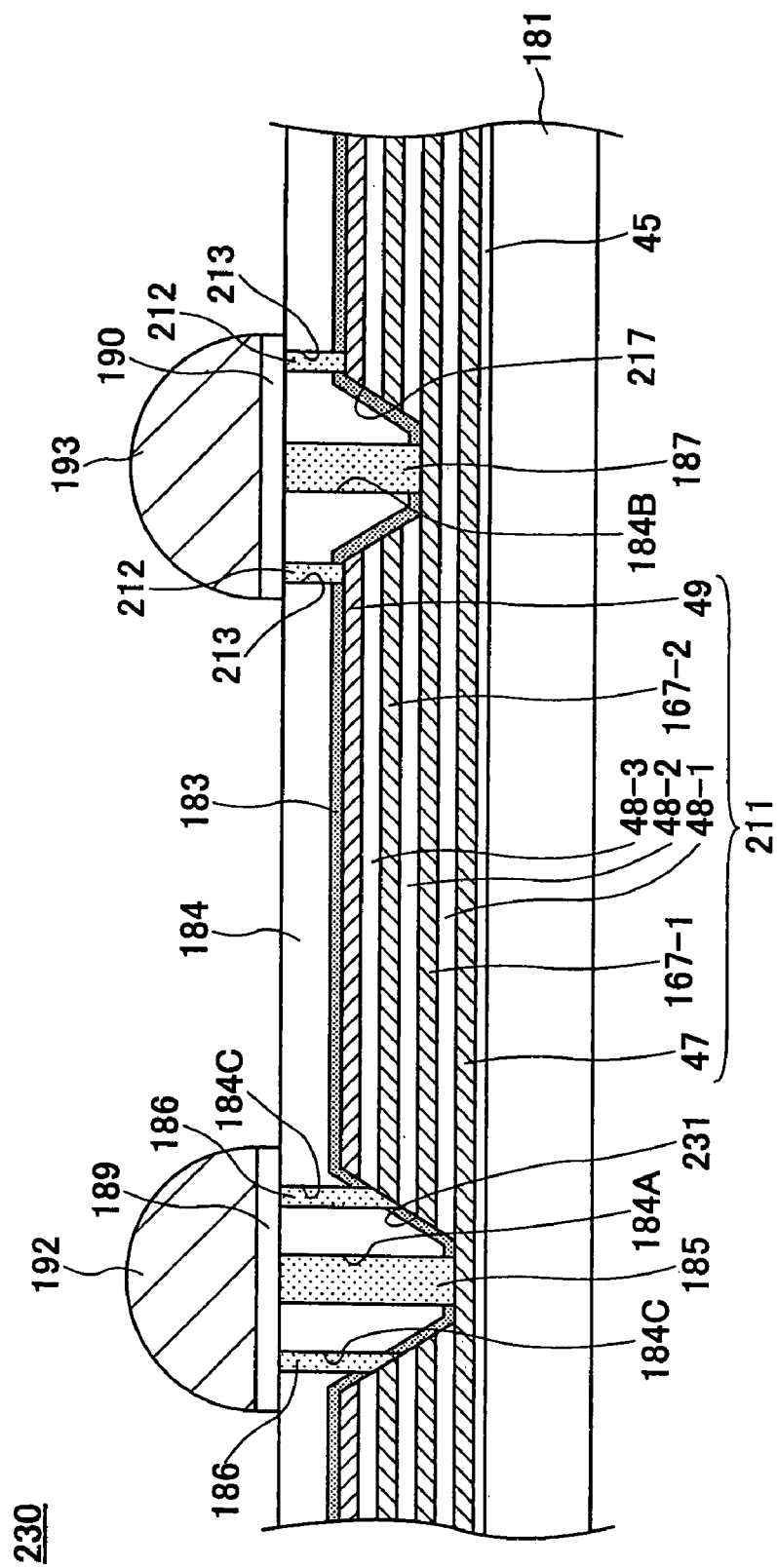
FIG. 28 is a cross-sectional view of a capacitor structure according to a third variation of the fifth embodiment of the present invention.

FIG. 28 is a cross-sectional view of a capacitor structure 230 according to a third variation of the fifth embodiment. In FIG. 28, the same elements as those of the capacitor structure 210 (FIG. 25) according to the first variation of the fifth embodiment are referred to by the same numerals, and a description thereof is omitted.

Referring to FIG. 28, the capacitor structure 230 has the same configuration as the above-described capacitor structure 210 except that an opening part (hole) 231 is provided instead of the opening parts 215 and 216 formed in the thin film capacitor multilayer body including the thin film capacitor 211 of the capacitor structure 210.

The opening part 231 is formed in the thin film capacitor multilayer body including the thin film capacitor 211 below the position of formation of the pad electrode 189. The opening part 231 exposes the upper surface of the lower electrode 47 and defines the end face of each of the electrodes 167-1, 167-2, and 49. The opening part 231 is shaped like a substantially inverse truncated cone, tapered in a direction from the bottom surface of the pad electrode 189 to the substrate 181. That is, in the opening part 231, the distance between the opposing sides of the end face of the electrode (or the diameter of the opening) is gradually reduced in the direction from the bottom surface of the pad electrode 189 to the substrate 181. In other words, the area of a cross section of the opening part 231 perpendicular to its axis is reduced in the direction from the bottom surface of the pad electrode 189 to the substrate 181. The opening part 231 may be formed by the same method as the above-described process of FIG. 23B.

The vertical interconnection lines 186 are provided between the sloped end face of the intermediate electrode 167-2 and the pad electrode 189 in the insulating film 184. The vertical interconnection lines 186 are electrically connected to the end face of the intermediate electrode 167-2 and the pad electrode 189.

By thus forming the opening part 231 exposing the upper surface of the lower electrode 47 in the thin film capacitor multilayer body including the thin film capacitor 211 below the pad electrode 189, it is possible to simplify the manufacturing process and reduce the manufacturing costs of the capacitor structure 230 compared with the case of forming the two opening parts 215 and 216.

Figure 29:
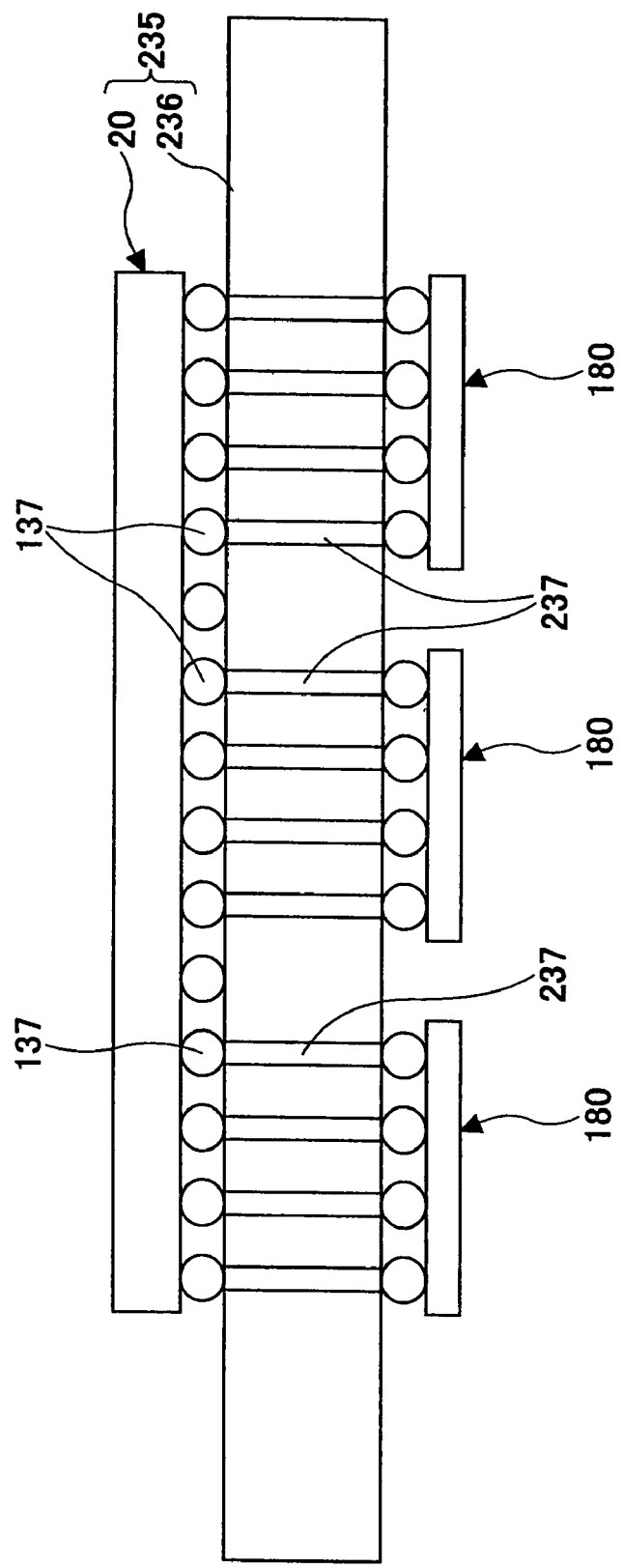
FIG. 29 is a diagram showing an embodiment of mounting a capacitor structure according to the fifth embodiment of the present invention.

FIG. 29 is a diagram showing an embodiment of mounting a capacitor structure. FIG. 29 shows the case of mounting the capacitor structures 180 according to this embodiment on a circuit board 236.

As shown in FIG. 29, a semiconductor device 235 includes the semiconductor chip 20 and the circuit board 236 including multiple through vias 237. The semiconductor chip 20 is electrically connected through the solder balls 137 to the through vias 237 on the first main surface side of the circuit board 236. The capacitor structures 180 are electrically connected to the through vias 237 on the second main surface side of the circuit board 236. As a result, the thin film capacitors 182 (not graphically illustrated) of the capacitor structures 180 are electrically connected to corresponding power supply connection pads and ground connection pads of the semiconductor chip 20.

Thus, the capacitor structure 180 may be applied to, for example, the semiconductor device 235 having the semiconductor chip 20 and the circuit board 236 having the multiple through vias 237.

In FIG. 29, the capacitor structures 180 are shown by way of example. Alternatively, any of the capacitor structures 210 through 230 according to the first through third variations of this embodiment may be provided instead of each capacitor structure 180.

Sixth Embodiment

Figure 30:
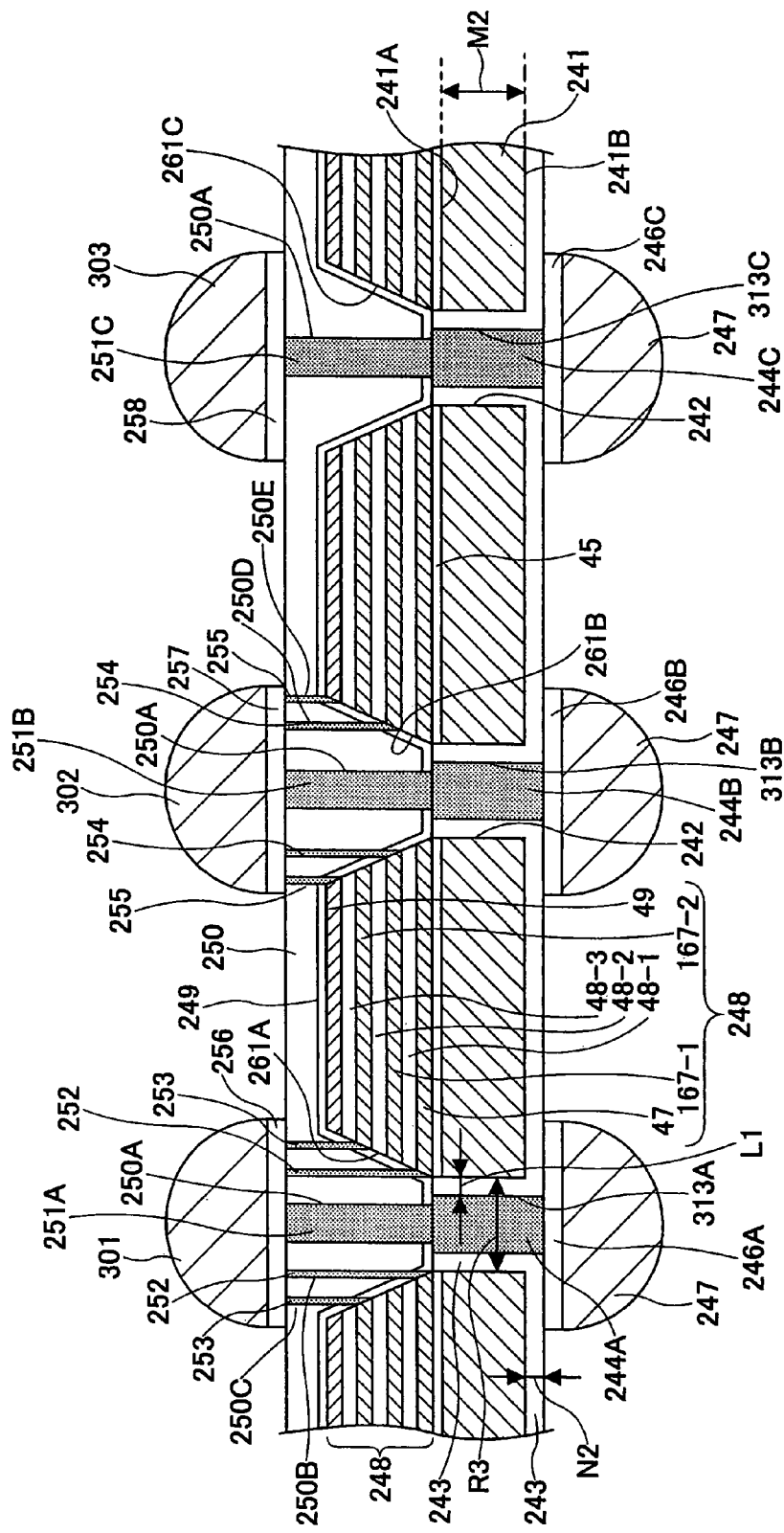
FIG. 30 is a cross-sectional view of a semiconductor device according to a sixth embodiment of the present invention.

FIG. 30 is a cross-sectional view of a semiconductor device 240 according to a sixth embodiment of the present invention. In FIG. 30, the same elements as those described above are referred to by the same numerals, and a description thereof is omitted.

Referring to FIG. 30, the semiconductor device 240 includes a Si substrate 241, the insulating film 45, an insulating film 250, insulating material 243, through vias 244A through 244C, pad electrodes 246A through 246C and 256 through 258, external connection terminals 247 and 301 through 303, thin film capacitors 248 of a three-layer structure, a protection film 249, vias 251A through 251C, and vertical interconnection lines 252 through 255. According to this embodiment, the thin film capacitors 248 may be physically separated from or connected to one another.

The Si substrate 241 is thinned down, and has through holes 242 of a diameter R3 formed therein. The through holes 242 correspond to the positions of formation of the through vias 244A through 244C. The diameter D3 of the through holes 242 is greater than the diameter of the through vias 244A and 244C.

By thus making the diameter R3 of the through holes 242 greater than the diameter of the through vias 244A and 244C, it is possible to facilitate formation of a layer of the insulating material 243 between the Si substrate 241 and the through vias 244A through 244C.

Further, the thickness M2 of the thinned Si substrate 241 is less than the diameter R3 of the through holes 242. By thus forming the through holes 242 of the diameter R3 greater than that of the through vias 244A through 244C in the thinned Si substrate 241, it is possible to form good through holes 242 with a reduced aspect ratio (thickness M2/diameter R3).

The diameter R3 of the through holes 242 may be, for example, 100 μm. Further, the pitch at which the through holes 242 are formed may be, for example, 150 μm to 250 μm. The diameter R3 of and the pitch for the through holes 242 are not limited to the above-described numeric values.

Preferably, the thickness M2 of the Si substrate 241 is within the range of 30 μm to 100 μm. The Si substrate 241 has insufficient strength with the thickness M2 being less than 30 μm. If the thickness M2 is greater than 100 μm, the aspect ratio (M2/R3) of the through holes 242 becomes high, so that it is difficult to form the through holes 242.

The insulating film 45 is provided so as to cover an upper surface 241A of the Si substrate 241. The insulating material 243 is formed between the Si substrate 241 and the through vias 244A through 244C and on a lower surface 241B of the Si substrate 241. Further, through holes 313A through 313C passing through the insulating material 243 and the insulating film 45 are formed at positions corresponding to the positions of formation of the through holes 242.

The thickness L1 of the insulating material 243 between the Si substrate 241 and the through vias 244A through 244C may be, for example, 0.05 μm to 50 μm. Further, the thickness N2 of the insulating material 243 on the lower surface 241B of the Si substrate 241 may be, for example, 0.05 μm to 10 μm. The same material as that of the insulating material 39 described in the first embodiment may be used for the insulating material 243.

The through vias 244A through 244C are provided in the through holes 313A through 313C, respectively. The through via 244A electrically connects the via 251A and the pad electrode 246A. The through via 244B electrically connects the via 251B and the pad electrode 246B. The through via 244C electrically connects the via 251C and the pad electrode 246C. As the material of the through vias 244A through 244C, for example, conductive paste may be used. Specifically, a mixture of conductive particles of carbon, silver, or copper and a viscous binder may be used as the conductive paste. The diameter of the through vias 244A through 244C may be, for instance, 70 μm.

The pad electrode 246A is provided on the insulating material 243 at a position corresponding to the position of formation of the through via 244A so as to be electrically connected to the through via 244A. The pad electrode 246B is provided on the insulating material 243 at a position corresponding to the position of formation of the through via 244B so as to be electrically connected to the through via 244B. The pad electrode 246C is provided on the insulating material 243 at a position corresponding to the position of formation of the through via 244C so as to be electrically connected to the through via 244C.

The external connection terminals 247 are provided on the corresponding pad electrodes 246A through 246C. The external connection terminals 247 are electrically connected to, for example, a circuit board not graphically illustrated. A conductive material such as Sn—Ag solder may be used as the material of the external connection terminals 247.

Each thin film capacitor 248 is provided on the insulating film 45 between the corresponding paired pad electrodes 256 and 257. Each thin film capacitor 248 is disposed between the corresponding external connection terminal 301 connected to a power supply connection pad of a semiconductor chip (not graphically illustrated) and the corresponding external connection terminal 302 connected to a ground connection pad of the semiconductor chip (not graphically illustrated).

Each thin film capacitor 248 includes the lower electrode 47, the first dielectric film 48-1, the intermediate electrode 167-1, the second dielectric film 48-2, the intermediate electrode 167-2, the third dielectric film 48-3, and the upper electrode 49, which are stacked in the order described. At least one opening part (hole) 261A exposing the through via 244A, at least one opening part (hole) 261B exposing the through via 244B, and at least one opening part (hole) 261C exposing the through via 244C are formed in a thin film capacitor multilayer body including the thin film capacitors 248.

Each of the opening parts 261A through 261C defines end faces of the electrodes 47, 167-1, 167-2, and 49 of the corresponding thin film capacitors 248. The opening parts 261A through 261C are shaped like a substantially inverse truncated cone, tapered in a direction from the bottom surface of the corresponding pad electrodes 256 through 258 to the substrate 241. That is, in the opening parts 261A through 261C, the distance between the opposing sides of the end face of the electrode (or the diameter of the opening) is gradually reduced in the direction from the bottom surface of the corresponding pad electrodes 256 through 258 to the substrate 241. In other words, the area of a cross section of each of the opening parts 261A through 261C perpendicular to its axis is reduced in the direction from the bottom surface of the corresponding pad electrodes 256 through 258 to the substrate 241. The end faces of the electrodes 47, 167-1, 167-2, and 49 formed in each of the opening parts 261A through 261C are sloped. This allows the vertical interconnection lines 252 and 253 to be connected to the end face of the electrode 47 and the end face of the electrode 167-2, respectively, in the opening part 261A, and allows the vertical interconnection lines 254 and 255 to be connected to the end face of the electrode 167-1 and the end face of the electrode 49, respectively, in the opening part 261B. In FIG. 30, each of the opening parts 261A through 261C has a substantially inverse truncated cone-like shape. Alternatively, the opening parts 261A through 261C may have substantially inverse truncated pyramid-like shapes.

The lower electrode 47 is electrically connected to the pad electrode 256 through the vertical interconnection lines 252. The intermediate electrode 167-1 is electrically connected to the pad electrode 257 through the vertical interconnection lines 254. The intermediate electrode 167-2 is electrically connected to the pad electrode 256 through the vertical interconnection lines 253. The upper electrode 49 is electrically connected to the pad electrode 257 through the vertical interconnection lines 255.

Each thin film capacitor 248 is electrically connected to, for example, a power supply connection pad and a ground connection pad of a semiconductor chip, and serves as a decoupling capacitor so as to absorb noise generated from the semiconductor chip.

The protection film 249 is, for example, 50 nm in thickness, and is provided so as to cover the thin film capacitors 248. The protection film 249 is formed of an insulating material, which is not limited in particular, but is preferably $Si_3N_4$, $SiO_2$, or alumina, which has excellent moisture resistance. Employment of such a material makes it possible to prevent degradation of the dielectric films 48-1 through 48-3 having a perovskite crystal structure.

The insulating film 250 is, for example, 2 μm in thickness, and is provided so as to cover the protection film 249. Opening parts (holes) 250A exposing the through vias 244A through 244C, opening parts 250B exposing the end face of the lower electrode 47, opening parts 250C exposing the end face of the intermediate electrode 167-2, opening parts 250D exposing the end face of the intermediate electrode 167-1, and opening parts 250E exposing the end face of the upper electrode 49 are formed in the insulating film 250 and the protection film 249. The same material as that of the insulating material 39 described in the first embodiment may be used for the insulating film 250.

The vias 251A through 251C are provided in the corresponding opening parts 250A. The via 251A electrically connects the through via 244A and the pad electrode 256. The via 251B electrically connects the through via 244B and the pad electrode 257. The via 251C electrically connects the through via 244C and the pad electrode 258.

The vertical interconnection lines 252 are provided in the corresponding opening parts 250B so as to be electrically connected to the end face of the lower electrode 47 and the pad electrode 256. The vertical interconnection lines 253 are provided in the corresponding opening parts 250C so as to be electrically connected to the end face of the intermediate electrode 167-2 and the pad electrode 256. The vertical interconnection lines 252 and 253 are provided in respective circles concentric with the via 251A.

The vertical interconnection lines 254 are provided in the corresponding opening parts 250D so as to be electrically connected to the end face of the intermediate electrode 167-1 and the pad electrode 257. The vertical interconnection lines 255 are provided in the corresponding opening parts 250E so as to be electrically connected to the end face of the upper electrode 49 and the pad electrode 257. The vertical interconnection lines 254 and 255 are provided in respective circles concentric with the via 251B.

The pad electrode 256 is provided on the insulating film 250 at a position corresponding to the positions of formation of the via 251A and the vertical interconnection lines 252 and 253. The pad electrode 256 is electrically connected to the via 251A and the vertical interconnection lines 252 and 253. Further, the pad electrode 256 is electrically connected to the odd-numbered ones of the stacked electrodes 47, 167-1, 167-2, and 49 from the Si substrate 241 side, that is, the electrodes 47 and 167-2, through the vertical interconnection lines 252 and 253, respectively.

The pad electrode 257 is provided on the insulating film 250 at a position corresponding to the positions of formation of the via 251B and the vertical interconnection lines 254 and 255. The pad electrode 257 is electrically connected to the via 251B and the vertical interconnection lines 254 and 255. Further, the pad electrode 257 is electrically connected to the even-numbered ones of the stacked electrodes 47, 167-1, 167-2, and 49 from the Si substrate 241 side, that is, the electrodes 167-1 and 49, through the vertical interconnection lines 254 and 255, respectively.

The external connection terminal 301 is provided on the pad electrode 256. The external connection terminal 301 is electrically connected to, for example, a power supply connection terminal of a semiconductor chip not graphically illustrated. The external connection terminal 302 is provided on the pad electrode 257. The external connection terminal 302 is electrically connected to, for example, a ground connection terminal of the semiconductor chip not graphically illustrated. The external connection terminal 303 is provided on the pad electrode 258. The external connection terminal 303 is electrically connected to, for example, a signal terminal of the semiconductor chip not graphically illustrated. A conductive material may be used for the material of the external connection terminals 301 through 303. Specifically, for example, Sn—Ag solder may be used. Further, the external connection terminals 301 and 302 may be connected to a ground connection pad and a power supply connection pad, respectively, of the semiconductor chip.

According to the semiconductor device 240 of this embodiment, each thin film capacitor 248 is formed between the corresponding paired electrodes 256 and 257, and of the multiple electrodes 47, 167-1, 167-2, and 49 of the thin film capacitor 248, the odd-numbered electrodes 47 and 167-2 from the Si substrate 241 side are electrically connected to the pad electrode 256 through the vertical interconnection lines 252 and 253, and the even-numbered electrodes 167-1 and 49 from the Si substrate 241 side are electrically connected to the pad electrode 257 through the vertical interconnection lines 254 and 255. Thereby, it is possible to reduce the impedance of the thin film capacitor 248 by reducing the inductance of interconnection lines by reducing interconnection line length required in connecting multiple capacitors of substantially the same capacitance in parallel (using the thin film capacitor 248 as a decoupling capacitor).

Further, since the thickness M2 of the Si substrate 241 may be less than or equal to the diameter R3 of the through holes 242, it is possible to realize the semiconductor device 240 that has the through holes 242 of good accuracy and can support a further increase in density.

Further, when the semiconductor chip (not graphically illustrated) is connected to the external connection terminals 301 through 303, the semiconductor chip is positioned close to the thin film capacitor 248. As a result, equivalent series inductance is reduced, so that the semiconductor chip is operable at high frequencies In this embodiment, the thin film capacitors 248 have a three-layer structure. Alternatively, the thin film capacitors 248 may have a two-layer structure or a structure of four or more layers and can produce the same effects.

In this embodiment, the semiconductor device 240 has the external connection terminals 247 and 301 through 303. Alternatively, the external connection terminals 247 and 301 through 303 may be omitted, and the pad electrodes 246A through 246C and 256 through 258 may be used as external connection terminals.

Figure 31:
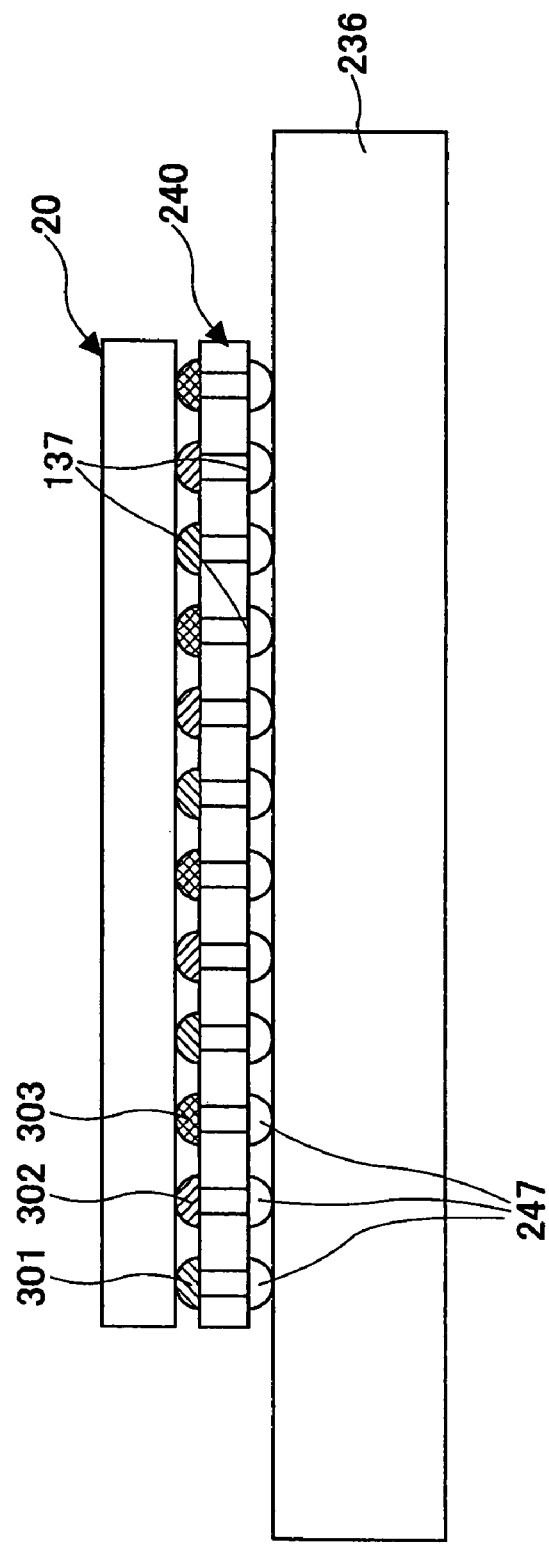
FIG. 31 is a diagram showing an embodiment of mounting a semiconductor device according to the sixth embodiment of the present invention.

FIG. 31 is a diagram showing an embodiment of mounting the semiconductor device 240 according to the sixth embodiment of the present invention.

As shown in FIG. 31, the semiconductor device 240 is used in, for instance, electrically connecting the semiconductor chip 20 and the circuit board 236. In this case, the semiconductor chip 20 is connected to the external connection terminals 301 through 303, and the circuit board 236 is connected to the external connection terminals 247.

Figure 32A:
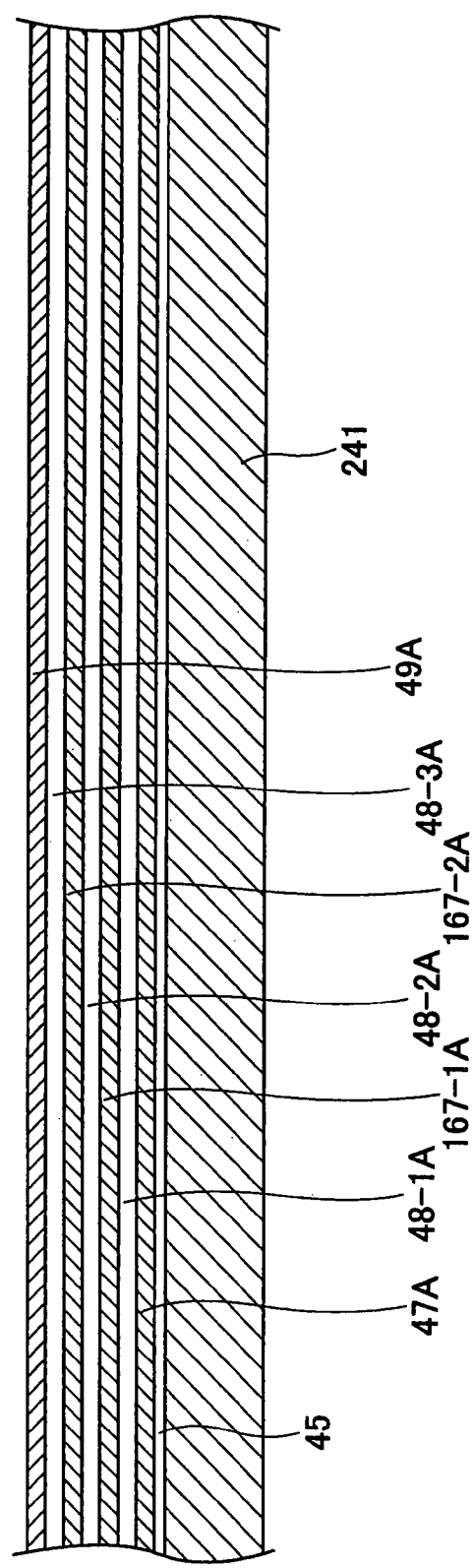
FIGS. 32A through 32P are diagrams showing a process of manufacturing a semiconductor device according to the sixth embodiment of the present invention.
Figure 32B:
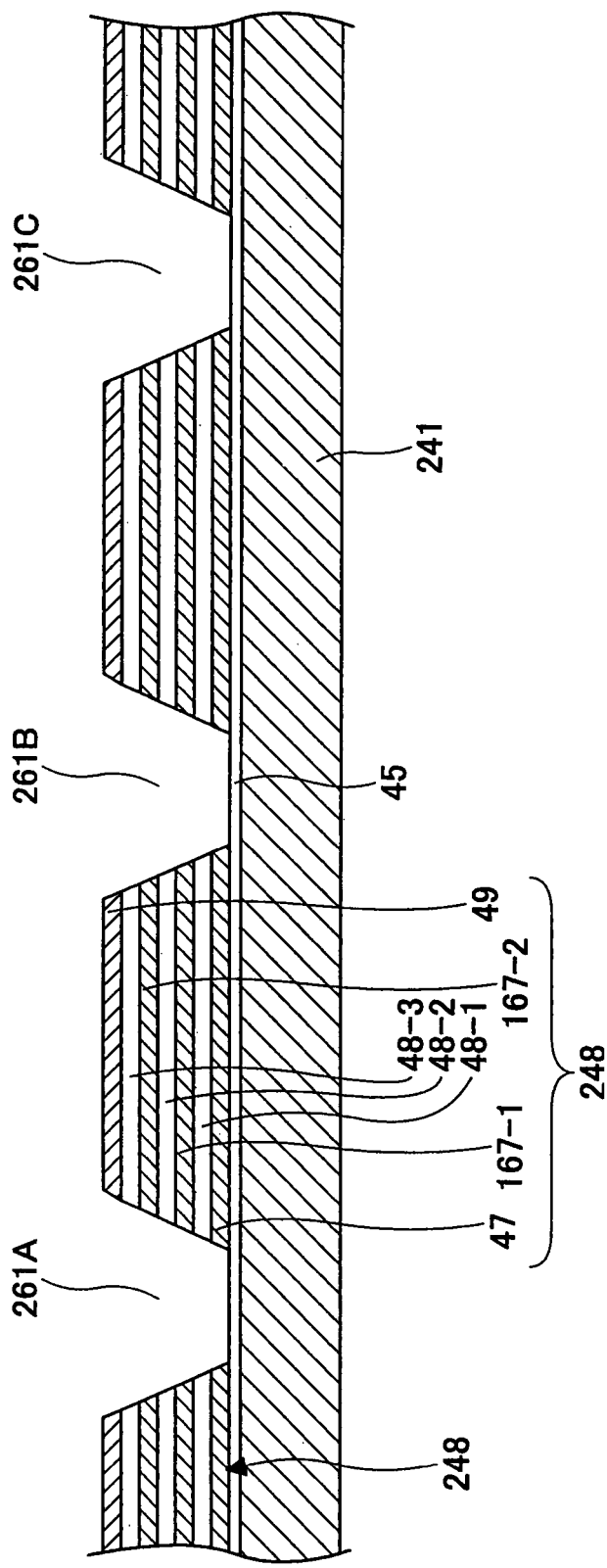
Figure 32D:
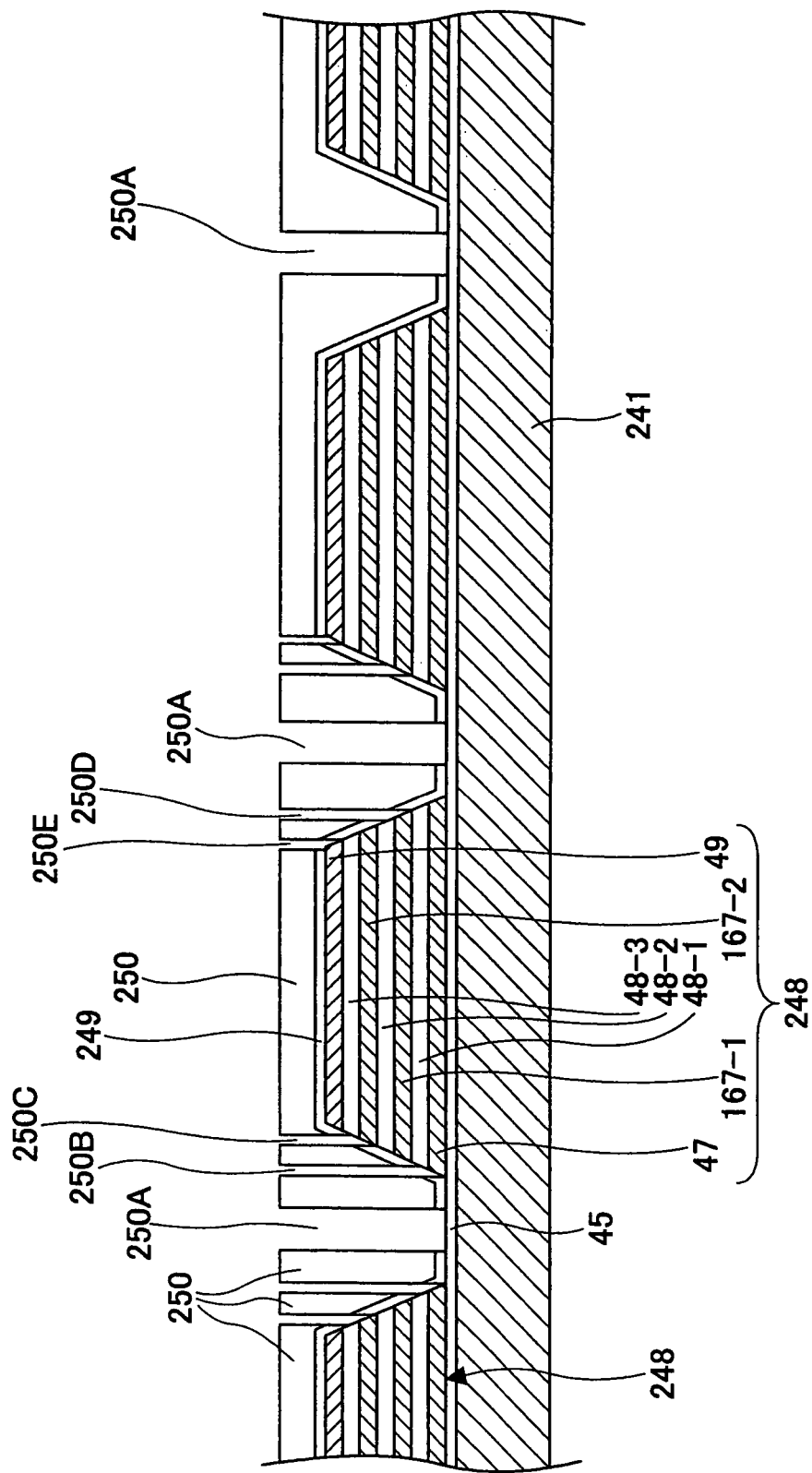
Figure 32E:
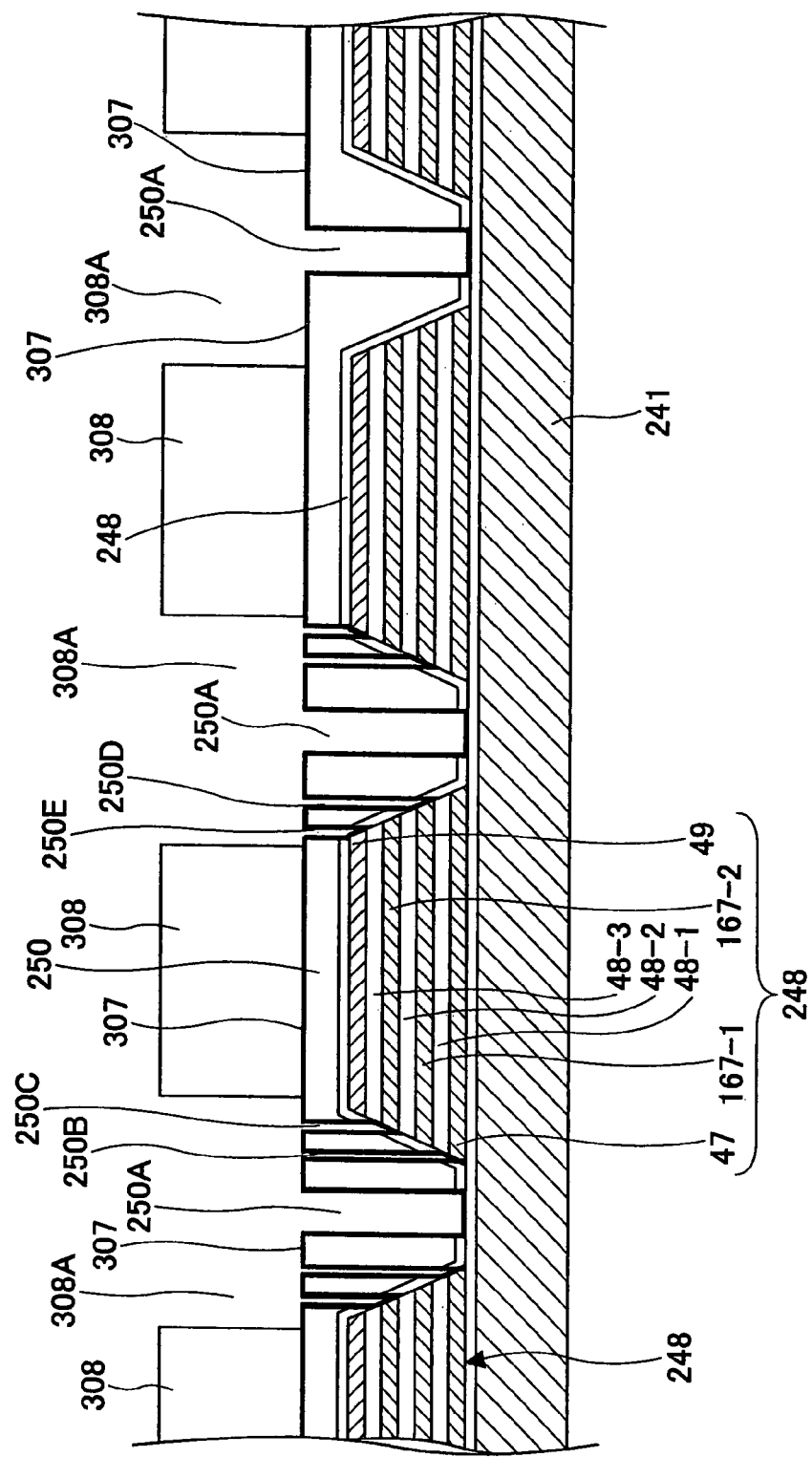
Figure 32G:
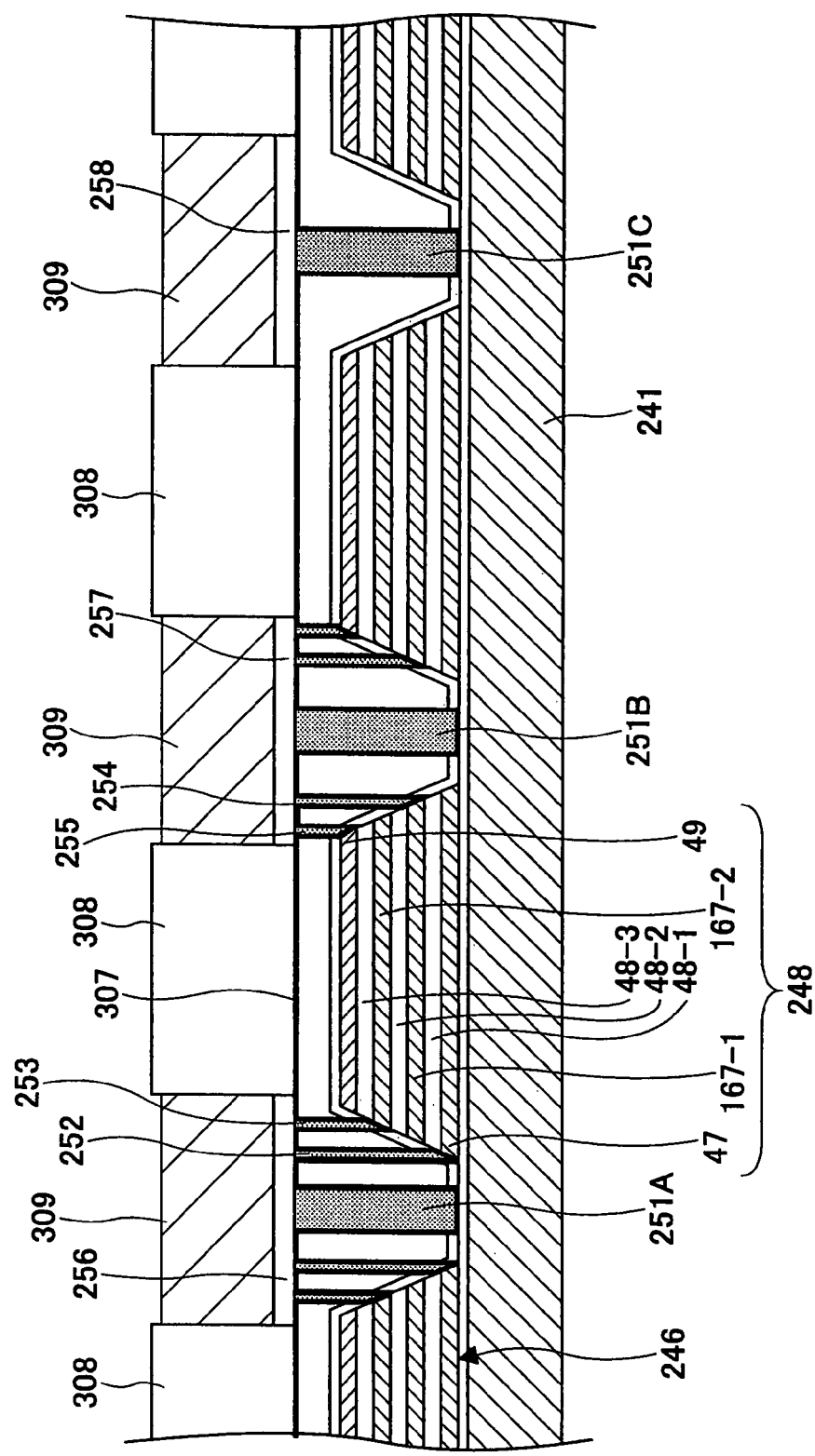
Figure 32H:
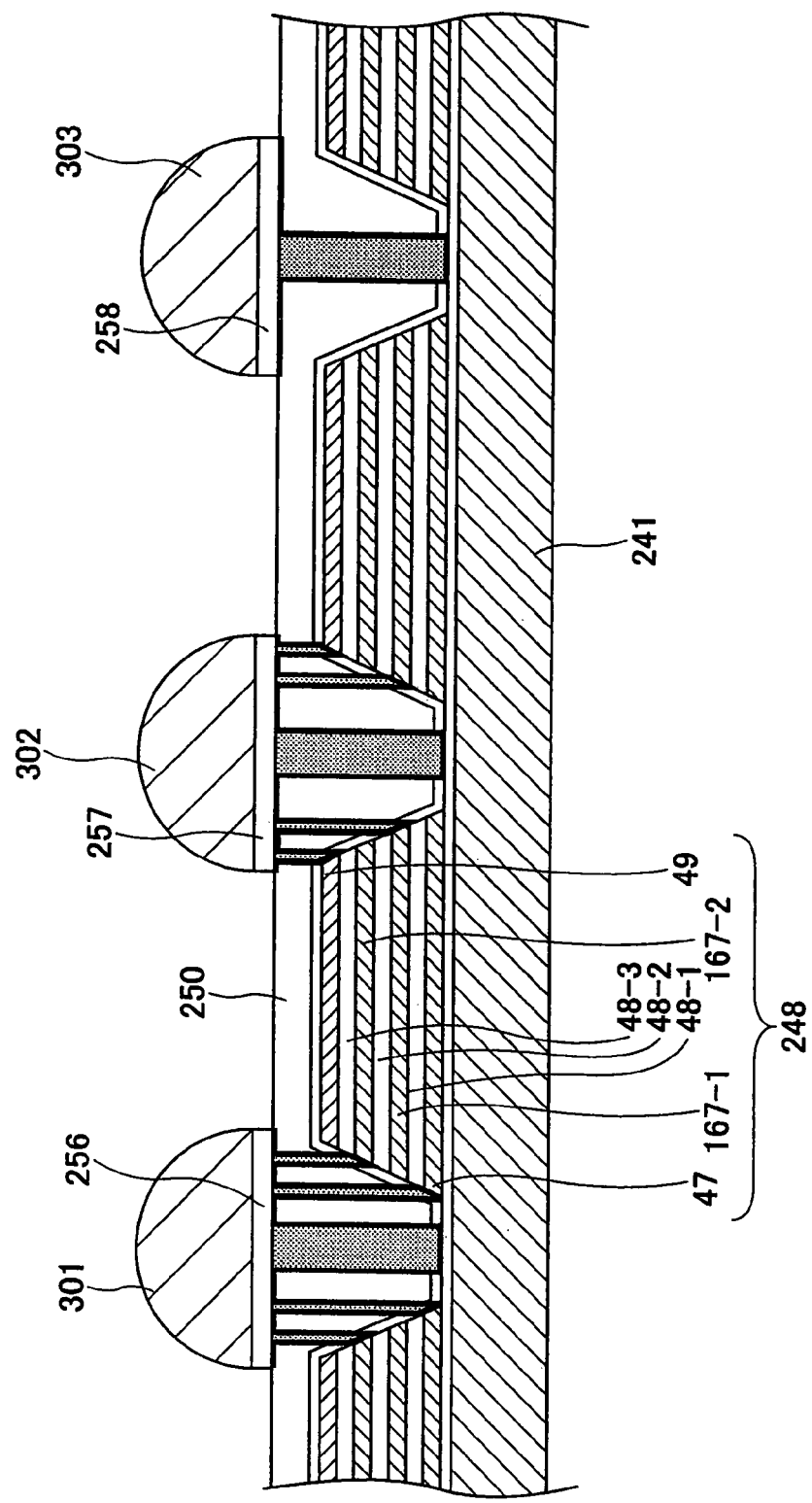
Figure 32I:
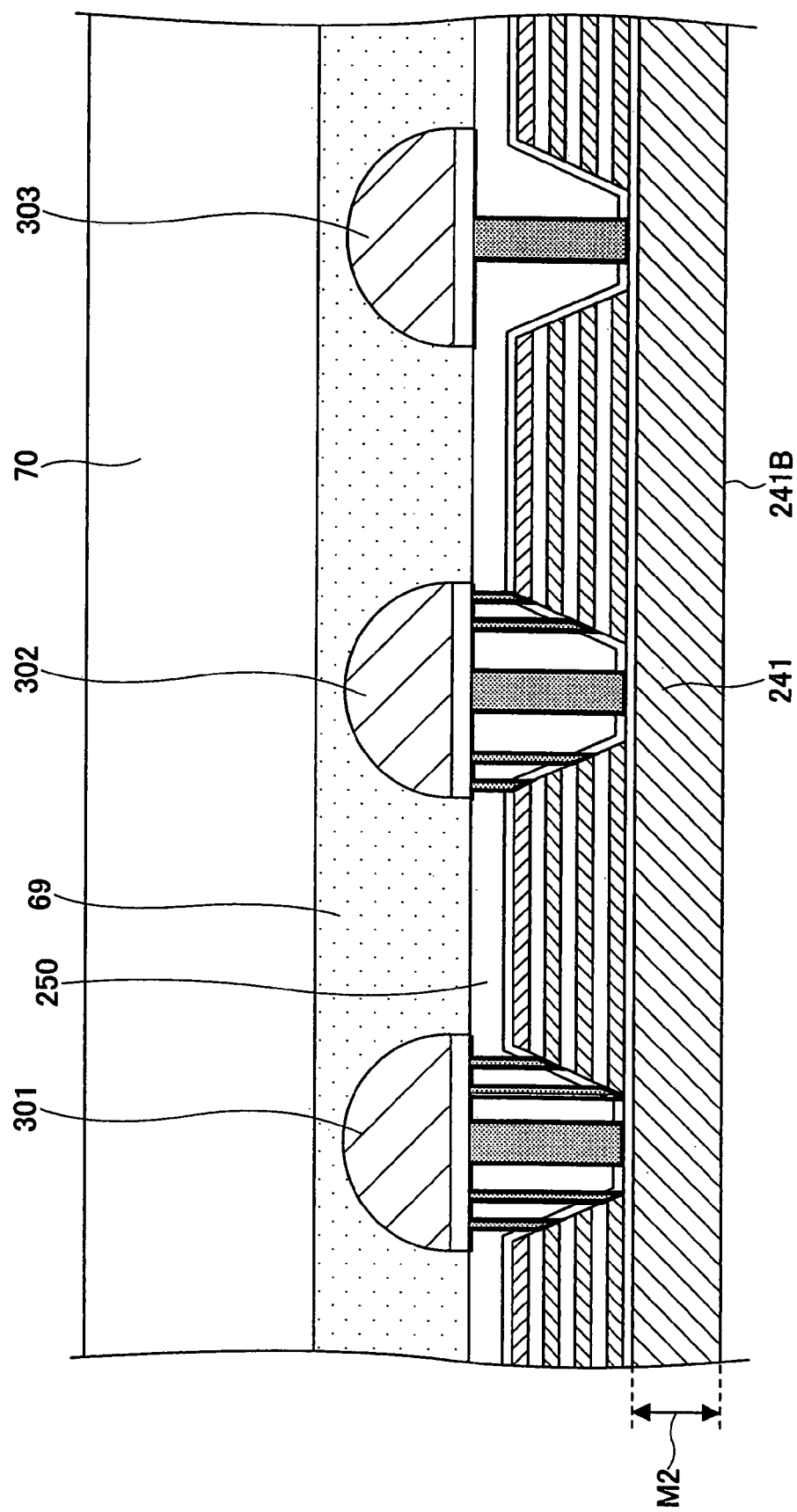
Figure 32J:
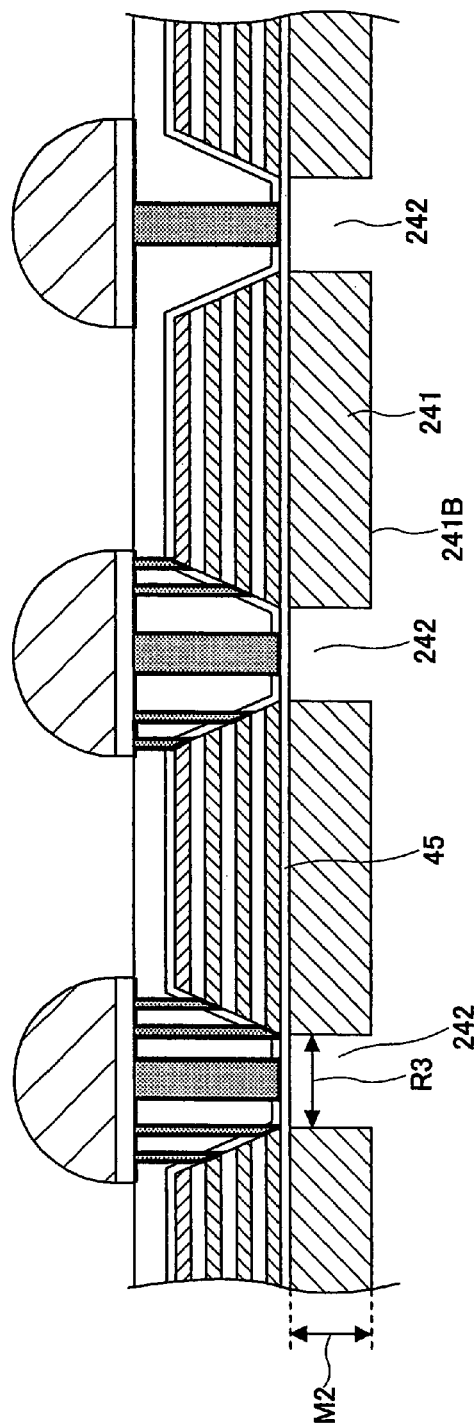
Figure 32K:
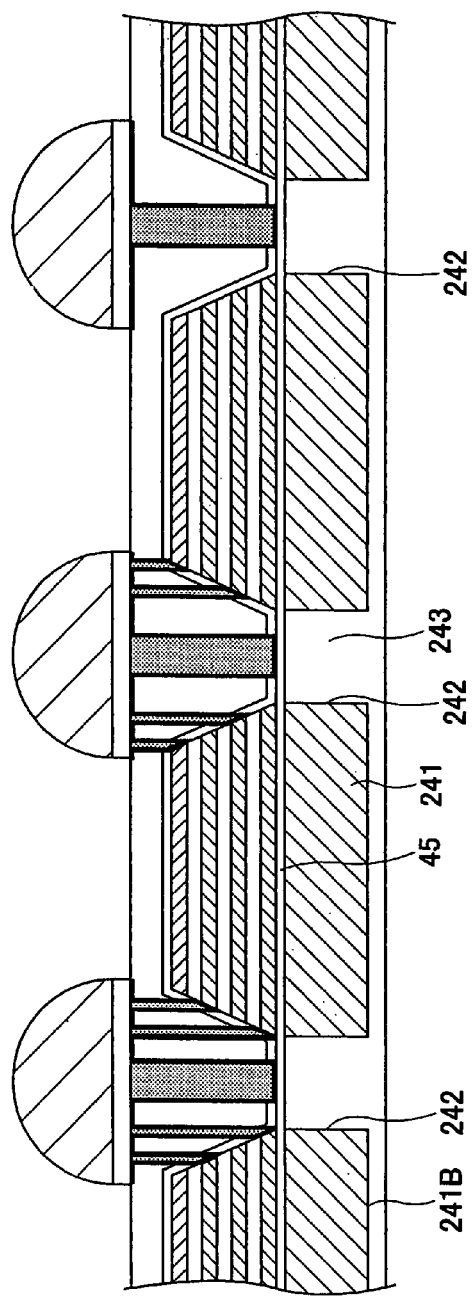
Figure 32L:
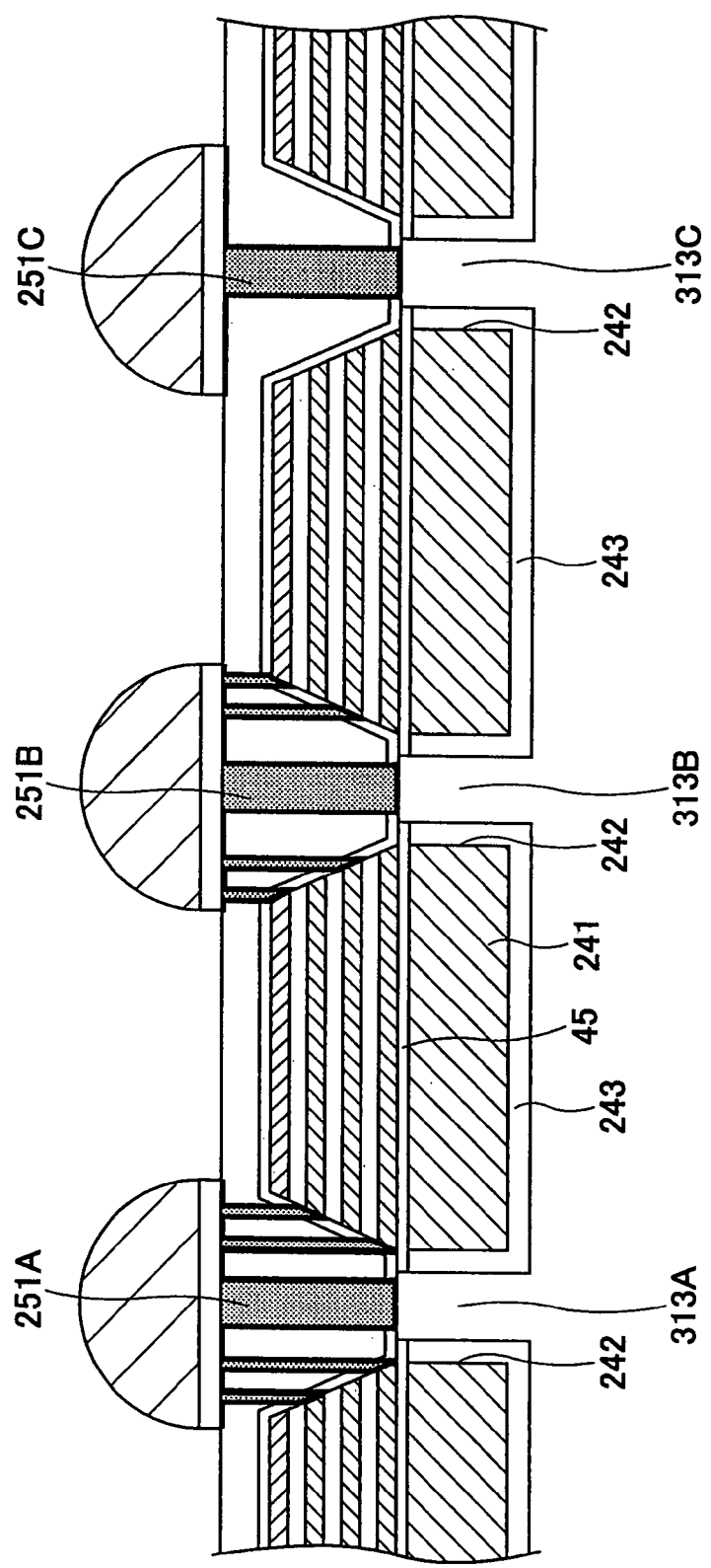
Figure 32O:
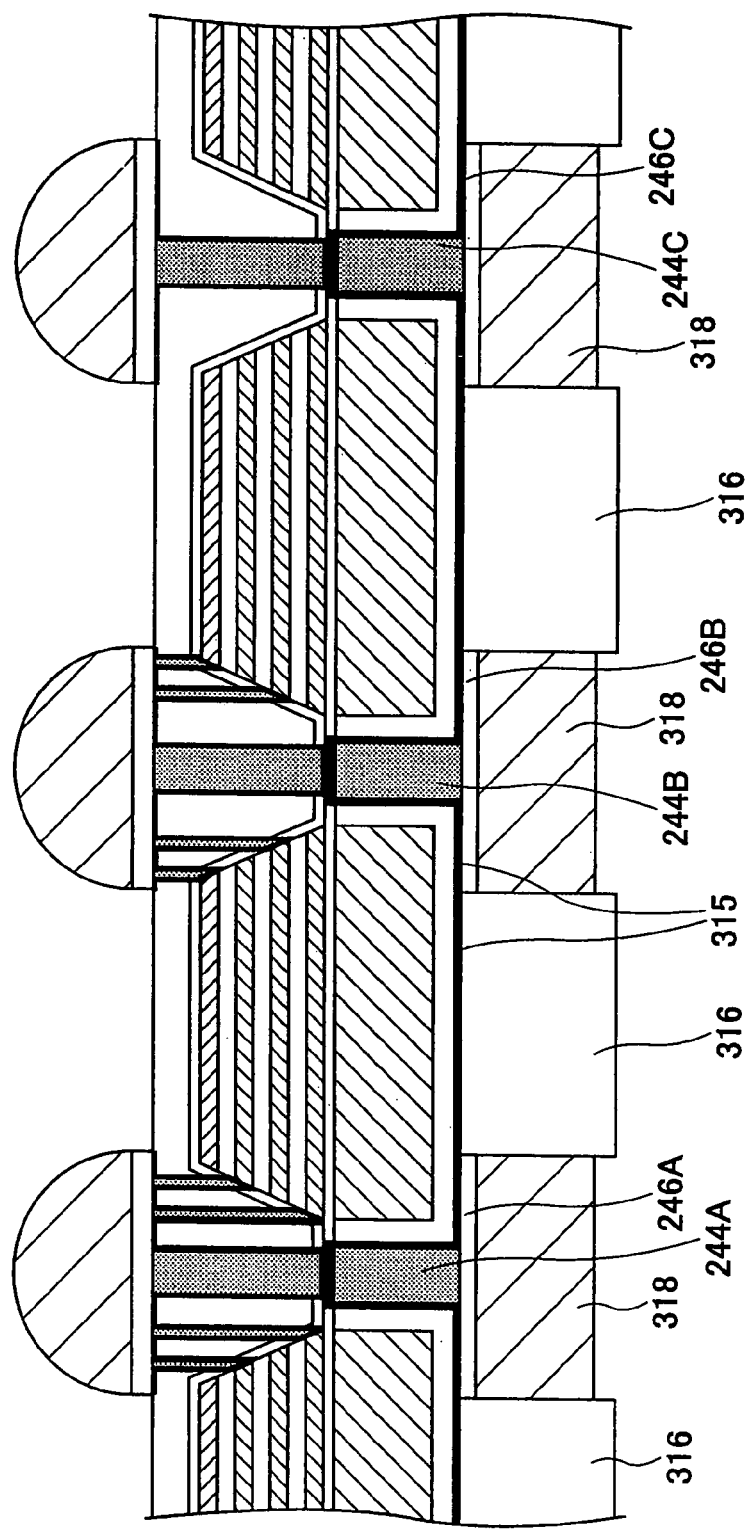
Figure 32P:
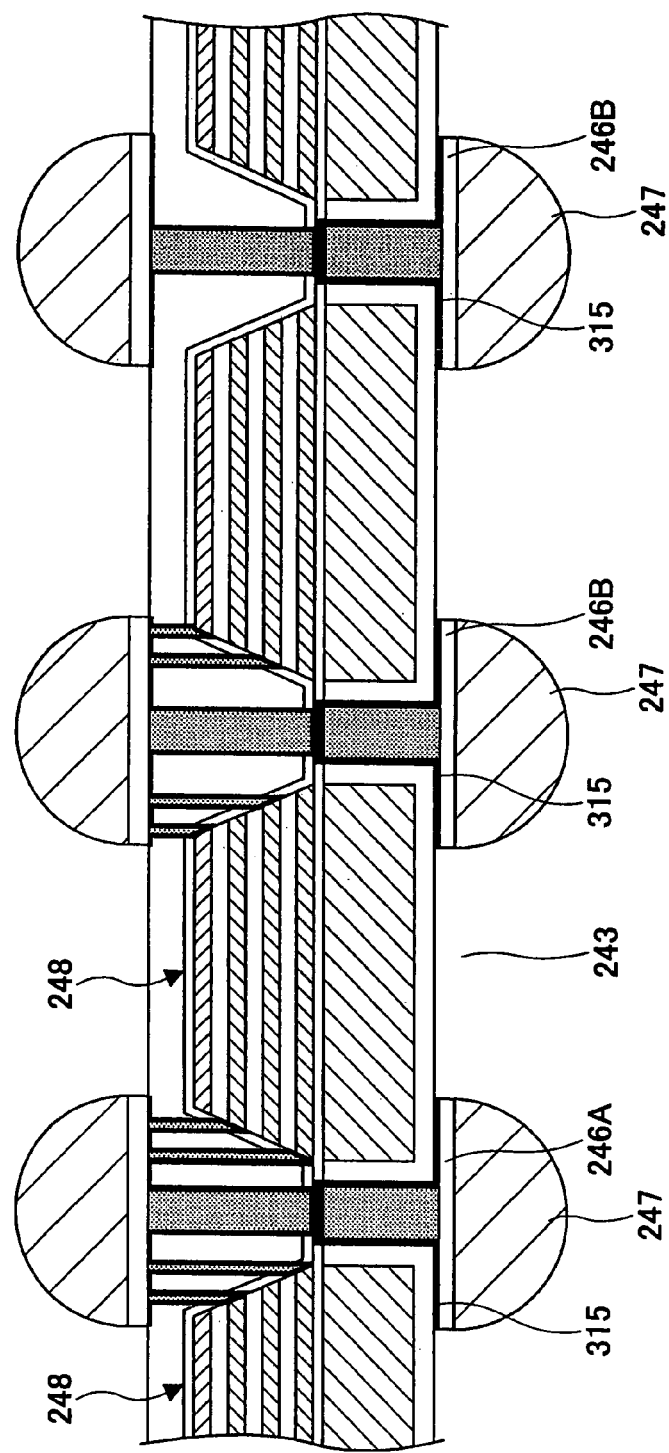

FIGS. 32A through 32P are diagrams showing a process of manufacturing a semiconductor device according to the sixth embodiment. A description is given below, with reference to the drawings, of a method of manufacturing the semiconductor device 240 according to this embodiment.

First, in the process of FIG. 32A, by sputtering, the insulating film 45 is formed on the Si substrate 241 having a thermal oxide film formed on a surface thereof, and then the lower electrode film 47A, the dielectric film 48-1A, an intermediate electrode film 167-1A, the dielectric film 48-2A, an intermediate electrode film 167-2A, a dielectric film 48-3A, and the upper electrode film 49A are successively stacked so as to form a thin film capacitor multilayer body.

Specifically, for example, using a multi-target DC-RF magnetron sputtering device, a $SiO_2$ film (100 nm in thickness) is formed as the insulating film 45 on the Si substrate 241 having a thermal oxide film formed on a surface thereof with the substrate temperature being 200° C. Next, with the substrate temperature being 600° C., a Pt film (100 nm in thickness) is formed as the lower electrode film 47A in an Ar atmosphere. Next, with the substrate temperature being 600° C., a BST film (100 nm in thickness) is formed as the first dielectric film 48-1A in an $Ar/O_2$ atmosphere. Next, with the substrate temperature being 300° C., a Pt film (100 nm in thickness) is formed as the intermediate electrode film 167-1A in an Ar atmosphere. Next, a BST film (100 nm in thickness) is formed as the second dielectric film 48-2A. Next, a Pt film (100 nm in thickness) is formed as the intermediate electrode film 167-2A. Next, a BST film (100 nm in thickness) is formed as the third dielectric film 48-3A. Next, a Pt film (100 nm in thickness) is formed as the upper electrode film 49A. In forming the intermediate electrode film 167-2A and the upper electrode film 49A, the same film formation conditions as for the intermediate electrode film 167-1A are employed. In forming the second and third dielectric films 48-2A and 48-3A, the same film formation conditions as for the first dielectric film 48-1A are employed. These multilayer films 45, 47A, 48-1A, 167-1A, 48-2A, 167-2A, 48-3A, and 49A may be formed by a method other than sputtering, such as vapor deposition or CVD.

Next, in the process of FIG. 32B, the stacked films 47A, 48-1A, 167-1A, 48-2A, 167-2A, 48-3A, and 49A are patterned together by ion milling, so that the thin film capacitors 248 each including the lower electrode 47, the three layers of the dielectric films 48-1 through 48-3, the intermediate electrodes 167-1 and 167-2, and the upper electrode 49 are formed. Specifically, a resist film having openings corresponding to the positions of formation of the opening parts 261A through 261C is formed, and the opening parts 261A through 261C are formed by ion milling by inputting ions at an angle with the Si substrate 241.

Next, the thin film capacitors 248 are subjected to heat treatment in an oxygen atmosphere so as to remove thermal distortion from the dielectric films 48-1 through 48-3 and supply oxygen atoms to oxygen deficient parts in the dielectric films 48-1 through 48-3. The lower electrode 47, the intermediate electrodes 167-1 and 167-2, and the upper electrode 49 of each thin film capacitor 248 are formed by patterning the lower electrode film 47A, the intermediate electrode films 167-1A and 167-2A, and the upper electrode film 49A, respectively.

By thus forming the thin film capacitors 248 before forming the through holes 242, it is possible to form the dielectric films 48-1 through 48-3 at high temperature, so that the thin film capacitors 248 having a high dielectric constant, large capacitance, and high reliability can be formed. Further, by stacking the lower electrode film 47A, the dielectric film 48-1A, the intermediate film 167-1A, the dielectric film 48-2A, the intermediate film 167-2A, the dielectric film 48-3A, and the upper electrode film 49A in sequence in a vacuum, it is possible to prevent dust or foreign materials from adhering to the stacked films 47A, 48-1A, 167-1A, 48-2A, 167-2A, 48-3A, and 49A, and to prevent the surface of each of the films 47A, 48-1A, 167-1A, 48-2A, 167-2A, 48-3A, and 49A from being contaminated. As a result, it is possible to increase the yield of the thin film capacitors 248.

Further, by forming the stacked films 47A, 48-1A, 167-1A, 48-2A, 167-2A, 48-3A, and 49A on the even planar insulating film 45, it is possible to pattern the stacked films 47A, 48-1A, 167-1A, 48-2A, 167-2A, 48-3A, and 49A with good accuracy, and increase the yield of the thin film capacitors 248.

Further, by patterning the stacked films 47A, 48-1A, 167-1A, 48-2A, 167-2A, 48-3A, and 49A together with a single mask, it is possible to reduce the number of masks and, therefore, reduce the manufacturing costs of the semiconductor device 240, compared with the case of performing patterning for each of the stacked films 47A, 48-1A, 167-1A, 48-2A, 167-2A, 48-3A, and 49A.

Next, in the process of FIG. 32C, the protection film 249 is formed so as to cover the thin film capacitors 248. Next, openings 249A through 249E are formed in the protection film 249 by ion milling. The openings 249A correspond to the positions of formation of the vias 251A through 251C, and expose the insulating film 45. The openings 249B correspond to the positions of formation of the vertical interconnection lines 252, and expose the lower electrode 47. The openings 249C correspond to the positions of formation of the vertical interconnection lines 253, and expose the intermediate electrode 167-2. The openings 249D correspond to the positions of formation of the vertical interconnection lines 254, and expose the intermediate electrode 167-1. The openings 249E correspond to the positions of formation of the vertical interconnection lines 255, and expose the upper electrode 49.

Next, the protection film 249 is subjected to post-annealing in an oxygen atmosphere. Specifically, for example, an amorphous alumina film (50 nm in thickness) is formed as the protection film 249 by sputtering using an RF magnetron sputtering device. The protection film 249 may be formed by a method other than sputtering, such as vapor deposition or CVD.

Next, in the process of FIG. 32D, the insulating film 250 is formed so as to cover the upper surface of the structure shown in FIG. 32C. Next, the opening parts 250A through 250E are formed in the insulating film 250. Specifically, for example, a photosensitive polyimide resin (2 μm in thickness) is applied as the insulating film 250 by spin coating. The opening parts 250A through 250E are formed by exposing the photosensitive polyimide resin to light and developing the photosensitive polyimide resin. The insulating film 250 may also be formed by a method other than spin coating, such as spraying or dipping.

Next, in the process of FIG. 32E, a metal film 307 serving as a plating seed layer is formed on the structure shown in FIG. 32D. Specifically, for example, a Ti film, a Cu film, and a Ni film are successively formed by sputtering so as to serve as the metal film 307. The metal film 307 may be formed by a method other than sputtering, such as vapor deposition or CVD. Next, a resist layer 308 having opening parts (holes) 308A is formed on the metal film 307. The opening parts 308A correspond to the positions of formation of the pad electrodes 256 through 258.

Next, in the process of FIG. 32F, the vias 251A through 251C are formed in the corresponding opening parts 250A, and the vertical interconnection lines 252 through 255 are formed in the opening parts 250B through 250E, respectively. Next, the pad electrodes 256 through 258 are formed. Specifically, a Cu film is deposited on part of the metal film 307 corresponding to the opening parts 250A through 250E by electroplating, thereby forming the vias 251A through 251C and the vertical interconnection lines 252 through 255 simultaneously. Thereafter, a Ni film to serve as the pad electrodes 256 through 258 is formed by electroplating.

Next, in the process of FIG. 32G, a conductive material 309 of Sn—Ag solder is formed on the pad electrodes 256 through 258. The resist layer 308 is removed after the formation of the conductive material 309. The conductive material 309 is later reflowed so as to serve as the external connection terminals 301 through 303.

Next, in the process of FIG. 32H, an unnecessary part of the metal film 307 not covered with the pad electrodes 256 through 258 is removed. Next, the conductive material 309 is reflowed by heating, so that the external connection terminals 301 through 303 are formed.

Next, in the process of FIG. 32I, the holding substrate 70 is adhered through the adhesive tape 69 to the structure shown in FIG. 32H on its first main surface side (the side on which the external connection terminals 301 through 303 are formed), and the Si substrate 241 is thinned from the second main surface side. Specifically, for example, the Si substrate 241 is thinned down with a grinder so that its thickness M2 is reduced to 50 μm. After thinning down the Si substrate 241, the adhesive tape 69 is removed. For example, grinding or etching may be employed to thin down the Si substrate 241. As grinding methods, polishing such as buffing and CMP and cutting are employable, for example. As etching methods, wet etching and plasma etching are employable, for example.

Thus, thinning down the Si substrate 241 before forming the through holes 242 makes it possible to reduce the aspect ratio of the through holes 242 and form the through holes 242 using plasma etching or wet etching lower in cost than ICP (Induction Coupling Plasma). Accordingly, it is possible to manufacture the semiconductor device 240 at lower cost.

Next, in the process of FIG. 32J, the through holes 242 of the diameter R3 are formed in the Si substrate 241 from its lower surface 241B. Specifically, for example, the through holes 242 of the diameter R3 may be formed with a disposition pitch of 250 μm by wet etching using a liquid mixture of hydrogen fluoride and a nitric acid as etching liquid. Plasma etching or wet etching using other etching liquids may also be employed.

Next, in the process of FIG. 32K, the insulating material 243 is applied so as to fill in the through holes 242 and to cover the lower surface 241B of the Si substrate 241, and thereafter, the insulating material 243 is hardened. Specifically, for example, an epoxy resin, which is a heat-resistant resin, is applied as the insulating material 243 by spin coating, and thereafter, the epoxy resin is thermoset at a temperature of 200° C. The insulating material 243 may also be applied by a method other than spin coating, such as spraying or dipping.

By thus forming the insulating material 243 so that the insulating material 243 simultaneously covers the lower surface 241B of the Si substrate 241 and fills in the through holes 242, it is possible to simplify the manufacturing process of the semiconductor device 240 compared with the case of providing an insulating material on the lower surface 241B of the Si substrate 241 and an insulating material filling in the through holes 242 separately.

Employment of a resin material such as a low-k resin, a heat-resistant resin, or a photosensitive resin as the insulating material 243 filling in the through holes 242 makes it possible to form the through holes 313A through 313C for forming the through vias 244A through 244C with ease, so that it is possible to manufacture the semiconductor device 240 at reduced cost.

An insulating material on the lower surface 241B of the Si substrate 241 and an insulating material filling in the through holes 242 may be provided separately. In this case, the insulating material provided on the lower surface 241B of the Si substrate 241 may be different from the insulating material filling in the through holes 242.

Next, in the process of FIG. 32L, the through holes 313A through 313C of 70 μm in diameter exposing the vias 251A through 251C, respectively, are formed in the insulating material 243 filling in the through holes 242. Specifically, the through holes 313A through 313C are formed by processing the insulating material 243 by ArF excimer laser processing using a heat-resistant resin or a low-k resin as the insulating material 243. The through holes 313A through 313C may also be formed using a laser processing method other than ArF excimer laser processing, or plasma etching. In the case of using a photosensitive resin as the insulating material 243, the through holes 313A through 313C may be formed by exposing and developing part of the insulating material 243 corresponding to the through holes 313A through 313C.

Next, in the process of FIG. 32M, a metal film 315 to serve as a plating seed layer is formed so as to cover the lower surface side of the structure shown in FIG. 32L. Next, a resist layer 316 having opening parts (holes) 316 is formed on the metal film 315. The opening parts 316A correspond to the positions of formation of the pad electrodes 246A through 246C, and expose the metal film 315.

Next, in the process of FIG. 32N, the through vias 244A through 244C are formed in the through holes 313A through 313C. Next, the pad electrodes 246A through 246C are formed on part of the metal film 315 and the through vias 244A through 244C exposed in the resist layer 316. Specifically, a Cu film is deposited by electroplating on the through holes 313A through 313C, thereby forming the through vias 244A through 244C. Thereafter, a Ni film to serve as the pad electrodes 246A through 246C is formed by electroplating.

Next, in the process of FIG. 32O, a conductive material is provided on the pad electrodes 246A through 246C. Specifically, the conductive material formed of Sn—Ag solder is provided on the pad electrodes 246A through 246C. The conductive material 318 is later reflowed so as to serve as the external connection terminals 247.

Next, in the process of FIG. 32P, an unnecessary part of the metal film 315 not covered with the pad electrodes 246A through 246C is removed. Next, the conductive material 318 is reflowed by heating, so that the external connection terminals 247 are formed. Thereafter, the Si substrate 214 is cut by dicing, so that the semiconductor device 240 is manufactured.

According to the semiconductor device manufacturing method of this embodiment, since the Si substrate 241 is thinned down, the amount of processing the Si substrate 241 in the direction of thickness is reduced in forming the through holes 242. Accordingly, the through holes 242 can be formed with ease. Further, the reduction in the amount of processing the Si substrate 241 in the direction of thickness makes it possible to form the through holes 242 by wet etching or plasma etching. Accordingly, it is possible to form the through holes 242 at far lower cost than by conventional ICP. Further, the through holes 242 are filled with the insulating material 243 of a low-k resin, a heat-resistant resin, or a photosensitive resin, and the through holes 313A through 313C are formed in the insulating material 243 by laser via processing. Accordingly, it is possible to form the through holes 313A through 313C with ease. For these reasons, it is possible to manufacture the semiconductor device 240 at lower cost than conventionally.

Further, the thin film capacitors 248 are formed before forming the through holes 242. This facilitates processing for the thin film capacitors 248, and prevents dust and foreign materials generated in forming the through holes 242 from adhering to the thin film capacitors 248, thereby making it possible to increase the yield of the thin film capacitors 248.

The electric characteristics of a semiconductor device formed by the above-described manufacturing process of FIGS. 32A through 32P were evaluated. The semiconductor device was made using the conditions specified in each process of the manufacturing. With respect to the electric characteristics, the results were a capacitance density of 12 μF/cm², an ESR (equivalent series resistance) of 0.02Ω, an ESL (equivalent series inductance) of 10 pH, and a withstand voltage of 30 V or over. These results confirmed that it is possible to form a semiconductor device having a thin film capacitor with large capacitance and reduced ESL.

Further, a semiconductor device serving as a comparative example was formed by forming a thin film capacitor by performing patterning every time each of the thin films 47A, 48-1A, 167-1A, 48-2A, 167-2A, 48-3A, and 49A was formed on the Si substrate 241 that was not thinned down, and then forming through holes by ICP in the Si substrate 241 that was not thinned down and forming through vias in the corresponding through holes. Examination of this comparative example semiconductor device revealed the occurrence of short-circuiting, and it was not possible to obtain an acceptable thin film capacitor.

Seventh Embodiment

Figure 33:
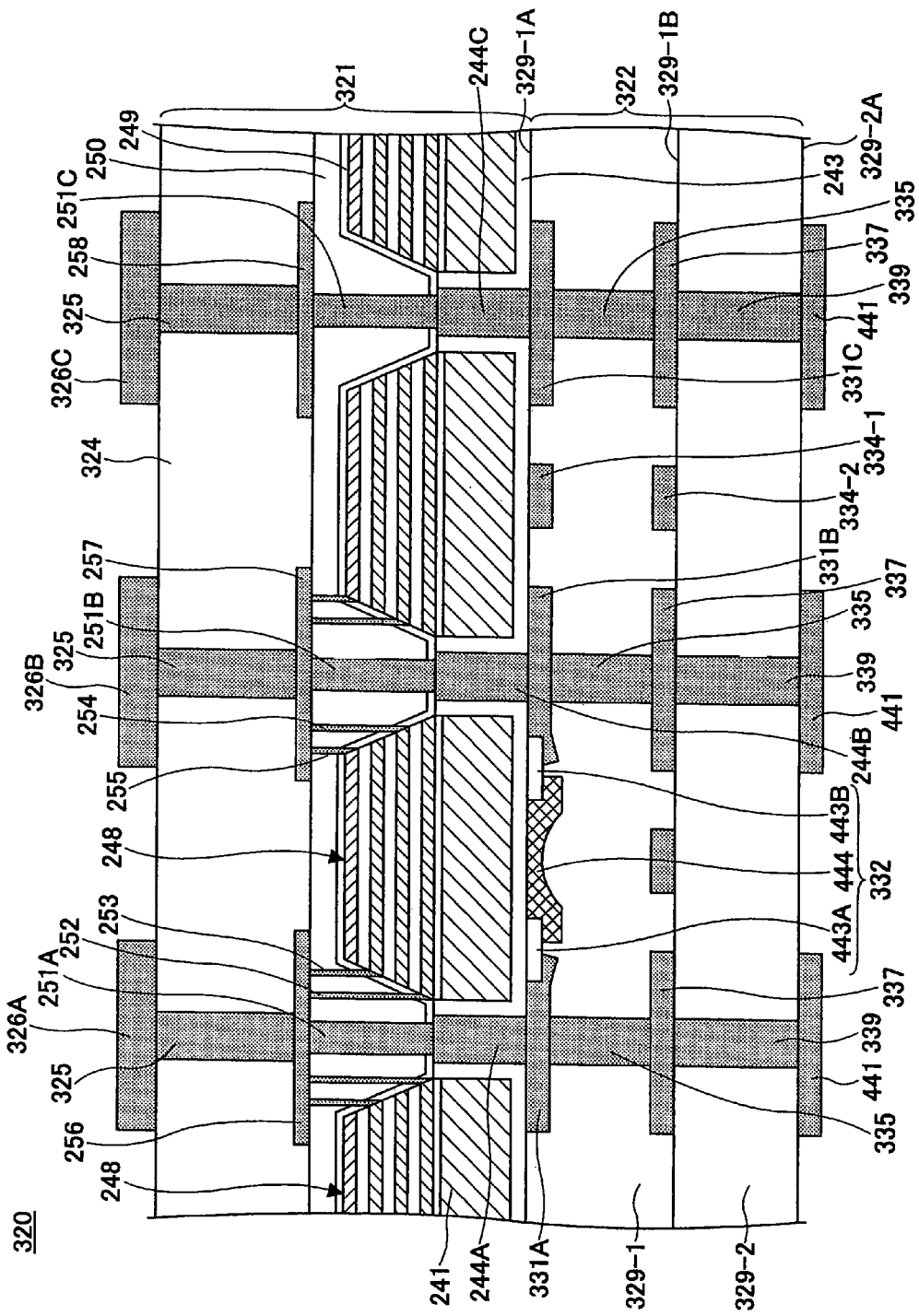
FIG. 33 is a cross-sectional view of a substrate containing a built-in interposer (interposer-containing substrate) according to a seventh embodiment of the present invention.

FIG. 33 is a cross-sectional view of a substrate containing a built-in interposer (interposer-containing substrate) 320 according to a seventh embodiment of the present invention. In FIG. 33, the same elements as those of the above-described semiconductor device 240 (FIG. 30) of the sixth embodiment are referred to by the same numerals, and a description thereof is omitted.

Referring to FIG. 33, the interposer-containing substrate 320 includes an interposer 321 and a circuit board 322. The interposer 321 is fixed to the circuit board 322 by bonding the insulating material 243 provided on the interposer 321 to an insulating layer 329-1 of the circuit board 322 by thermocompression.

The interposer 321 is configured by removing the pad electrodes 246A through 246C and the external connection terminals 247 and 301 through 303 from the configuration of the semiconductor device 240 of the sixth embodiment and providing the remaining structure with an insulating layer 324, vias 325, and pad electrodes 326A through 326C. The insulating layer 324 is provided so as to cover the insulating film 250 and the pad electrodes 256 through 258. The vias 325 are provided in the insulating layer 324 under the pad electrodes 326A through 326C. The vias 325 electrically connect the pad electrodes 256 through 258 and the pad electrodes 326A through 326C, respectively.

The pad electrodes 326A through 326C are provided on the insulating layer 324 at positions corresponding to the positions of formation of the vias 325. For example, a semiconductor chip not graphically illustrated is electrically connected to the pad electrodes 326A through 326C. Specifically, for example, a power supply connection pad of the semiconductor chip is connected to the pad electrode 326A, a ground connection pad of the semiconductor chip is connected to the pad electrode 326B, and a signal connection pad of the semiconductor chip is connected to the pad electrode 326C.

The circuit board 322 includes the insulating layer 329-1, an insulating layer 329-2, pad electrodes 331A through 331C, a resistive element 332, interconnection lines 334-1, 334-2, and 337, vias 335 and 339, and external connection terminals 441.

The insulating layers 329-1 and 329-2 are stacked on the insulating material 243 provided on the interposer 321 in the order described.

The pad electrodes 331A through 331C are provided in the insulating layer 329-1 on the side on which the insulating layer 329-1 is connected to the interposer 321, so as to form a substantially single surface with a surface 329-1A of the insulating layer 329-1. The pad electrode 331A is electrically connected to the through via 244A. The pad electrode 331B is electrically connected to the through via 244B. The pad electrode 331C is electrically connected to the through via 244C.

The resistive element 332 is provided between the pad electrodes 331A and 331B in the insulating layer 329-1 so as to form a substantially single surface with the surface 329-1A of the insulating layer 329. The resistive element 332 includes a pair of electrodes 443A and 443B and a resistor 444.

The electrode 443A is electrically connected to the pad electrode 331A. The electrode 443B is electrically connected to the pad electrode 331B. As a result, the electrodes 443A and 443B are electrically connected to the corresponding thin film capacitor 248.

The resistor 444 is provided so as to connect the electrodes 443A and 443B. The resistor 444 applies a load to current flowing between the electrodes 443A and 443B. An inductor element formed of a conductive material may be provided between the pad electrodes 331A and 331B as another passive element. For example, an inductor element having a meandering shape may be used.

Thus, by providing the circuit board 322 with passive elements including the resistive element 332 and an inductor element, it is possible to optimize the impedance of the interposer-containing substrate 320 and cause the interposer-containing substrate 320 to operate at high frequencies.

The interconnection line 334-1 is provided in the insulating layer 329-1 so as to form a substantially single surface with the surface 329-1A of the insulating layer 329. The interconnection lines 334-2 and 337 are provided in the insulating layer 329-1 so as to form a substantially single surface with a surface 329-1B of the insulating layer 329. The interconnection lines 337 oppose the pad electrodes 331A through 331C through the insulating layer 329-1.

The vias 335 are provided in the insulating layer 329-1 so as to electrically connect the pad electrodes 331A through 331C and the corresponding interconnection lines 337. The vias 339 are provided through the insulating layer 329-2 so as to electrically connect the interconnection lines 337 and the corresponding external connection terminals 441.

The external connection terminals 441 are provided on a surface 329-2A of the insulating layer 329-2 so as to oppose the corresponding interconnection lines 337 through the insulating layer 329-2. The external connection terminals 441 are terminals for connection to another circuit board not graphically illustrated, for example.

Figure 34:
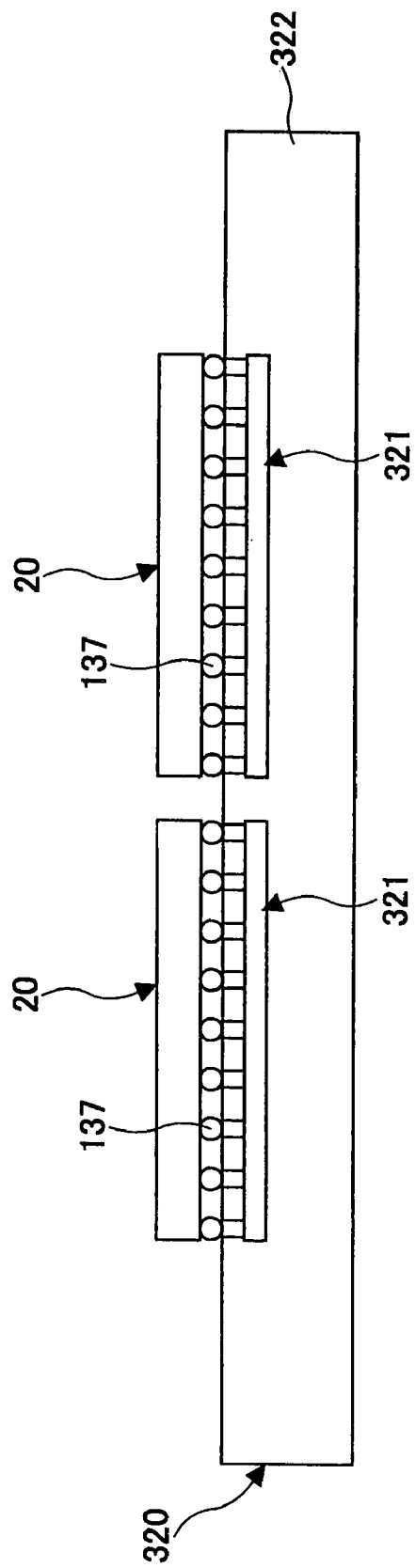
FIG. 34 is a diagram showing an embodiment of mounting an interposer-containing substrate according to the seventh embodiment of the present invention.

FIG. 34 is a diagram showing an embodiment of mounting the interposer-containing substrate 320.

As shown in FIG. 34, the interposer-containing substrate 320 is used, for example, with the semiconductor chips 20 being electrically connected to the pad electrodes 326A through 326C (not graphically illustrated in FIG. 34).

According to one aspect of the present invention, the thickness of the Si substrate of an interposer is less than or equal to the diameter of a through hole. Accordingly, a semiconductor device that has a through hole of good accuracy and can support a further increase in density can be realized. Further, since a capacitor is provided close to a semiconductor chip, it is possible to realize a semiconductor device having reduced equivalent series inductance so as to enable the semiconductor chip to operate at high frequencies. Furthermore, since it is easy to form the through hole, an inexpensive semiconductor device manufacturable at reduced cost can be realized.

According to one aspect of the present invention, by performing the step of thinning down a Si substrate, the aspect ratio of a through hole (Si substrate thickness/through hole diameter) can be reduced, so that the through hole can be formed easily in the Si substrate. Accordingly, it is possible to reduce manufacturing cost. Further, thinning down the Si substrate makes it possible to reduce time for processing the through hole. Moreover, since the step of forming a capacitor is performed before the step of forming the through hole, it is possible to form the dielectric film of the capacitor at high temperature. Accordingly, it is possible to form a capacitor having a high dielectric constant, large capacitance, and high reliability.

According to one aspect of the present invention, the thickness of the Si substrate of an interposer is less than or equal to the diameter of a through hole. Accordingly, it is possible to realize an electronic apparatus including an interposer that can support a further increase in density.

Further, since a capacitor is provided close to a semiconductor chip, an electronic apparatus having equivalent series inductance reduced so as to enable the semiconductor chip to operate at high frequencies can be realized.

According to one aspect of the present invention, the thickness of the Si substrate of a capacitor structure is less than or equal to the diameter of through holes. Accordingly, it is possible to realize a semiconductor device that has the capacitor structure including the through holes of good accuracy and can support a further increase in the density of a circuit board. Further, since a thin film capacitor is provided close to a semiconductor chip, it is possible to realize a semiconductor device having reduced equivalent series inductance so as to enable the semiconductor chip to operate at high frequencies.

According to one aspect of the present invention, by performing the process of thinning down a Si substrate, it is possible to reduce the aspect ratio (Si substrate thickness/through hole diameter) of through holes, thus making it easy to form the through holes in the Si substrate. Accordingly, it is possible to reduce the manufacturing costs of a semiconductor device. Further, a thin film capacitor is formed before formation of the through holes. Accordingly, it is possible to form a dielectric film of the thin film capacitor at high temperature, so that the thin film capacitor having a high dielectric constant, large capacitance, and high reliability can be realized.

According to one aspect of the present invention, a first pad electrode is electrically connected to the odd-numbered ones of electrodes from the substrate side, and a second pad electrode is electrically connected to an even-numbered one or more of the electrodes from the substrate side, thereby connecting multiple capacitors of the substantially same capacitance in parallel between the first pad electrode and the second pad electrode. Accordingly, it is possible to achieve a capacitor structure of reduced impedance by reducing inductance by reducing interconnection line length required in configuring a decoupling capacitor.

According to one aspect of the present invention, three or more electrode layers are exposed by first and second opening parts. A first pad electrode and the odd-numbered ones of the electrode layers from the substrate side exposed in the first opening part are electrically connected through a first interconnection line part including multiple interconnection lines, and a second pad electrode and the even-numbered one or more of the electrode layers from the substrate side exposed in the second opening part are electrically connected through a second interconnection line part including multiple interconnection lines. As a result, it is possible to connect multiple stacked capacitors in parallel with less interconnection line length than conventionally. As a result, inductance is reduced, so that it is possible to realize a capacitor structure with reduced impedance.

The present invention is not limited to the specifically disclosed embodiments, and variations and modifications may be made without departing from the scope of the present invention.

What is claimed is:

1. A semiconductor device, comprising:
   a circuit board; and
   a semiconductor chip,
   wherein the circuit board includes a multilayer interconnection structure; a capacitor structure including a thin film capacitor on the multilayer interconnection structure; an insulating film covering the capacitor structure; through vias passing through the capacitor structure so as to be electrically connected to the thin film capacitor and the multilayer interconnection structure;
   the semiconductor chip is electrically connected to the through vias on the circuit board; and
   the capacitor structure includes a Si substrate on the multilayer interconnection structure; through holes in which the through vias are formed, the through holes passing through the Si substrate; and the thin film capacitor formed on the Si substrate, the Si substrate having a thickness less than a diameter of the through holes.

2. The semiconductor device as claimed in claim 1, wherein the thin film capacitor comprises:
   at least three electrode layers; and
   a dielectric film provided between each adjacent two of the at least three electrode layers.

3. The semiconductor device as claimed in claim 1, wherein the circuit board further comprises:
   at least one additional capacitor structure so that the capacitor structure and the at least one additional capacitor structure are stacked between the multilayer interconnection structure and the insulating film.

4. The semiconductor device as claimed in claim 1, further comprising:
   at least one additional semiconductor chip,
   wherein the capacitor structure is provided for each of the semiconductor chips.

5. The semiconductor device as claimed in claim 1, wherein the capacitor structure is smaller in area than the semiconductor chip.

6. The semiconductor device as claimed in claim 1, wherein the thin film capacitor is a multilayer thin film capacitor including at least three electrode layers and a dielectric film provided between each adjacent two of the at least three electrode layers, so that the thin film capacitor includes a plurality of capacitors connected in parallel between the through vias with first ones of the through vias being electrically connected to odd-numbered ones of the at least three electrode layers from a side of the Si substrate and a second one or ones of the through vias being electrically connected to one or more even-numbered ones of the at least three electrode layers from the side of the Si substrate.

7. The semiconductor device as claimed in claim 1, wherein the Si substrate is 30 μm to 100 μm in thickness.

* * * * *